(12) United States Patent
Pfaff

(10) Patent No.: US 8,040,521 B2
(45) Date of Patent: *Oct. 18, 2011

(54) HOLOGRAPHIC CONDITION ASSESSMENT SYSTEM FOR A STRUCTURE INCLUDING A SEMICONDUCTOR MATERIAL

(75) Inventor: Paul L. Pfaff, Lake Oswego, OR (US)

(73) Assignee: Attofemto, Inc., Lake Oswego, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/422,210

(22) Filed: Apr. 10, 2009

(65) Prior Publication Data

US 2010/0091292 A1    Apr. 15, 2010

Related U.S. Application Data

(63) Continuation of application No. 12/172,629, filed on Jul. 14, 2008, now Pat. No. 7,773,230, which is a continuation of application No. 11/536,617, filed on Sep. 28, 2006, now Pat. No. 7,420,687, which is a continuation of application No. 11/050,034, filed on Feb. 3, 2005, now Pat. No. 7,323,889, which is a continuation of application No. 10/660,189, filed on Sep. 10, 2003, now Pat. No. 6,972,577, which is a continuation of application No. 10/219,599, filed on Aug. 14, 2002, now Pat. No. 6,803,777, which is a continuation of application No. 09/626,420, filed on Jul. 26, 2000, now Pat. No. 6,512,385.

(60) Provisional application No. 60/145,617, filed on Jul. 26, 1999.

(51) Int. Cl.
*G01B 9/02* (2006.01)
*G01B 9/021* (2006.01)

(52) U.S. Cl. ..................... 356/457; 356/521

(58) Field of Classification Search ........... 356/35.5, 356/457, 458, 496, 521
See application file for complete search history.

(56) References Cited

U.S. PATENT DOCUMENTS 3,663,194 A    5/1972   Greenstein et al.
(Continued)

FOREIGN PATENT DOCUMENTS

WO    9729362    8/1997

OTHER PUBLICATIONS

Graham Saxby, Practical Display Holography, Chapter 20—"Embossed Holograms" 1988.

(Continued)

*Primary Examiner* — Patrick J Connolly
(74) *Attorney, Agent, or Firm* — Davis Wright Tremaine LLP; George C. Rondeau, Jr.

(57) ABSTRACT

An improved condition testing system and method integrated into microelectronic circuits includes a structure including a semiconductor material with a target portion and a second portion for determining the presence and nature of various external (e.g. magnetic field, microwave, bioelectric or incident radiation) or internal stresses (e.g. binary circuit-state or analog signal recognition) or conditions acting upon the material. The target portion has a first feature when at least one of the following occurs: an external force is received by the second portion of the structure and an internal condition occurs in the target portion. The system and method further has a test grating determined and shaped and located to produce a first optical interference pattern when the target portion and the grating are exposed to non-invasive illumination and when the target portion has the first feature. Further implementations use one or more diffraction structures, holograms, or holographic optical elements spaced apart from the circuit or electronic device under test to non-invasively optically test in parallel two or more targeted conditions having a shape, size, structure, intensity or orientation of the stress acting upon the material.

37 Claims, 33 Drawing Sheets

U.S. PATENT DOCUMENTS

Figure 1:
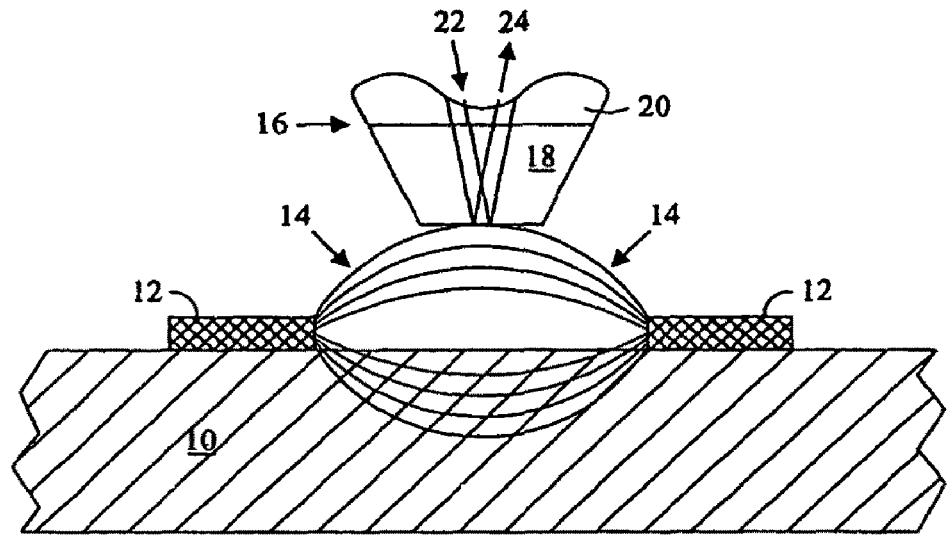

| | | | |
|---|---|---|---|
| 3,956,698 A | 5/1976 | Malmberg et al. | |
| 4,053,833 A | 10/1977 | Malmberg et al. | |
| 4,188,123 A | 2/1980 | Kleinknecht | |
| 4,211,488 A | 7/1980 | Kleinknecht | |
| 4,242,635 A | 12/1980 | Burns | |
| 4,355,278 A | 10/1982 | Burns et al. | |
| 4,415,851 A | 11/1983 | Langner et al. | |
| 4,482,863 A | 11/1984 | Auston et al. | |
| 4,554,453 A | 11/1985 | Feigt et al. | |
| 4,618,819 A | 10/1986 | Mourou et al. | |
| 4,681,449 A | 7/1987 | Bloom et al. | |
| 4,703,260 A | 10/1987 | Beha et al. | |
| 4,714,826 A | 12/1987 | Goutzoulis | |
| 4,745,361 A | 5/1988 | Nees et al. | |
| 4,758,092 A | 7/1988 | Heinrich et al. | |
| 4,760,249 A | 7/1988 | Baskett | |
| 4,786,864 A | 11/1988 | Beha et al. | |
| 4,816,755 A | 3/1989 | Look et al. | |
| 4,827,212 A | 5/1989 | Kamieniecki | |
| 4,843,329 A | 6/1989 | Beha et al. | |
| 4,868,492 A | 9/1989 | Beha et al. | |
| 4,875,006 A | 10/1989 | Henley et al. | |
| 4,881,029 A | 11/1989 | Kawamura | |
| 4,896,109 A | 1/1990 | Rauscher | |
| 4,933,634 A | 6/1990 | Cuzin et al. | |
| 4,953,983 A | 9/1990 | Bottka | |
| 4,970,461 A | 11/1990 | LePage | |
| 4,983,911 A | 1/1991 | Henley | |
| 4,999,577 A | 3/1991 | Beha et al. | |
| 5,034,683 A | 7/1991 | Takahashi et al. | |
| 5,059,897 A | 10/1991 | Aton et al. | |
| 5,165,045 A * | 11/1992 | Eselun | 250/237 G |
| 5,216,359 A | 6/1993 | Makki et al. | |
| 5,407,850 A | 4/1995 | Doyle et al. | |
| 5,422,723 A | 6/1995 | Paranjpe et al. | |
| 5,438,439 A | 8/1995 | Mok et al. | |
| 5,570,011 A | 10/1996 | Henley | |
| 5,682,236 A | 10/1997 | Trolinger et al. | |
| 5,895,972 A | 4/1999 | Paniccia | |
| 5,930,588 A | 7/1999 | Paniccia | |
| 5,969,517 A | 10/1999 | Rao | |
| 5,995,223 A | 11/1999 | Power | |
| 5,999,152 A | 12/1999 | Liao et al. | |
| 6,075,908 A | 6/2000 | Paniccia et al. | |
| 6,084,396 A | 7/2000 | Rao | |
| 6,163,378 A | 12/2000 | Khoury | |
| 6,166,846 A | 12/2000 | Maloney | |
| 6,172,752 B1 | 1/2001 | Haruna et al. | |
| 6,218,194 B1 | 4/2001 | Lyndin et al. | |
| 6,218,655 B1 | 4/2001 | Ogasawara et al. | |
| 6,231,194 B1 | 5/2001 | Raj et al. | |
| 6,246,098 B1 | 6/2001 | Paniccia | |
| 6,251,706 B1 | 6/2001 | Paniccia | |
| 6,269,199 B1 | 7/2001 | Maloney | |
| 6,323,985 B1 | 11/2001 | Maloney | |
| 6,374,003 B1 | 4/2002 | Ding et al. | |
| 6,421,473 B1 | 7/2002 | Paniccia et al. | |
| 6,434,289 B1 | 8/2002 | Paniccia et al. | |
| 6,449,405 B1 | 9/2002 | Paniccia et al. | |
| 6,458,495 B1 | 10/2002 | Tsai et al. | |
| 6,463,193 B2 | 10/2002 | Paniccia et al. | |
| 6,470,104 B2 | 10/2002 | Paniccia et al. | |
| 6,480,641 B1 | 11/2002 | Ding et al. | |
| 6,483,954 B2 | 11/2002 | Koehl et al. | |
| 6,501,092 B1 | 12/2002 | NiKonov et al. | |
| 6,512,385 B1 | 1/2003 | Pfaff et al. | |
| 6,522,812 B1 | 2/2003 | NiKonov | |
| 6,548,417 B2 | 4/2003 | Dao et al. | |
| 6,566,679 B2 | 5/2003 | NiKonov et al. | |
| 6,600,760 B1 | 7/2003 | Green et al. | |
| 6,600,864 B2 | 7/2003 | Samara-Rubio et al. | |
| 6,631,146 B2 | 10/2003 | Pontis et al. | |
| 6,642,531 B1 | 11/2003 | Powers | |
| 6,643,025 B2 * | 11/2003 | Degertekin et al. | 356/505 |
| 6,650,802 B1 | 11/2003 | Morse et al. | |
| 6,653,161 B1 | 11/2003 | Morse | |
| 6,658,031 B2 | 12/2003 | Tuganov et al. | |
| 6,660,649 B2 | 12/2003 | Dao et al. | |
| 6,665,321 B1 | 12/2003 | Sochava et al. | |
| 6,687,269 B1 | 2/2004 | Rice et al. | |
| 6,704,332 B2 | 3/2004 | Chapman et al. | |
| 6,724,790 B1 | 4/2004 | Daiber et al. | |
| 6,751,002 B2 | 6/2004 | Ovadia et al. | |
| 6,753,969 B2 * | 6/2004 | Degertekin et al. | 356/521 |
| 6,763,047 B2 | 7/2004 | Daiber et al. | |
| 6,778,102 B1 | 8/2004 | Grunnet-Jepsen et al. | |
| 6,778,750 B2 | 8/2004 | Vodrahalli et al. | |
| 6,782,164 B1 | 8/2004 | Lee et al. | |
| 6,785,430 B2 | 8/2004 | Paniccia | |
| 6,788,724 B2 | 9/2004 | Sell et al. | |
| 6,788,727 B2 | 9/2004 | Liu | |
| 6,803,777 B2 | 10/2004 | Pfaff et al. | |
| 6,804,278 B2 | 10/2004 | Daiber | |
| 6,816,516 B2 | 11/2004 | Daiber | |
| 6,822,979 B2 | 11/2004 | Daiber | |
| 6,972,577 B2 | 12/2005 | Pfaff et al. | |
| 7,068,377 B2 * | 6/2006 | Degertekin et al. | 356/511 |
| 7,116,430 B2 * | 10/2006 | Degertekin et al. | 356/505 |
| 7,206,078 B2 | 4/2007 | Pfaff et al. | |
| 7,268,860 B1 * | 9/2007 | Chen | 356/35.5 |
| 7,323,889 B2 | 1/2008 | Pfaff et al. | |
| 7,400,411 B2 | 7/2008 | Pfaff | |
| 7,420,687 B2 | 9/2008 | Pfaff | |
| 7,440,117 B2 * | 10/2008 | Degertekin et al. | 356/521 |
| 7,728,958 B2 * | 6/2010 | Pfaff | 356/35.5 |
| 2002/0163648 A1 * | 11/2002 | Degertekin et al. | 356/499 |
| 2003/0020915 A1 * | 1/2003 | Schueller et al. | 356/436 |
| 2003/0038949 A1 * | 2/2003 | Degertekin et al. | 356/498 |
| 2003/0057972 A1 | 3/2003 | Pfaff et al. | |
| 2003/0067312 A1 | 4/2003 | Pfaff et al. | |
| 2003/0184761 A1 * | 10/2003 | Degertekin et al. | 356/511 |
| 2004/0046577 A1 | 3/2004 | Pfaff et al. | |
| 2005/0036151 A1 | 2/2005 | Gornick et al. | |
| 2005/0156609 A1 | 7/2005 | Pfaff et al. | |
| 2005/0231733 A1 | 10/2005 | Pfaff et al. | |
| 2006/0098208 A9 * | 5/2006 | Degertekin et al. | 356/511 |
| 2006/0181712 A1 * | 8/2006 | Degertekin et al. | 356/505 |
| 2006/0192976 A1 * | 8/2006 | Hall et al. | 356/505 |
| 2006/0244974 A1 * | 11/2006 | Pfaff | 356/517 |
| 2007/0018662 A1 | 1/2007 | Pfaff | |
| 2007/0019209 A1 * | 1/2007 | Pfaff | 356/511 |
| 2008/0186580 A1 | 8/2008 | Pfaff | |
| 2008/0252898 A1 | 10/2008 | Pfaff | |
| 2009/0002717 A1 * | 1/2009 | Pfaff | 356/521 |
| 2009/0147334 A1 | 6/2009 | Chen et al. | |

OTHER PUBLICATIONS

Handbook of Infrared Optical Materials, Paul Klocekcd ed. 1991.
O'Regan and Dudderar, "A new Holographic Inferometer for Stress Analysis" Experimental Mechanics Jun. 1971.
Heinrich et al. "Measurement of Real Time Digital Signals in a Silicon Bipolar Junction Transistor Using a Noninvasive Optical Probe" May 6, 2001.
Heinrich et al. "Noninvasive Sheet Charge Density Probe for Integrated Silicon Devices" Feb. 3, 2005.
Woerdman "Formation of a Transient Free Carrier Hologram in Si" Optics Communications Oct. 1970.
Kaminow and Turner, "Electrooptic Light Modulators" Proceedings of the IEEE, vol. 54 pp. 10 Oct. 1966.
Paritskii and Ryvkin, "Use of Semiconductors in Long-Wavelength Photography" Soviet Physics—Semiconductors Oct. 1970.
Soviet Physics—Semiconductors (excerpts), Feb. 4, 1981.
Heggarty and Chevallier "Signal Window Minimum Average Error Algorithm for Computer Generated Holograms" J. Opt. Soc. Am. Mar. 1988.
Yu, et al., "Direct Measurement of the Refractive Index Change of Silicon with Optically Injected Carriers" Appl. Phys. Lett. 1996.
Schmidt-Tiedmann "Experimental Evidence of Birefringence by Free Carriers in Semiconductors" Physical Review Letters Nov. 15, 1961.
Vanin, "Influence of the Polarization of the Object and Reference Waves on the Hologram Quality" 1979.
Thompson, "Holographic Particle Sizing Techniques" Apr. 15, 2000.
Applied Physics Letters (excerpts) Jan. 1969.

Dickson et al., "Holographic Polarization Separation Elements" Applied Optics Aug. 10, 1994.
Lohmann, "Reconstruction of Vectorial Wavefronts" Applied Optics, 1967.
Kotani et al., 5.6 ps Gate Delay All Refractory Josephson OR Gate with Modified Variable Threshold Logic 1985.
Hariharan, Simple Laser Inferometer with Variable Shear and Tilt. Applied Optics May 1975.
D.N. Goryachev et al., Photographic Process Based on Oxidation-Reduction Reactions on Thin Films of Lead Sulfide and Selenide, Soviet Physics—Semiconductors, Feb. 1971, vol. 4, No. 8 Leningrad, USSR.
D.N. Goryachev et al., Photographic Process Based on Oxidation-Reduction Reactions on the Surface of Silicon, Soviet Physics—Semiconductors, Feb. 1971, vol. 4, No. 8, Leningrad, USSR.
Zh. D.N. Goryachev et al., Photographic Process Based on Photoelectric Action of a Surface-Barrier Junction in Silicon, Soviet Physics—Semiconductors, Feb. 1971, vol. 4, No. 8, Leningrad, USSR.
G.B. Gorlin et al., Possible Use of the Semiconductior—Dielectric Electrophotographic System in Long-Wavelength Semiconductor Photography, Soviet Physics—Semiconductors, Aug. 1972, vol. 6, No. 2, Leningrad, USSR.
G.B Abdllaev, Formation of Photographic Images on Thin Films of Gallium and Indium Selenides, Soviet Physics—Semiconductors, Dec. 1972, vol. 6, No. 6 Leningrad, USSR.
Takashi Nakashima et al., Optical Time Domain Reflectometer with a Laser Diode Operating as Light Emitter/Photodetector, Japanese Journal of Applied Physics, Feb. 1985, vol. 24, No. 2, pp. L135-L136. Letters to the Editor, pp. 2058 & 2059, Feb. 3, 2005.
Kurt J. Weingarten et al., Picosecond Optical Sampling of GaAs Integrated Circuits, IEEE Journal of Quantum electronics, Feb. 1988, vol. 24 No. 2.
L. Ek et al., Detection of the Nodal Lines and the Amplitude of Vibration by Speckle Interferometry, Optics Communications, Feb. 1971, vol. 2 No. 9.
Ichirou Yamaguchi et al., Phase-shifting Digital Holography, Optics Letters, Aug. 14, 1997, vol. 22, No. 16.
Daniele et al., "Photoelectric Effect from a Metal Surface: A Revised Theroretical Model" J. Opt. Soc. Am. Oct. 1992.
Saito et al., Enhancement of a Sensitivity by Stratifying a Photoconductor on Thermoplastic-Photoconductor Media J. Optics 1981.
Groh and Marie, Information Input in an Optical Pattern Recognition System Using a Relay Tube based on the Pockets Effect Optics Communications Aug. 1970.
Kolner and Bloom, Electrooptic Sampling in GaAs Integrated Circuits, Journal of Quantum Electronics, Jan. 1986.
Asundi and Yung, Phase Shifting and Logical Moire, J. Opt. Soc. Am. Oct. 1991.
Mandelis, Laser Infrared Photothermal Radiometry of Semiconductors: Principles and Applications, Solid State Electronics 1998.
Caulfield, A New Approach to Computer Holography, Optics Communciations 1970.
Courjon et al, Simplifications of the Bilimnear Transfer for Microscopic Binary Objects, J. Opt. Soc. Am. Jul. 1988.
Kewitch et al., Electric Field Multiplexing/Demultiplexing of Volume Holograms in Photorefractive Media, Optics letters, Apr. 1, 1993.
Mendlovic, Compact Optical Temporal Processors, Applied Optics, Jul. 10, 1995.
Zhu, Holographic Tomography in Three-Dimensional Photoelasticity Within the Born Approximation, J. Opt. Soc. Am., Nov. 1992.
Yatagai, Cellular Logic Architectures for Optical Computers, Applied Optics, May 15, 1986.
Banyasz et al., Holographic and Holographic Inferometry with a Near IR Sensitive Photopolymer System Jan. 1997.
Buse et al., Infrared Holographic Recording in LiNbO3:Cu, Applied Physics, 1994.
Vienot et al., Three Dimensional Object Recognition in real Time by Multiplex Spatial Filtering, Optics Communications, Feb. 1971.
Fujimaki et al., 9ps gate Delay Josephson OR Gate with Modified Variable Threshold Logic, JP. J Appl. Phy. Jan. 1985.
Yamaguchi and Takahashi, Ellipsometric Method for Separate Measurements of a and d of a Transparent Film, Applied Optics, Aug. 1975.
Paritskii et al., Formation of Photographic Images at the Interface Between a Semiconductor and an Active Gas Medium, Soviet Physics-Semiconductors, Jan. 1973.
Belyakov et al., Use of Evaporated Lead Sulfide Films in Electrolytic Photography, Soviet Physics—Semiconductors, Jan. 1972.
Zaidel et al., Plasma Diagnostics by Holography, Soviet Physics—Technical Physics, Mar. 1969.
Brandt, Hologram-Moire Interferometry for Transparent Objects, Applied Optics, Sep. 1967.
Jaboda et al., Fractional-Fringe Holographic Plasma Interferometry, Applied Optics, Aug. 1967.
K.J. Schmidt-Tiedemann, Stress Optical Constants of Germanium, Philips Research Lab Hamburg, Hamburg, Germany, Letters to the Editor, pp. 2058 & 2059.
H.K. Heinrich et al., "Noninvasive sheet charge density probe for integrated silicon devices." Appl. Phys. Lett 48(16) Apr. 21, 1986, p. 1066-1068 with Errata, Appl. Phys. Lett. 48(26) Jun. 30, 1986, p. 1811.
P. Hariharan, "Optical Holigraphy:Principles, Techniques, and Applications", 2nd ed. Cambridge University Press 1996.
Yamaguchi and Takahashi, Elipsometric Method for Separate Measurements of n and d of a Transparent Film, Applied Optics Aug. 1985.
Ivanova et al., "Semiconductor Photographic System Based on High-Resistivity Gallium Arsenide," Soviet Physics—Semiconductors, vol. 6, No. 9, Mar. 1973, pp. 1585-1587.
B.J. Thompson, "Holographic Particle Sizing Techniques," J. Physics E: Scientific Instruments, vol. 7 pp. 781-788, 1974.
C.N. Kurtz, Holographic Polarization Recording with an Encoded Reference Beam, Applied Physics Letters 14(2), 59-61, 1969.
Saito et al., Solvent Vapour Method in Thermoplastic Photoconductor Media, J. Optics, 1980, pp. 285-292.
Rastogi and Pflug, Holographic Moire Phase Reinforcement Procedure to Obtain Variable Sensitivity Surface Topographic Mapping: Extension to Phase Steping, Optics and Laser Technology 1992, vol. 24(4), p. 203-207.
Amadesi et al., Holographic Methods for Painting Diagnostics, Applied Optics, 1974.
Som and Budhiraja, Noise Reductions by Continuous Addition of Subchannel Holograms, Applied Optics, Jul. 1975.
Knight, Holographic Associative Memory Processor, Applied Optics, May 1975.
Tull et al., Self-Scanned Digicon: A Digital Image Tube for Astronomical Spectroscopy, Applied Optics, May 1975.
Colburn et al., Holographic Recording in Thermoplastic at 1.15 um, Appl. Phys., Aug. 1973.
Todorov et al., Polarization Holography, Applied Optics, Mar. 1985.
Nikolova et al., Polarization-Preserving Wavefront Reversal by Four Wave Mixing in Photanisotropic Materials, Applied Optics, Apr. 15, 1988.
Saito et al., Solvent Vapour Method in Thermoplastic Photoconductor Media, J Optics, 1980.
Srinath and Sarma, Role of Light Ellipse in Photoelasticity and New Methods for Isoclinic-parameter Determination, Experimental Mechanics, Jun. 1971.
Iniechen et al., Thermoplastic Film Camera for holographic Recording of Extended Objects in Industrial Applications, Applied Optics, Jun. 15, 1982.
Kristal, Pulsed HF Laser Holographic Interferometry, Applied Optics, Mar. 1975.
Rastogi and Pflug, Novel Concept for Obtaining Continuously Variable Topographic Contour Mapping Using Holographic Interferometry, Applied Optics, Oct. 10, 1990.
Hariharan,Simple Laser Inferometer with viable Shear and Tilt, Applied Optics, May 1975.
Nakadate and Saito, Fringe Scanning Speckle-Pattern Interferometry, Applied Optics, Jul. 15, 1985.

Snow and Vandewarker, An Application of Holography to Interference Microscopy, Applied Optics, Mar. 1968.

Nassenstein, Superresolution by Diffraction of Subwaves, Optics Communications, Oct. 1970.

Schweider et al., Homogeneity Testing by Phase Sampling Interferometry, Applied Optics, Sep. 15, 1985.

Lohman and Paris, Computer Generated Spatial Filters for Coherent Optical Data Processing, Applied Optics, Apr. 1968.

Rioux, Plastic Recording Media for Holography at 10.6 um, Applied Optics, Jul. 1977.

Grischkowsky et al., Capacitance Free Generation and Detection of Subpicosecond Electrical Pulses on Coplanar Transmission Lines, Journal of Quantum Electronics, Feb. 1988.

Creath, Phase Shifting Speckle Interferometry, Applied Optics, Sep. 15, 1985.

Tilford, Analytical Procedure for Determining Lengths from Fractional Fringes, Applied Optics, Jul. 1977.

Roberds, Particle Sizing Using Laser Interferometry, Applied Optics, Jul. 1977.

* cited by examiner

Circuit of Refractory Josephson OR Gate

IC crosscut showing Josephson Gate/Junction and area of non-invasive Holographic microscopic inspection using arrangements disclosed.

Record-erase cycle for an IR Thermoplastic recording material

Conventional Method
(single sided Hologram/Interferogram)

Double Sided Method
(Holography/Interferogram)

Figure 16:
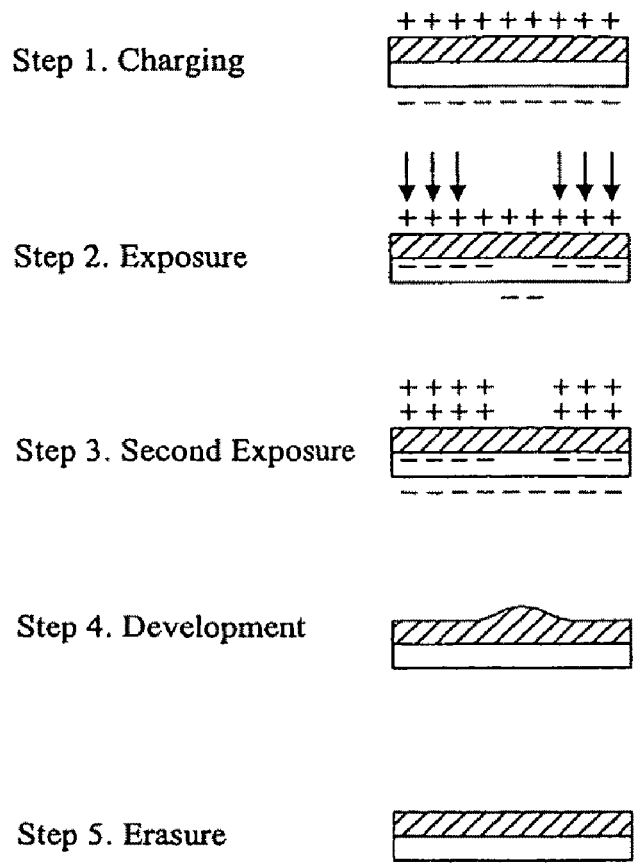
Figure 16A:
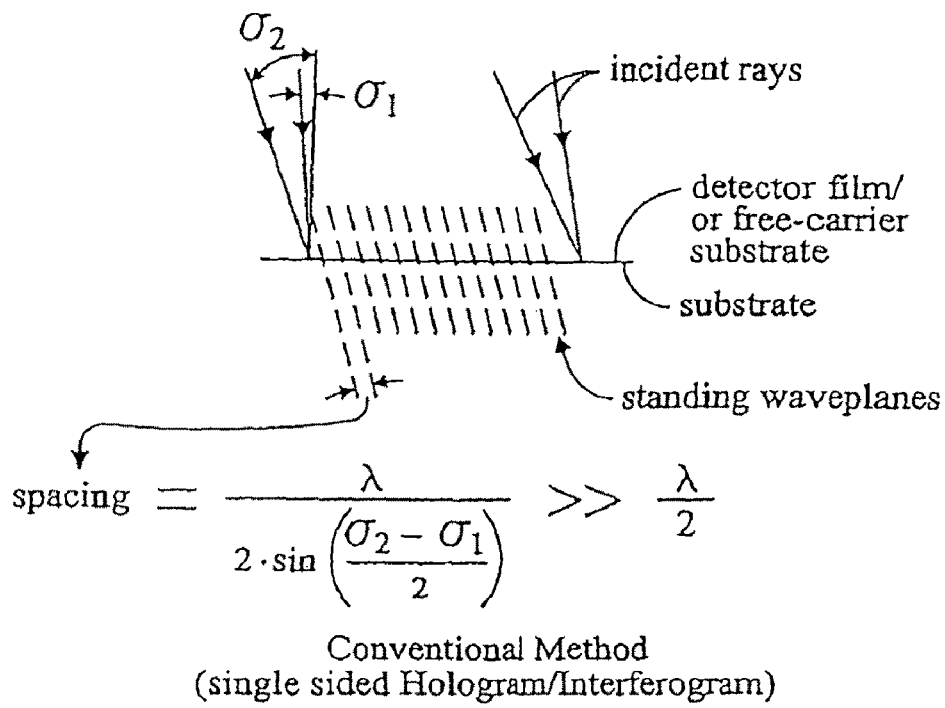
Figure 16B:
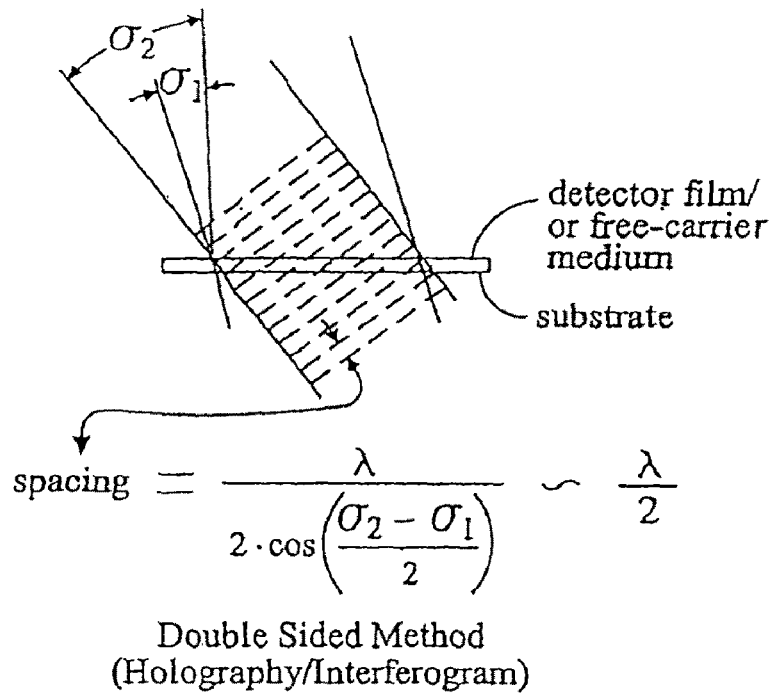

Semiconductor layer and orientation thickness of
P-N materials corresponds to standing waveplanes
in single-sided free-carrier IR Holography Semiconductor orientation and the column dimensions
dimensions corresponds to standing waveplanes
in double-sided free-carrier IR Holography
(Refer to FIG. 16A and 16B as well as FIG. 27A)

Illustration showing arrangement of
generalized Gunary detour-phase IR Hologram

IR Diffracton at a Rectangular Aperture

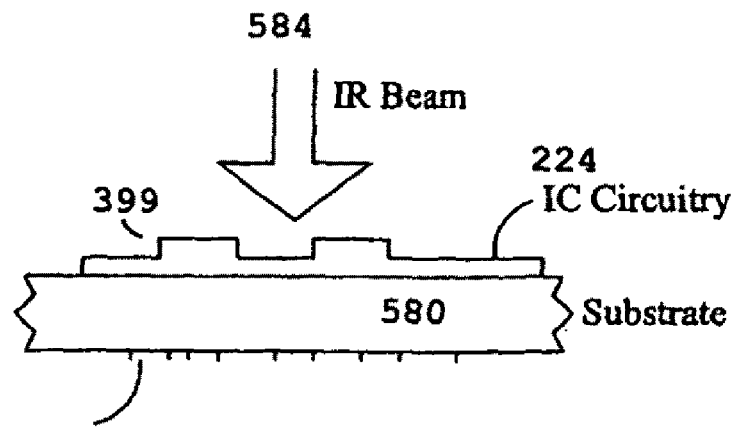

IR Hologram printed on back, computer generated or directly exposed for testing of IC functionality

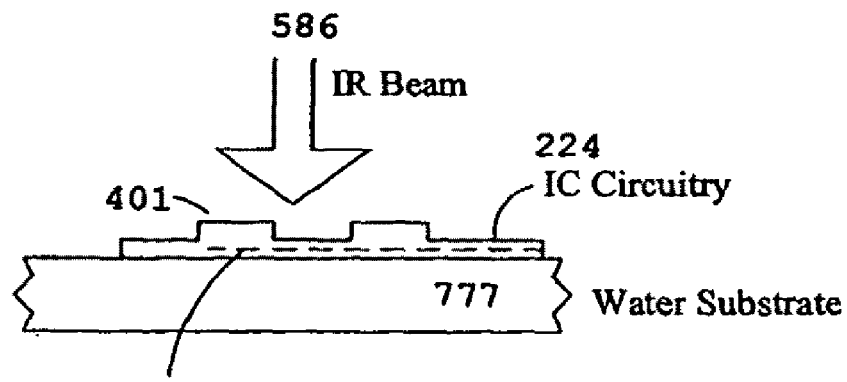

HOE - IR Holographic Optical Element built directly into IC's circuitry gives optimal interferogram if IC lithography and operating voltage parameters are okay. Can also be set up to detect failure conditions or other operations

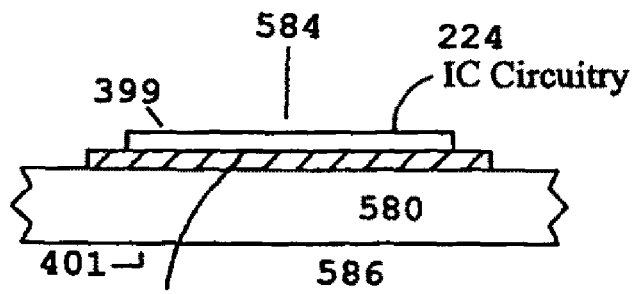

IR computer generated Hologram can also be ion-beam etched/implanted into wafer substrate.

FIG 44

HOLOGRAPHIC CONDITION ASSESSMENT SYSTEM FOR A STRUCTURE INCLUDING A SEMICONDUCTOR MATERIAL

CROSS REFERENCE TO RELATED APPLICATIONS

This application is a continuation application of U.S. Ser. No. 12/172,629 filed Jul. 14, 2008, now U.S. Pat. No. 7,773,230 which is a continuation of U.S. Ser. No. 11/536,617 filed Sep. 28, 2006 (U.S. Pat. No. 7,420,687), which is a continuation of U.S. Ser. No. 11/050,034 filed Feb. 3, 2005 (U.S. Pat. No. 7,323,889), which is a continuation application of Ser. No. 10/660,189 filed Sep. 10, 2003 (U.S. Pat. No. 6,972,577), which is a continuation of Ser. No. 10/219,599 filed Aug. 14, 2002 (U.S. Pat. No. 6,803,777), which is a continuation of Ser. No. 09/626,420 filed Jul. 26, 2000 (U.S. Pat. No. 6,512,385), which claims priority to Provisional application Ser. No. 60/145,617 filed Jul. 26, 1999.

BACKGROUND OF THE INVENTION

Field of the Invention

The development of advanced integrated circuit devices and architectures has been spurred by the ever increasing need for speed. For example, microwave, fiber optical digital data transmission, high-speed data acquisition, and the constant push for faster digital logic in high speed computers and signal processors has created new demands on high-speed electronic instrumentation for testing purposes.

Conventional test instruments primarily include two features, the integrated circuit probe that connects the test instrument to the circuit and the test instrument itself. The integrated circuit probe has its own intrinsic bandwidth that may impose limits on the bandwidth achievable. In addition, the probe also determines an instrument's ability to probe the integrated circuit due to its size (limiting its spatial resolution) and influence on circuit performance (loading of the circuit from its characteristic and parasitic impedances). The test instrument sets the available bandwidth given perfect integrated circuit probes or packaged circuits, and defines the type of electric test, such as measuring time or frequency response.

Connection to a test instrument begins with the external connectors, such as the 50 ohm coaxial Kelvin cable connectors (or APC-2.4). The integrated circuit probes provide the transitions from the coaxial cable to some type of contact point with a size comparable to an integrated circuit bond pad. Low-frequency signals are often connected with needle probes. At frequencies greater than several hundred megahertz these probes having increasing parasitic impedances, principally due to shunt capacitance from fringing fields and series inductance from long, thin needles. The parasitic impedances and the relatively large probe size compared to integrated circuit interconnects limit their effective use to low-frequency external input or output circuit responses at the bond pads.

Therefore, electrical probes suffer from a measurement dilemma. Good high-frequency probes use transmission lines to control the line impedance from the coaxial transition to the integrated circuit bond pad to reduce parasitic impedances. The low characteristic impedance of such lines limits their use to input/output connections. High-impedance probes suitable for probing intermediate circuit nodes have significant parasitic impedances at microwave frequencies, severely perturbing the circuit operation and affecting the measurement accuracy. In both cases, the probe size is large compared to integrated circuit interconnect size; limiting their use to test points the size of bond pads. Likewise sampling oscilloscopes, spectrum analyzers, and network analyzers rely on connectors and integrated circuit probes, limiting their ability to probe an integrated circuit to its external response. For network analysis, a further issue is de-embedding the device parameters from the connector and circuit fixture response, a task that grows progressively more difficult at increasing frequencies.

With the objective of either increased bandwidth or internal integrated circuit testing with high spatial resolution (or both) different techniques have been introduced. Scanning electron microscopes or E-beam probing uses an electron beam to stimulate secondary electron emission from surface metallization. The detected signal is small for integrated circuit voltage levels. The system's time resolution is set by gating the E-beam from the thermionic cathodes of standard SEM's. For decreasing the electron beam duration required for increased time resolution, the average beam current decreases, degrading measurement sensitivity and limiting practical systems to a time resolution of several hundred picoseconds. Also, SEM testing is complex and relatively expensive.

Valdmanis et al., in a paper entitled "Picosecond Electronics and Optoelectronics", New York: Springer-Verlag, 1987, shows an electro-optic sampling technique which uses an electrooptic light modulator to intensity modulate a probe beam in proportion to a circuit voltage. Referring to FIG. 1, an integrated circuit 10 includes bonded electrical conductors 12 fabricated thereon whereby imposing differential voltages thereon gives rise to an electric field 14. For carrying out a measurement an electro-optic needle probe 16 includes an electro-optic tip 18 ($LiTaO_3$) and a fused silica support 20. A light beam incident along path 22 is reflected at the end of the electro-optic tip 18 and then passes back along path 24. An electric field 14 alters the refractive index of the electro-optic tip 18 and thereby alters the polarization of the reflected light beam on the exit path 24, which thus provides a measure of the voltages on the conductors 12. Unfortunately, because of the proximity of the probe 16 to the substrate 10 capacitive loading is applied to the circuit, thereby altering measurements therefrom. In addition, it is difficult to position the probe 16 in relation to the conductor because the probe 16 and circuit 10 are vibration sensitive. Also, the measurements are limited to conductors 12 on or near the surface of the circuit 10. Further, the circuit must be active to obtain meaningful results and the system infers what is occurring in other portions of the circuit by a local measurement.

Figure 2:
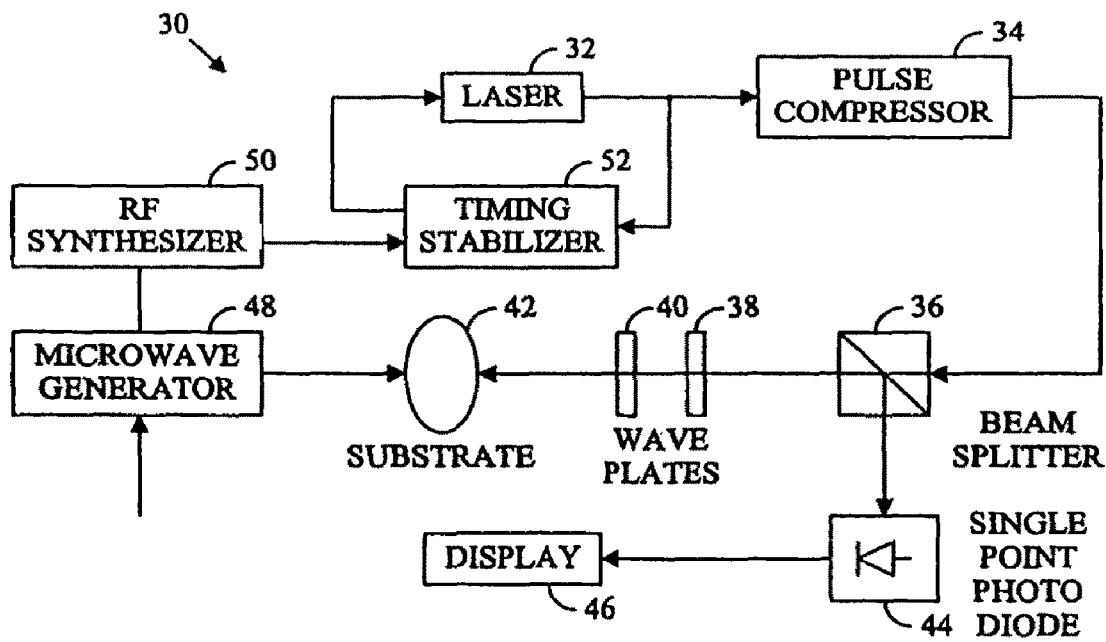

Weingarten et al. in a paper entitled, "Picosecond Optical Sampling of GaAs Integrated Circuits", IEEE Journal of Quantum Electronics, Vol. 24, No. 2, February 1988, disclosed an electro-optic sampling technique that measures voltages arising from within the substrate. Referring to FIG. 2, the system 30 includes a mode-locked Nd:YAG laser 32 that provides Pico second-range light pulses after passage through a pulse compressor 34. The compressed pulses are passed through a polarizing beam splitter 36, and first and second wave plates 38 and 40 to establish polarization. The polarized light is then directed at normal incidence onto an integrated circuit substrate 42. The pulsed compressed beam can be focused either onto the probed conductor itself (backside probing) or onto the ground plane beneath and adjacent to the probed conductor (front-side probing). The reflected light from the substrate is diverted by the polarizing beam splitter 36 and detected by a slow photo diode detector 44. The photo diode detector is also connected to a display 46.

A microwave generator 48 drives the substrate 42 and is also connected to an RF synthesizer 50, which in turn is connected to a timing stabilizer 52. The pulse output of the laser 32 is likewise connected to the timing stabilizer 52. The output of the stabilizer 52 connects back to the laser 32 so that the frequency of the microwave generator 46 locks onto a frequency that is a multiple of the laser repetition rate plus an offset. As a consequence, one may analyze the electric fields produced within the integrated circuit as a result of being voltage drive, thus providing circuit analysis of the integrated circuit operation. In essence, the voltage of the substrate imposed by the microwave generator 48 will change the polarization in the return signal that results in a detectable change at the diode detector 44.

Figure 3B:
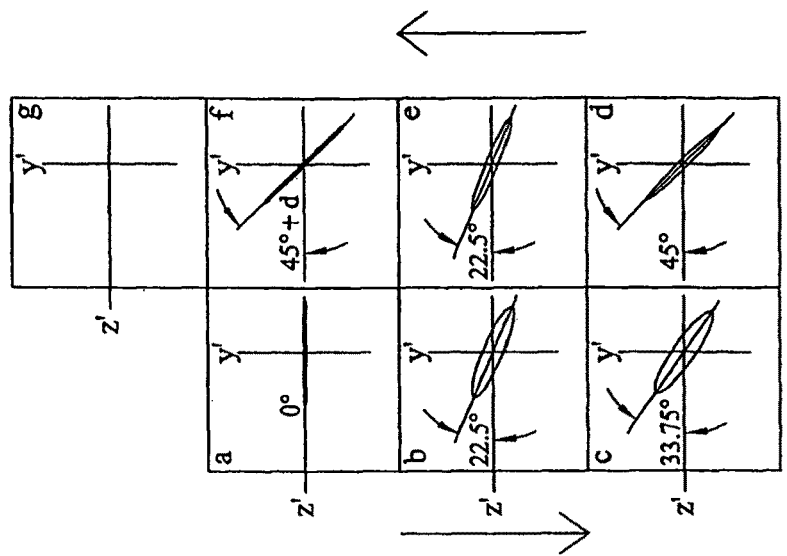
Figure 3A:
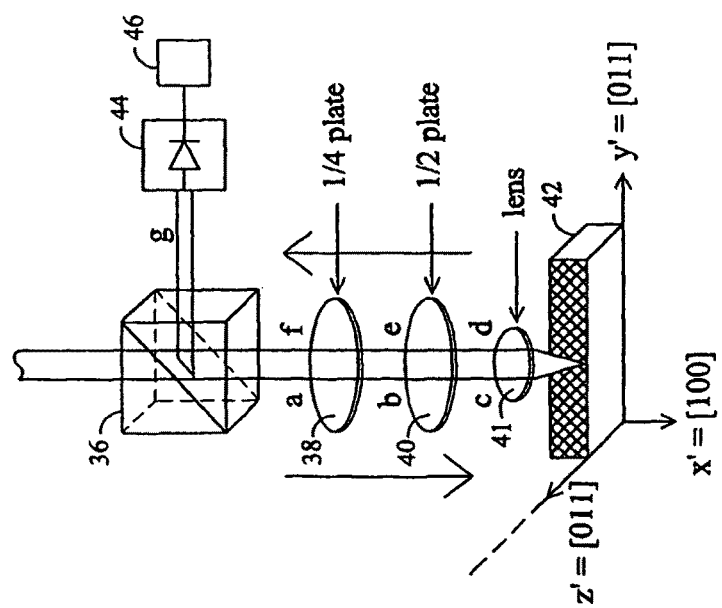

Referring to FIGS. 3A and 3B, the locations along the incident beam are designated a, b, c (relative to the "down" arrow), and designated along the reflected beam as d, e, and f (relative to the "up" arrow), and the intensity modulated output signal is designated as g. The corresponding states of polarization exhibited in the measurement process are shown in the similarly lettered graphs of FIG. 3B. At location a of FIG. 3A, the polarizing beam splitter 36 provides a linearly polarized probe beam (as shown in graph a of FIG. 3B) that is passed through the first wave plate 38, which is a T/2 plate oriented at 22.5 degrees relative to the incident beam polarization, so as to yield at location b the 22.5 degree elliptically polarized beam shown in graph b of FIG. 3B). The beam then passes through the second wave plate 40, which is a T/2 plate oriented at 33.75 degrees relative to the incident beam, so as to rotate the beam an additional 22.5 degrees to yield at location c the 45 degree polarization (shown in graph c of FIG. 3B), which is at 45 degrees to the [011] direction of the substrate 42, i.e., the cleave plane of the wafer. Similar rotations are shown for the reflected beam at the successive locations d, e, and f, the resultant polarizations respectively being as shown in graphs d, e, and f of FIG. 3B. As shown in graph f in particular, the electro-optic effect of any voltage present on the substrate 42 at the spot at which the beam reflects therefrom brings about a change in the specific polarization orientation in an amount designated in graph f of FIG. 3B as &, and that change is reflected in an amplitude change or intensity modulation in the output signal at location g that passes to the photo-diode 44 (as shown in graph g of FIG. 3B). It is the measurement of & that constitutes the voltage measurement. Among the various techniques of predetermining the voltage patterns to be used in testing an integrated circuit, or indeed an entire printed circuit, Springer, U.S. Pat. No. 4,625,313, describes the use in a CPU of a ROM "kernel" in which are stored both a test program sequence and the testing data itself.

Since the system taught by Weingarten et al. does not include a probe proximate the circuit under test the limitations imposed by capacitive loading of the circuit to be tested is avoided. However, the system taught by Weingarten et al. is limited to "point probing," by the lens 41 converging the input beam into a test point on the order of one wavelength. Unfortunately, to test an entire circuit an excessive number of tests must be performed. In addition, it is not possible to test multiple points simultaneously without the use of multiple systems, which may be useful in testing different portions of the circuit that are dependant upon one another. The resulting data from the system is presented to the user as a single amplitude measurement, i.e., the intensity of the signal produced at the photo-diode 44 depends simply upon the degree to which the polarization of the reflected light entering the beam splitter 36 has been rotated, so that not only are the actual phase and polarization data that derive the reflection process lost, but the precision and accuracy of the measurement becomes subject to the linearity and other properties of the photo-diode 44 and the display 46.

Various other techniques by which semiconductors may be characterized, using electromagnetic radiation of different wavelengths under different conditions is cataloged by Palik et al. in "Nondestructive Evaluation of Semiconductor Materials and Device," Plenum Press, New York, 1979, chapter 7, pp. 328-390. Specifically, treatment is given of (1) infrared reflection of GaAs to obtain the optical parameters n and k and then the carrier density N and mobility u; (2) infrared transmission in GaAs to determine k from which is determined the wavelength dependence of free carrier absorption; (3) infrared reflection laser (spot size) scanning of and transmission through GaAs to determine free carrier density in homogeneity, including local mode vibrations; (4) far infrared impurity spectra; (5) infrared reflection and transmission from thin films on a GaAs substrate; microwave magneto plasma reflection and transmission; (6) sub millimeter-wave cyclotron resonance in GaAs to determine magneto transmission; (7) ruby laser radiation to form a waveguide in a GaAs film on a GaAs substrate, the propagation features of which are then measured using infrared radiation; (8) infrared reflectance from multilayers of GaAs on a GaAs substrate; (9) reflectance measurements of graded free carrier plasmas in both PbSnTe films on PbSnTe substrates and InAs on GaAs substrates; (10) interferometric measurements of ion implanted layers; (11) infrared restrahlen spectra, also to determine lattice damage effects; (13) ellipsometric measurements of ion-implanted GaP; (14) determination of optical constants by internal reflection spectroscopy; (15) laser raster scanning of semiconductor devices to measure photoconductivity, to track the flow of logic in a MOS shift register (because of current saturation, the effect of the laser light differs in cells in the 0 or 1 logic state), and with a more intense laser power level to change those logic states (i.e., to write to the circuit); (16) laser raster scanning of semiconductor devices to determine variations in resistivity and carrier lifetimes; (17) thermal imaging of circuits to find hot spots; (18) Raman backscattering to determine free carrier density; (19) carrier injection to study the band edge; (20) birefringence measurements in monolayers of GaAs and AlAs on GaAs to characterize the resultant strain; (21) photoluminescence and cathodoluminescence measurements of implanted layers and acceptor and donor densities. With the exception of (7) above which relates to waveguide transmission, and also of (15) and (17), these techniques relate to the characterization of static systems. While (15) relates to a spot scanning technique of the operational integrated circuit and (17) relates to hot-characterization of the device temperature.

What is desired, therefore, is a non-invasive technique to measure voltage levels within a device.

BRIEF DESCRIPTION OF THE SEVERAL VIEWS OF THE DRAWING(S)

Figure 4:
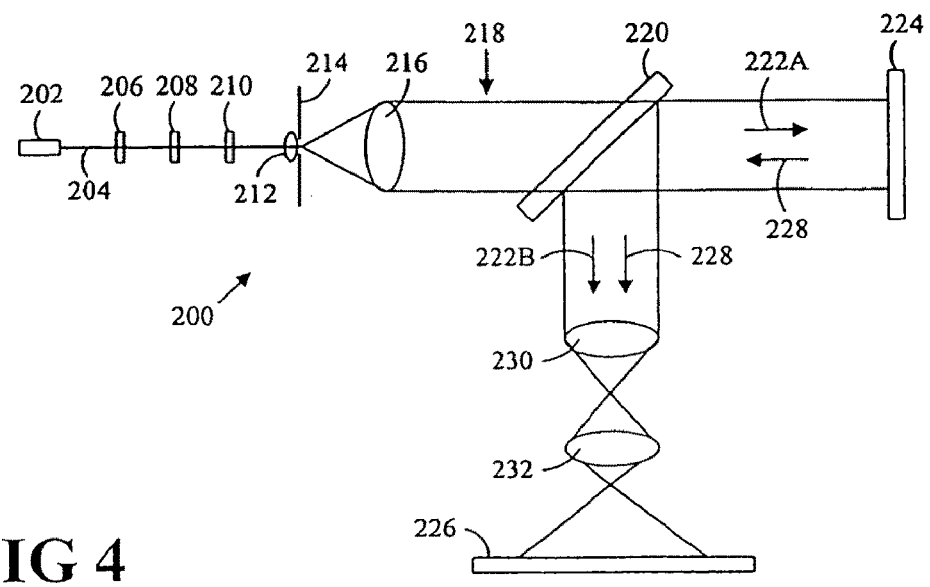
Figure 5:
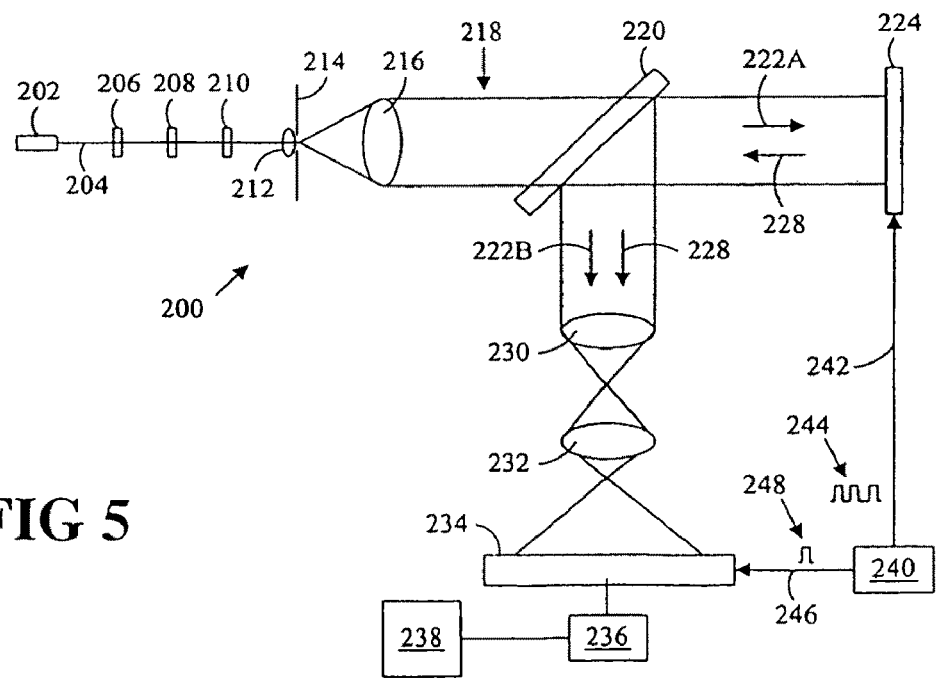
Figure 7:
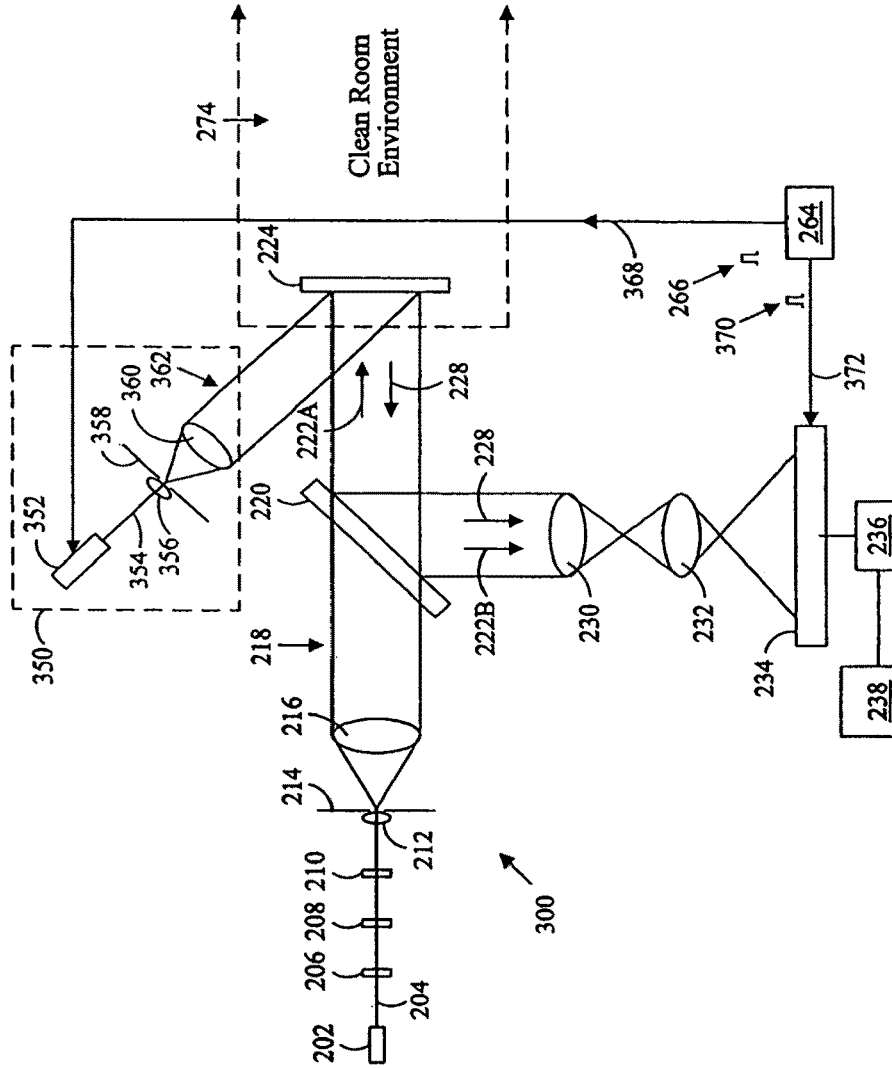
Figure 8:
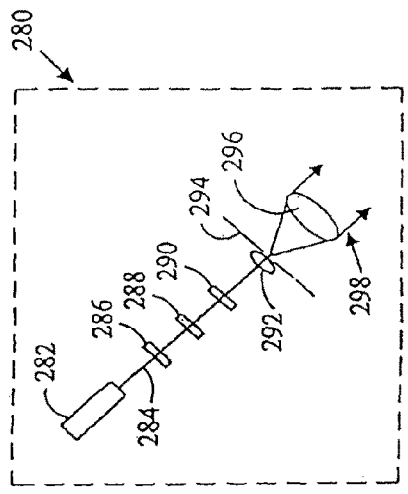
Figure 9:
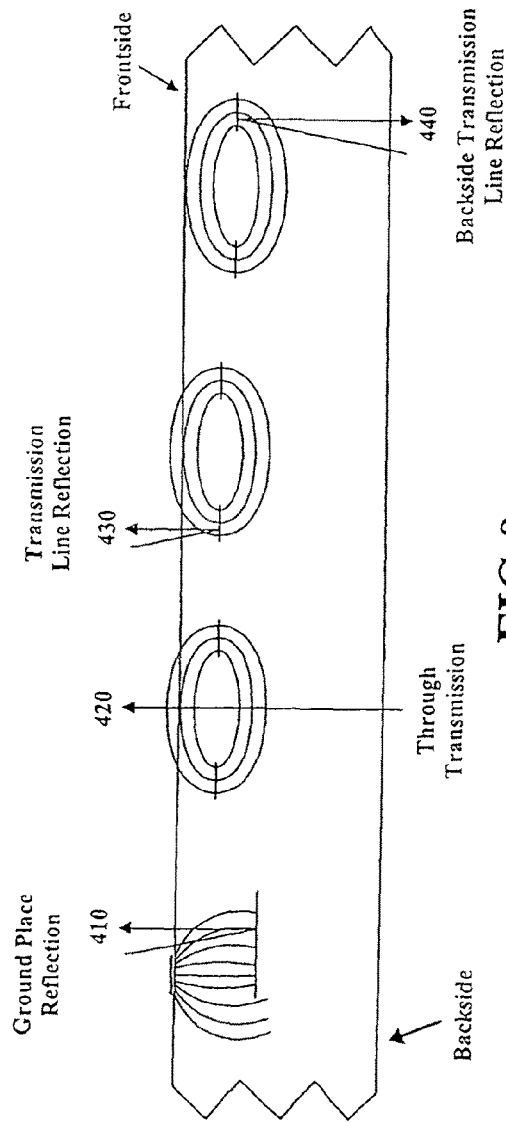
Figure 10:
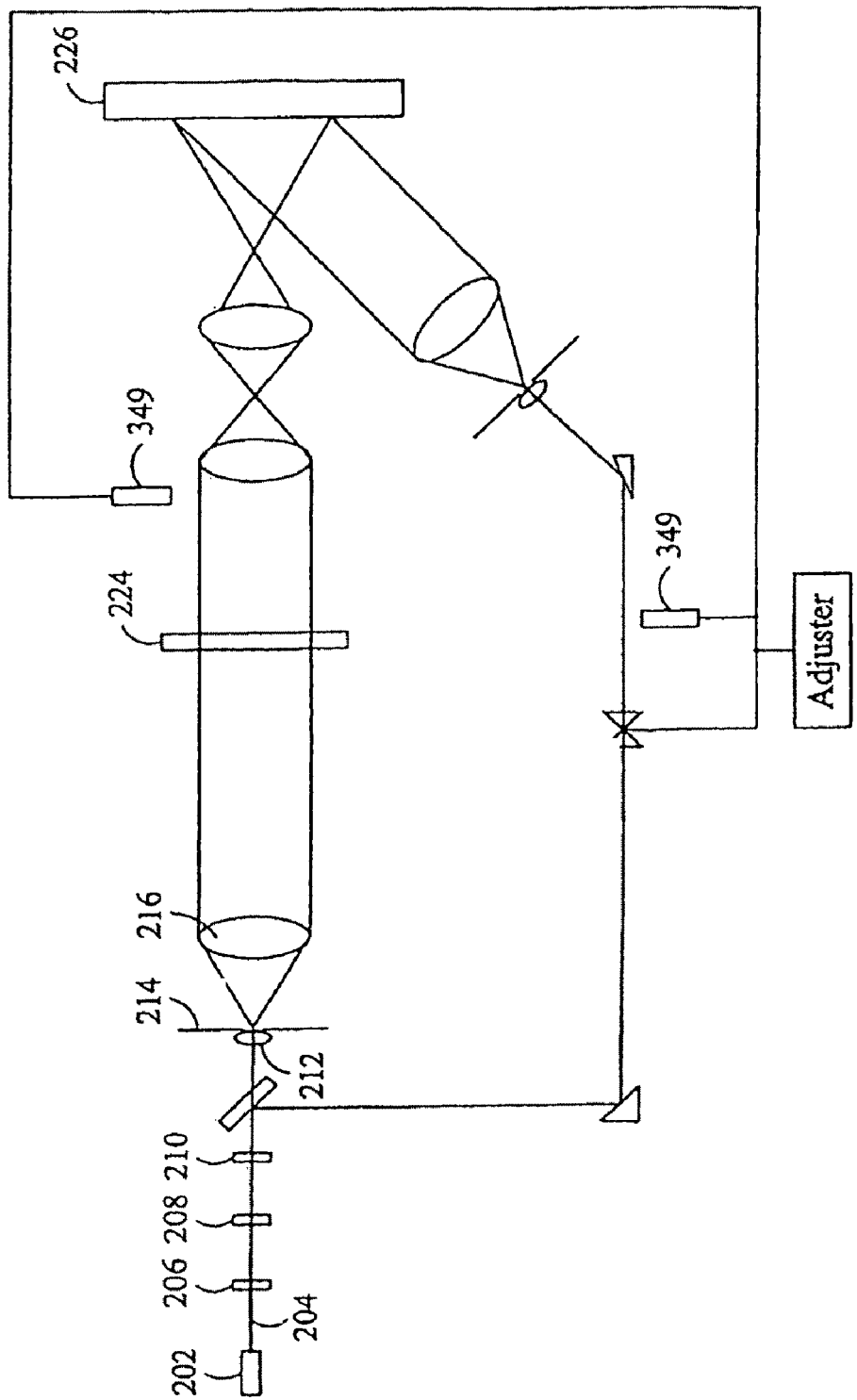
Figure 11:
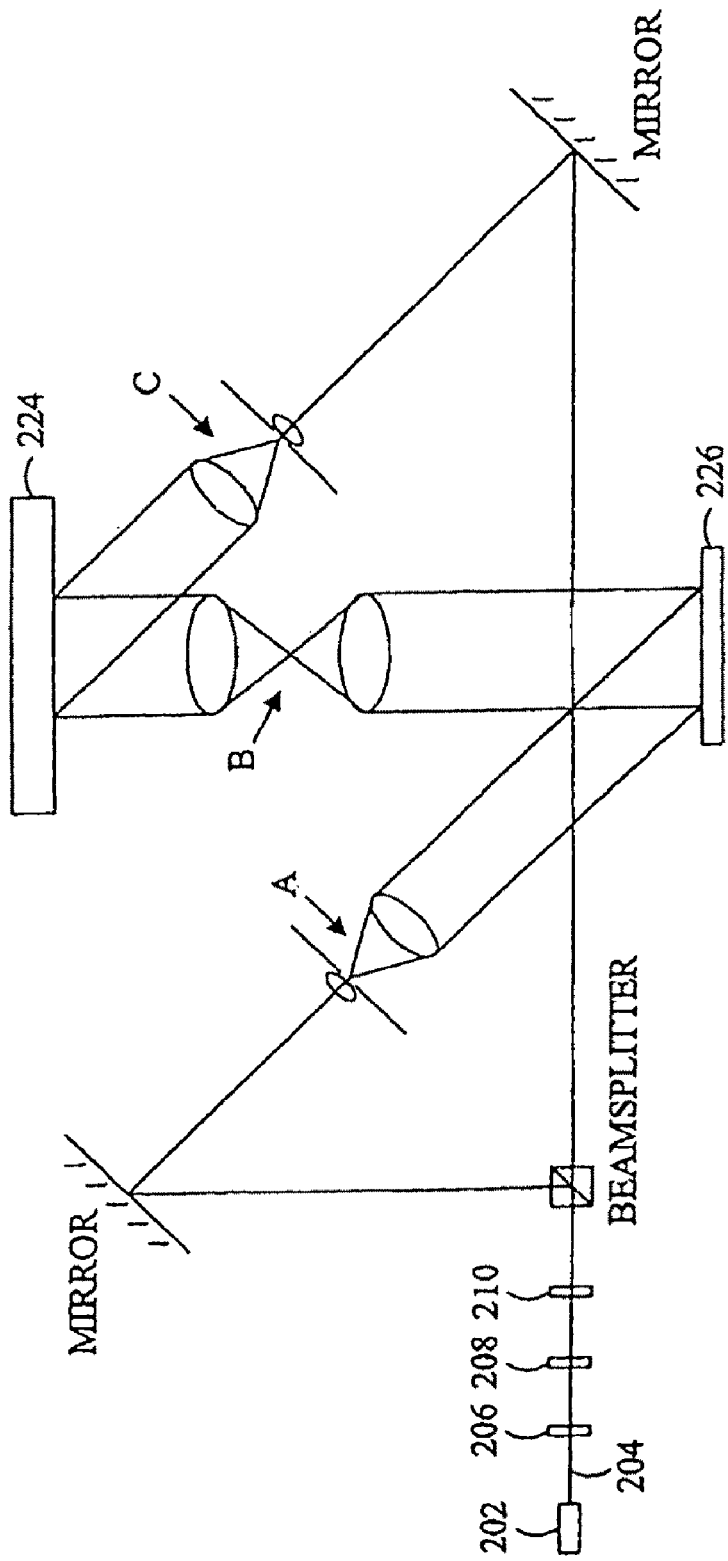

FIG. 1 is illustrates an electro-optic sampling technique.
FIG. 2 illustrates a voltage measurement system.
FIGS. 3A and 3B illustrate polarization changes.
FIG. 4 illustrates a holographic system.
FIG. 5 illustrates a holographic system.
FIGS. 6A-6E illustrate crystal structures.
FIG. 7 illustrates a holographic apparatus.
FIG. 8 illustrates a holographic apparatus.
FIG. 9 illustrates transmission and reflection structures.
FIG. 10 illustrates an off-axis technique.
FIG. 11 illustrates an off-axis technique.

Figure 12:
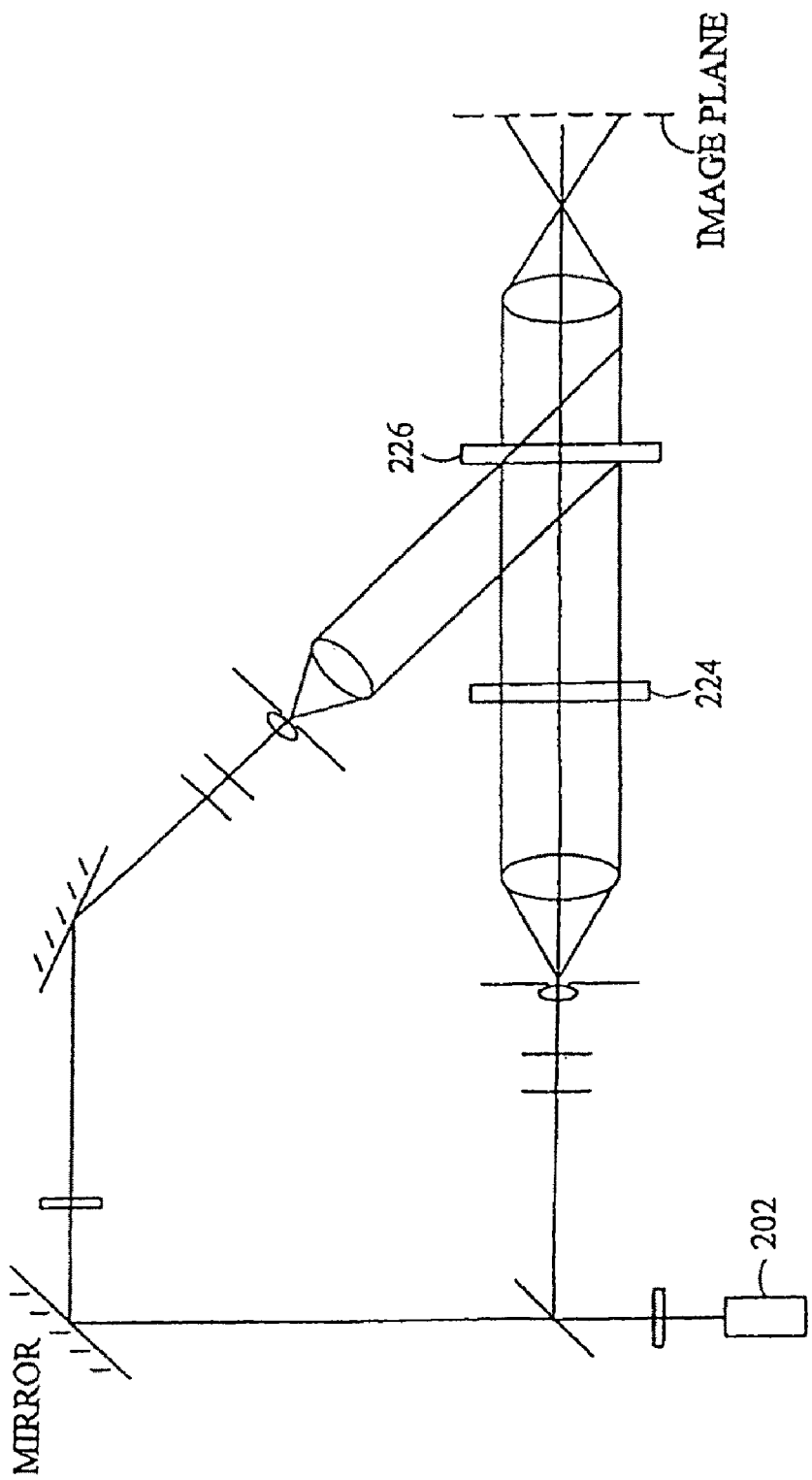
Figure 13:
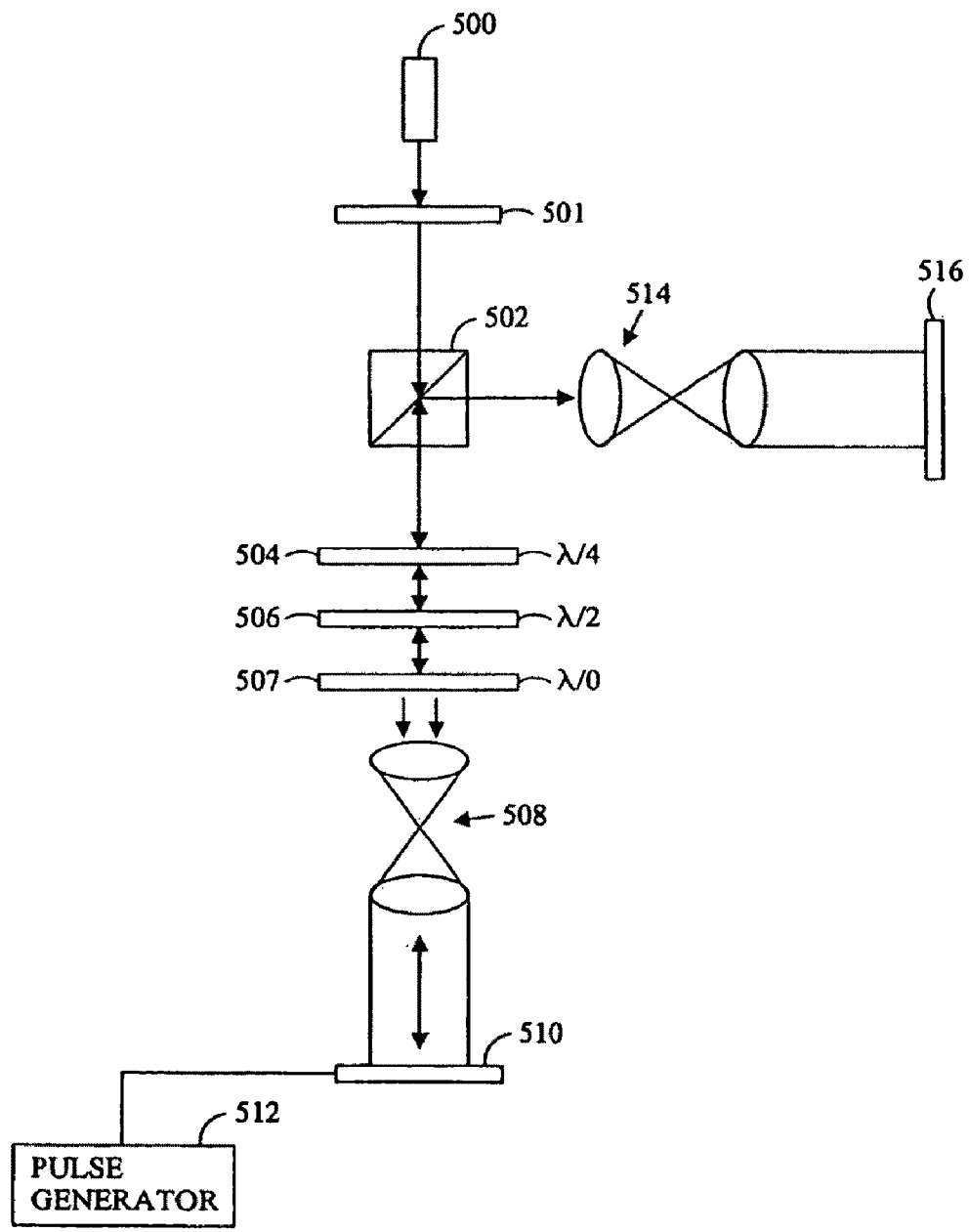
Figure 14A:
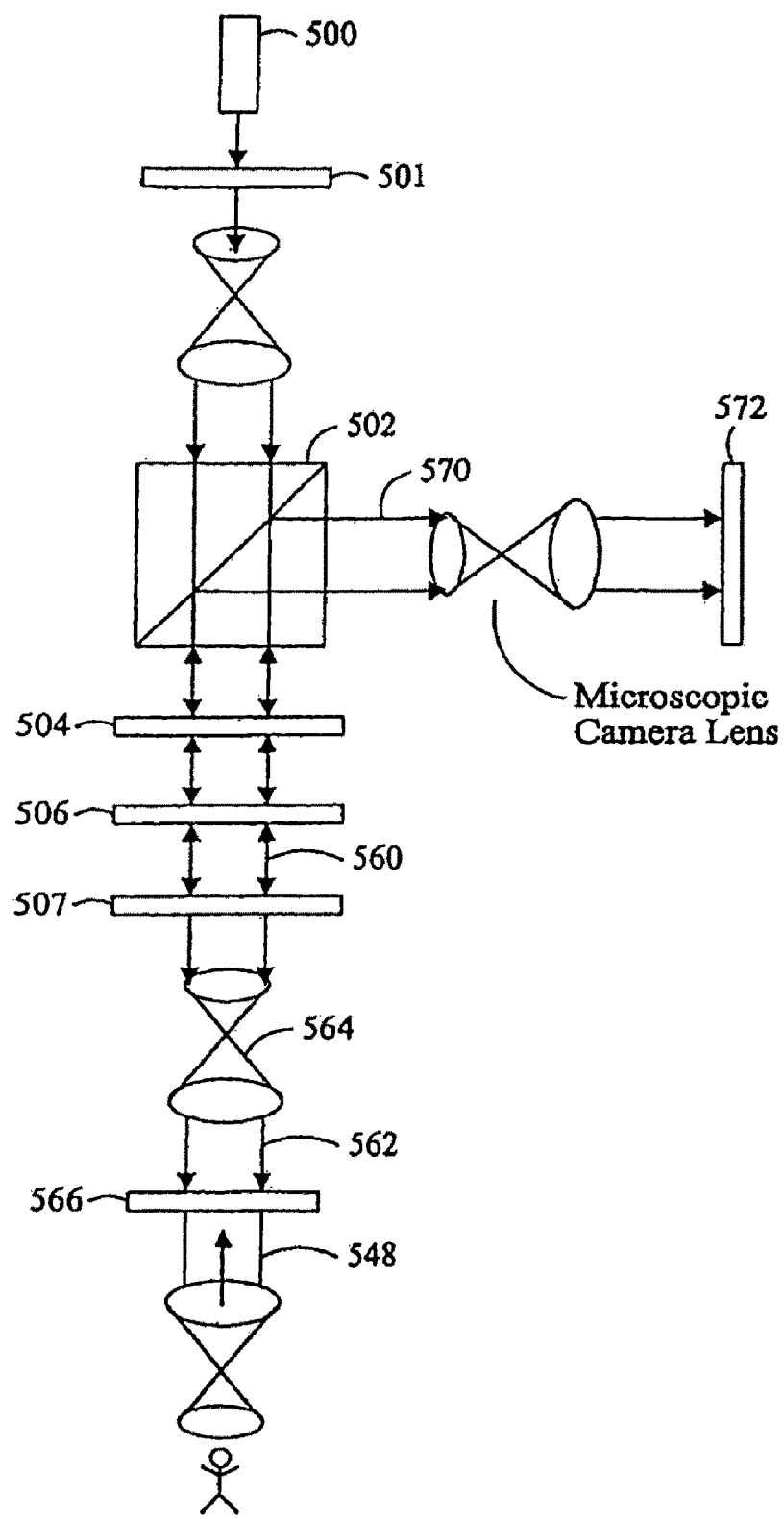
Figure 14B:
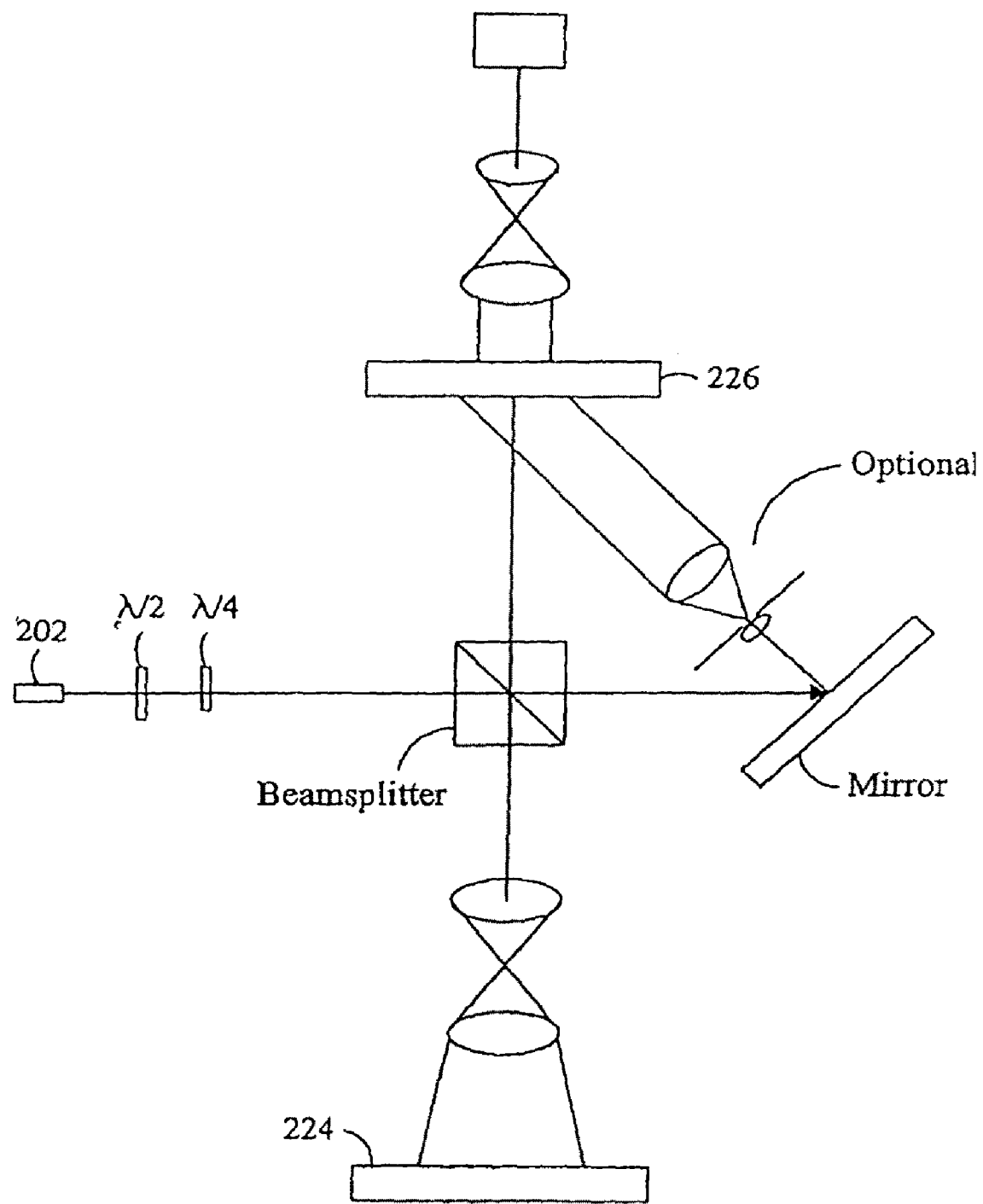
Figure 14C:
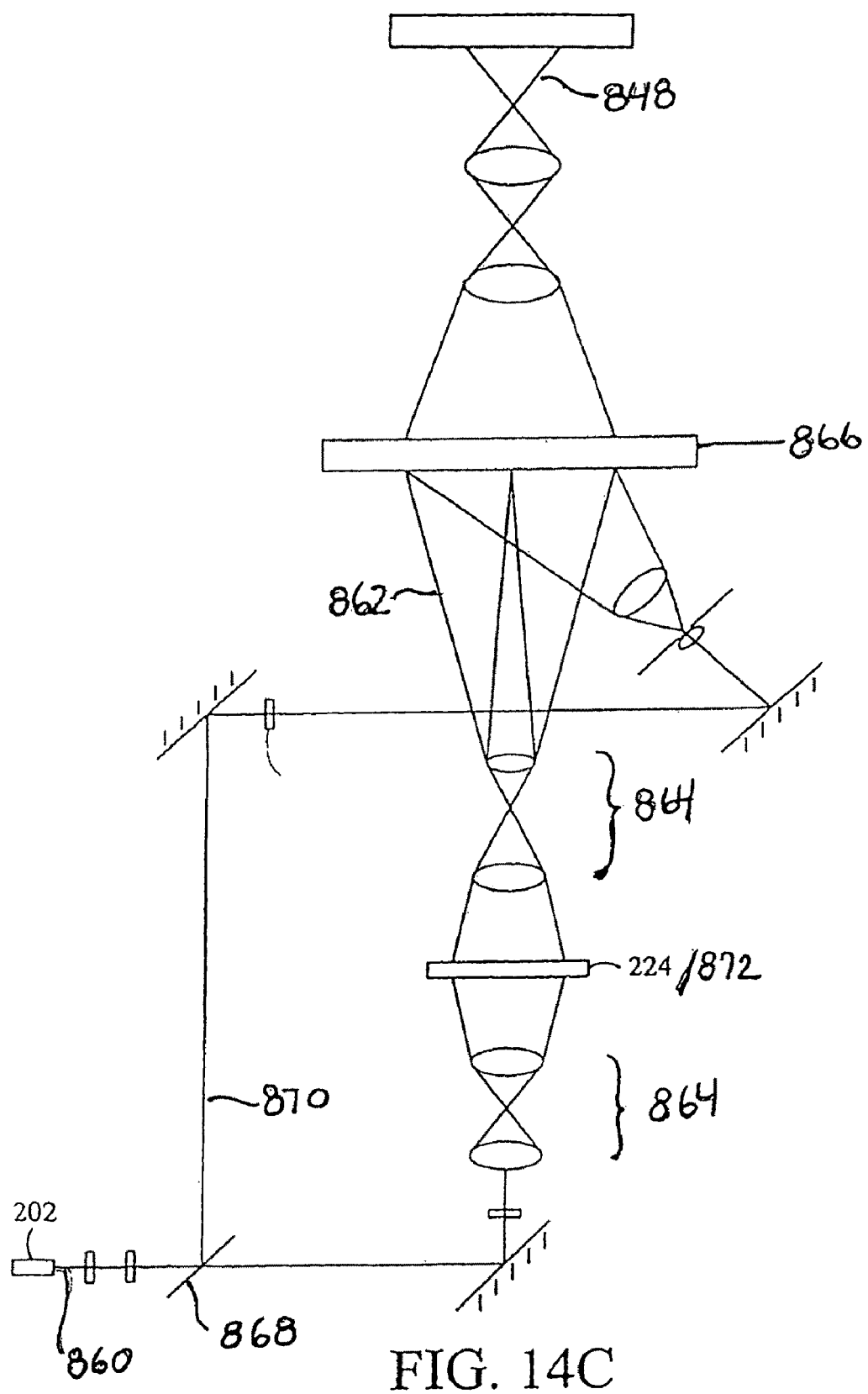
Figure 15A:
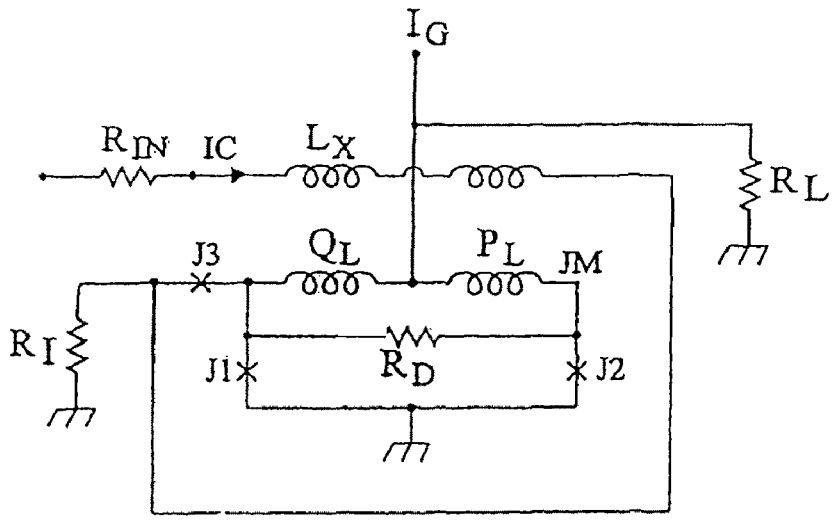
Figure 15B:
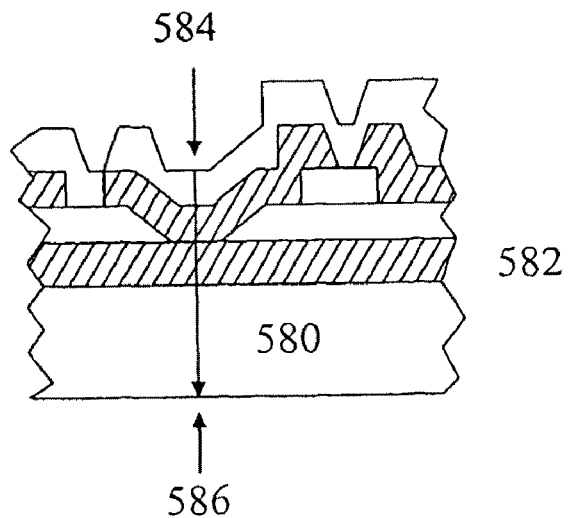
Figure 17:
Figure 18:
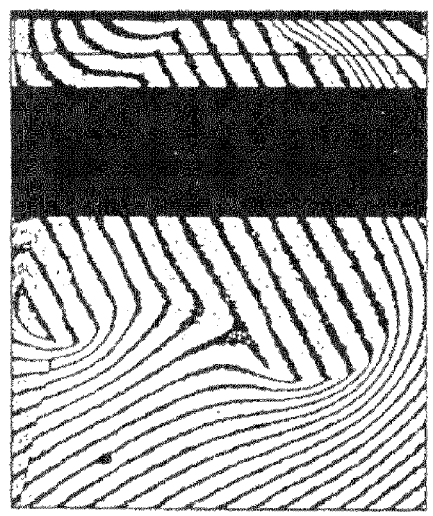
Figure 19:
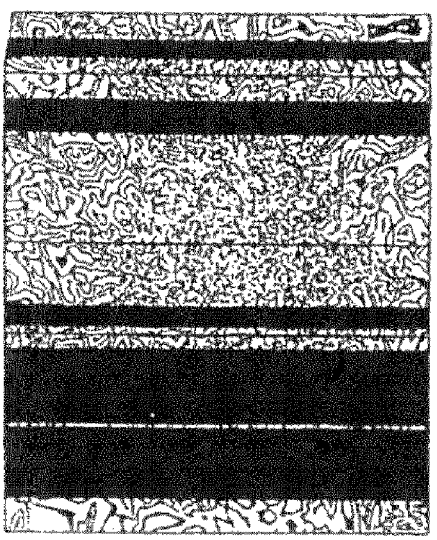
Figure 20:
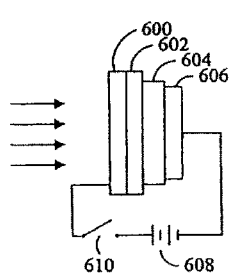
Figure 21:
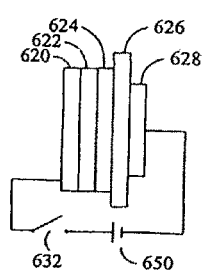
Figure 22:
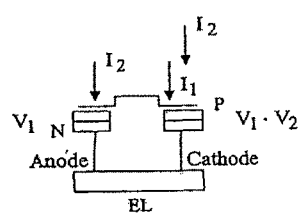
Figure 23:
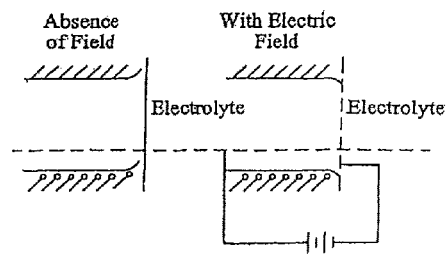
Figure 24:
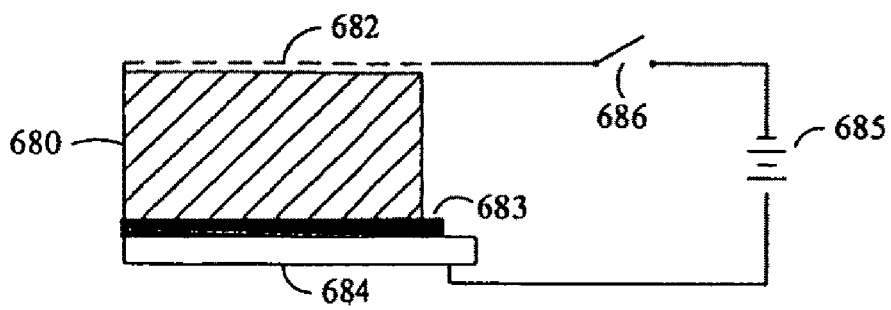
Figure 25:
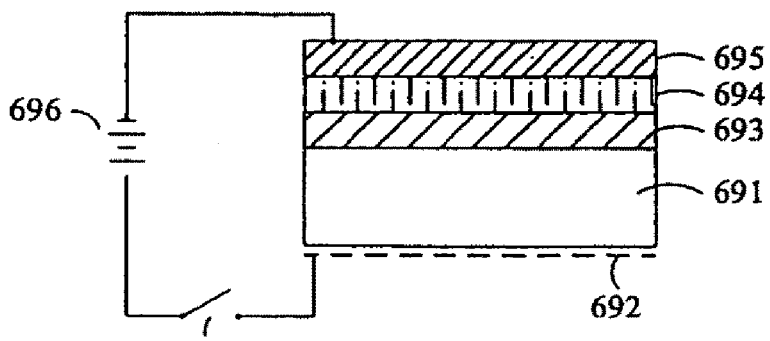
Figure 26:
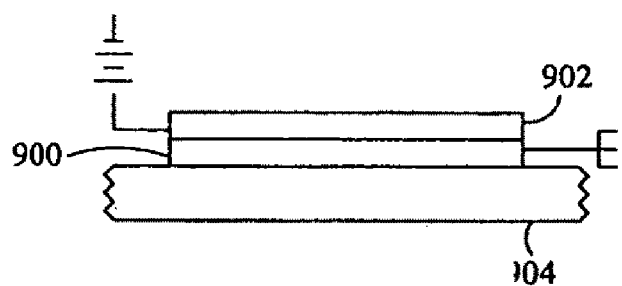
Figure 27:
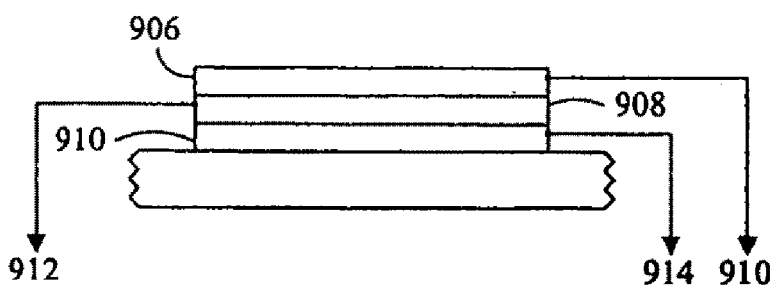
Figure 28:
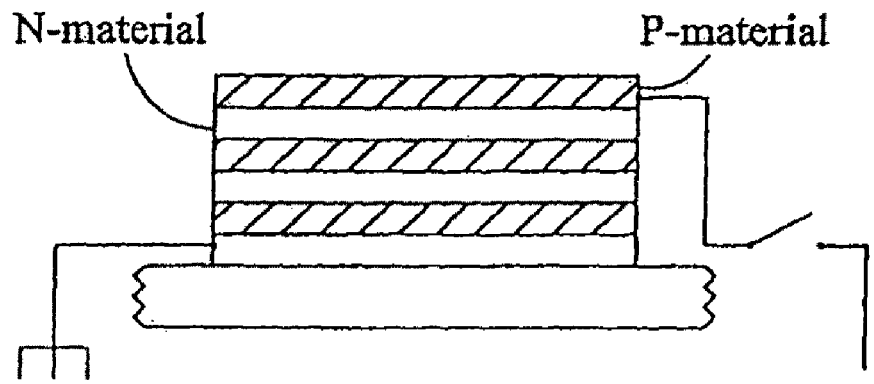
Figure 29:
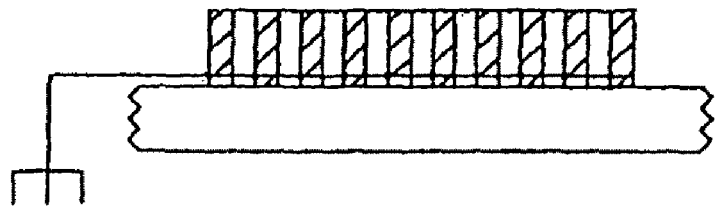
Figure 30:
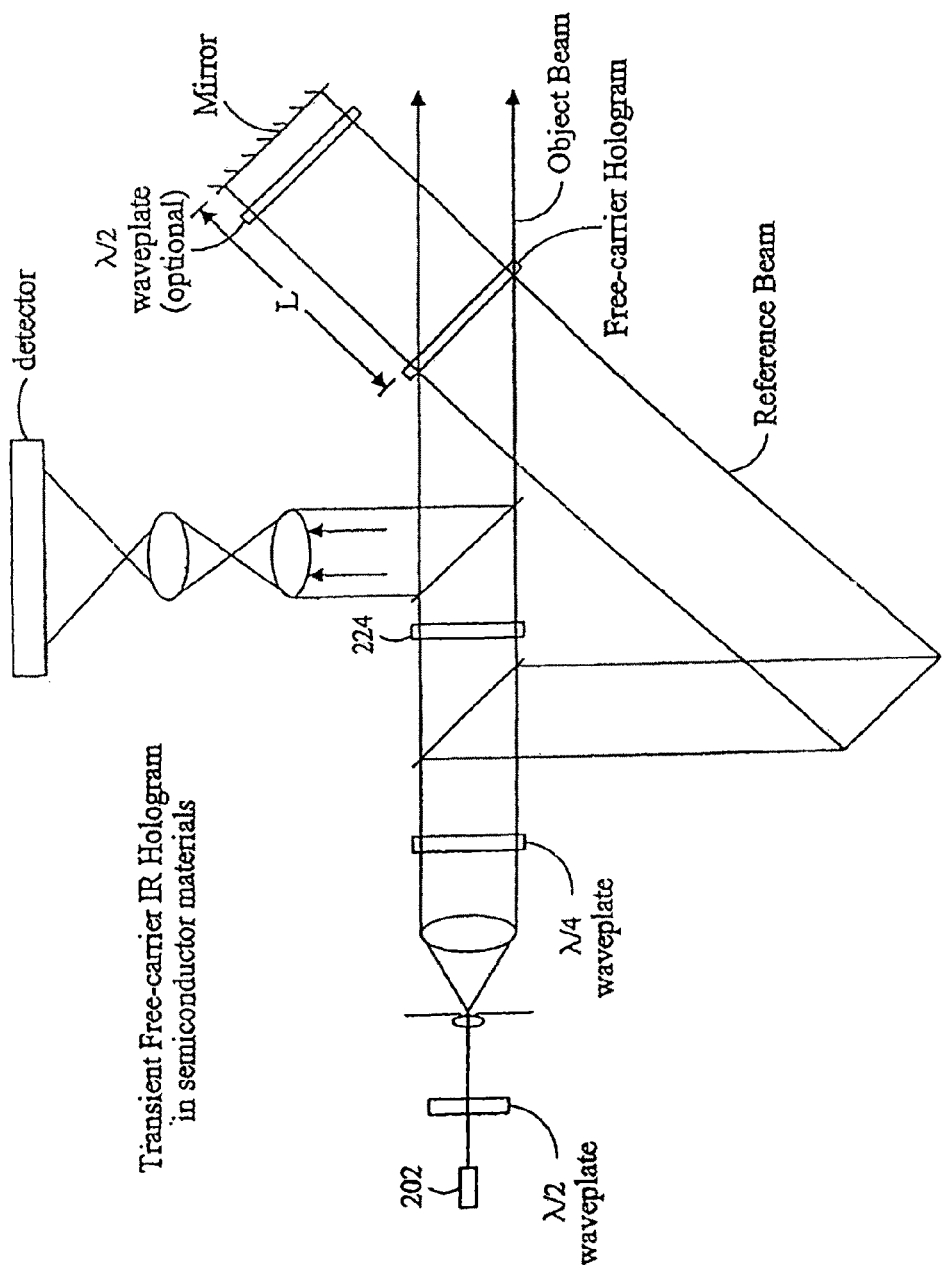
Figure 31:
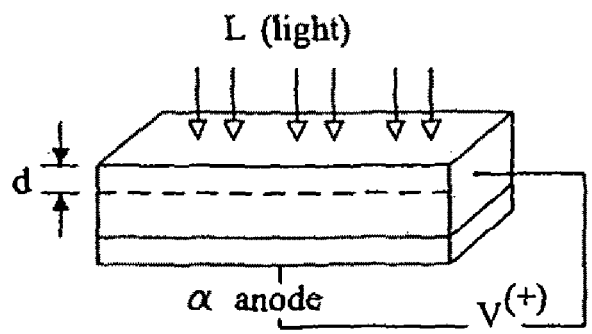
Figure 32:
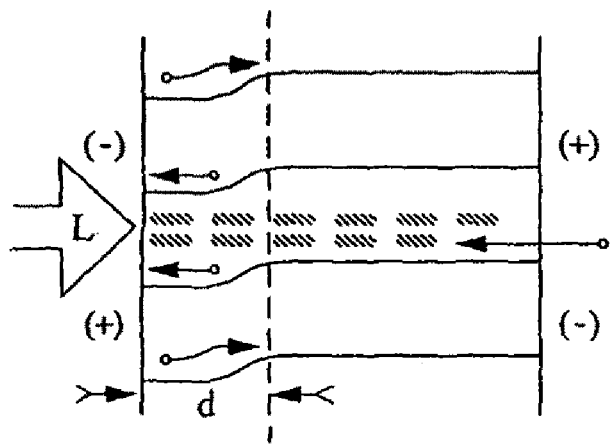
Figure 33:
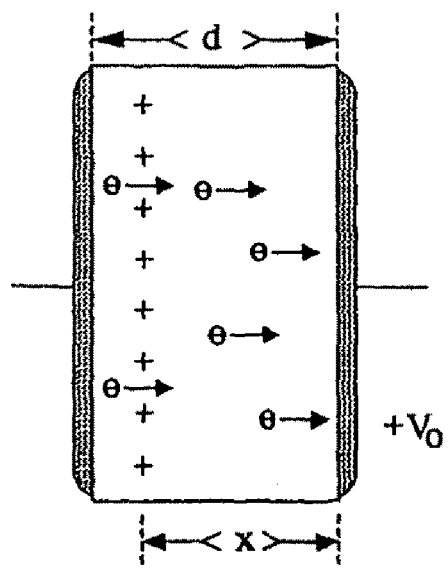
Figure 34:
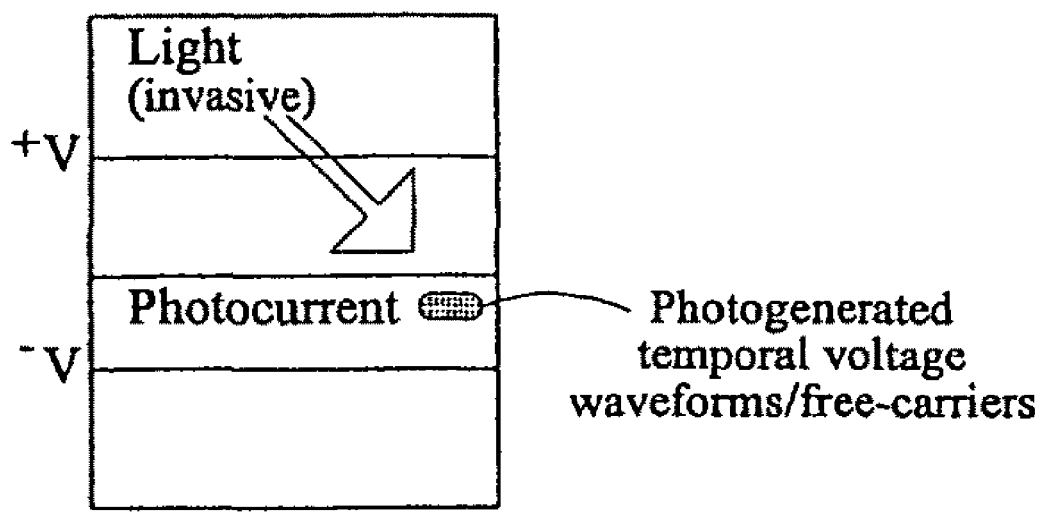
Figure 35:
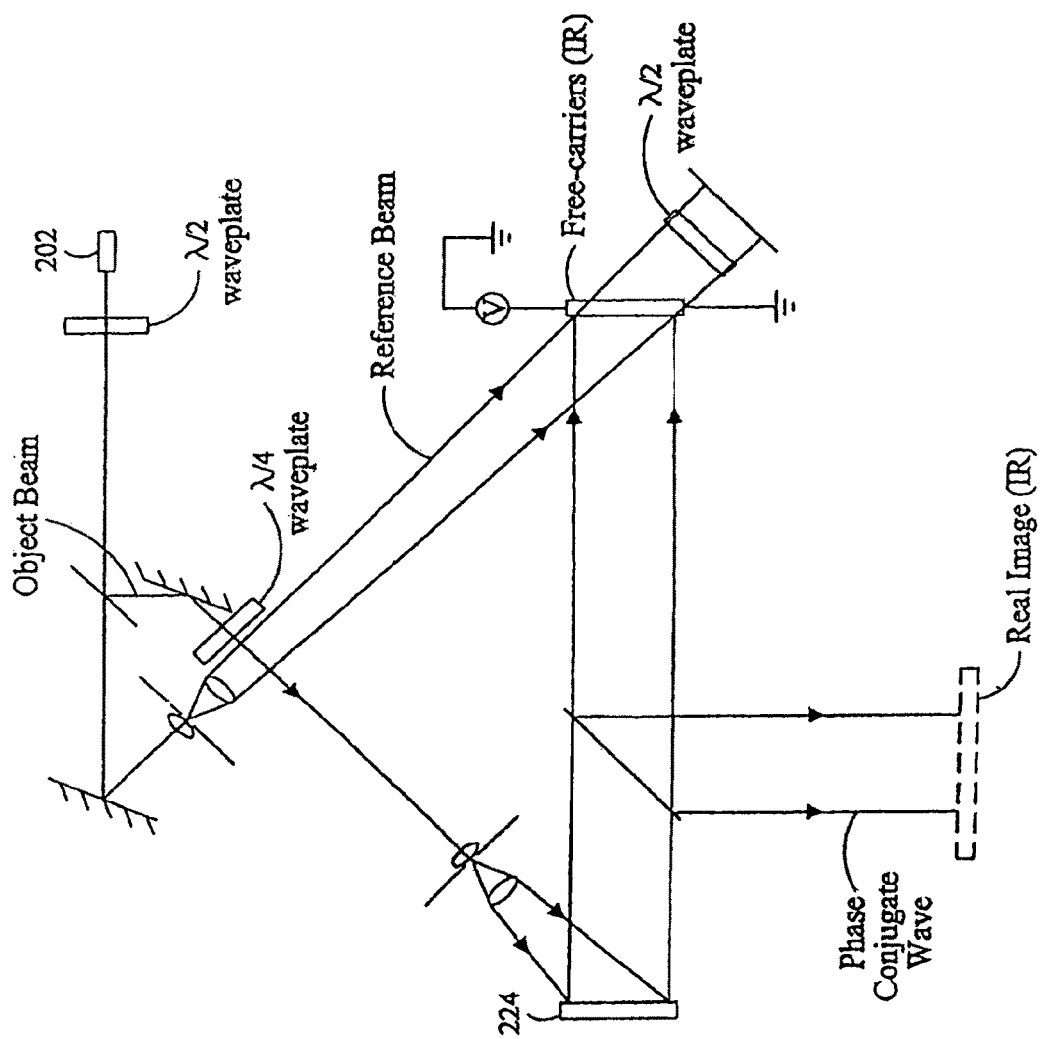
Figure 36:
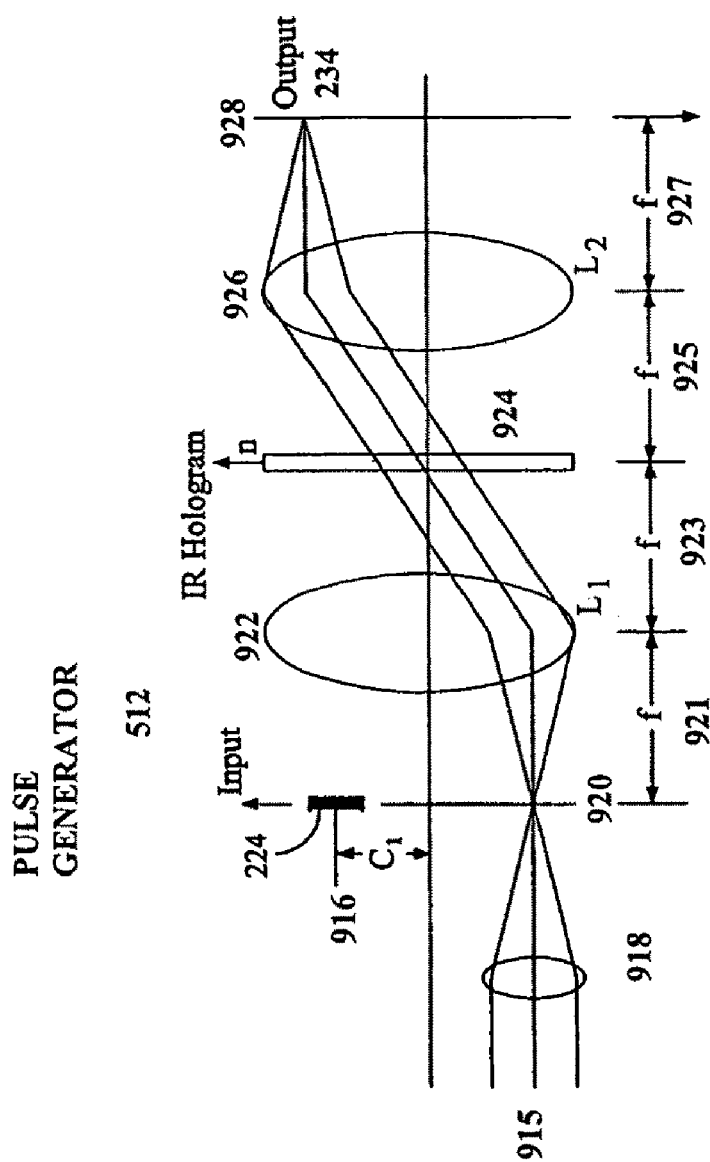
Figure 37A:
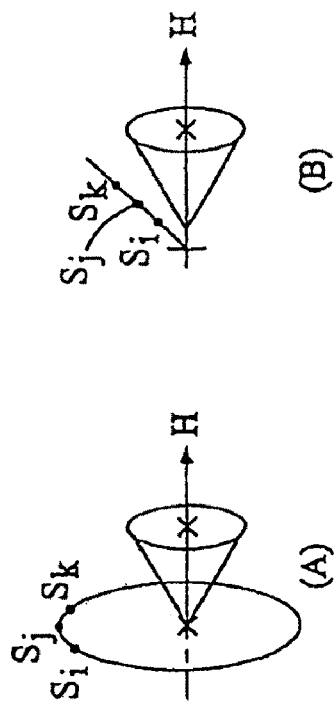
Figure 37B:
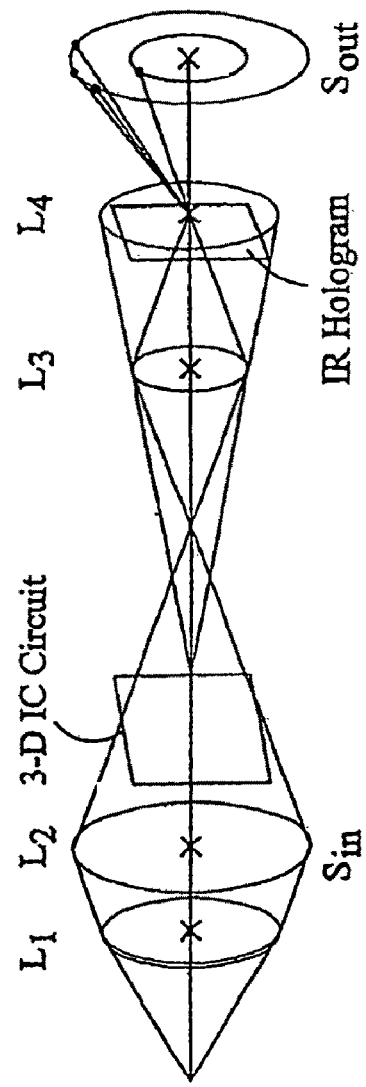
Figure 38:
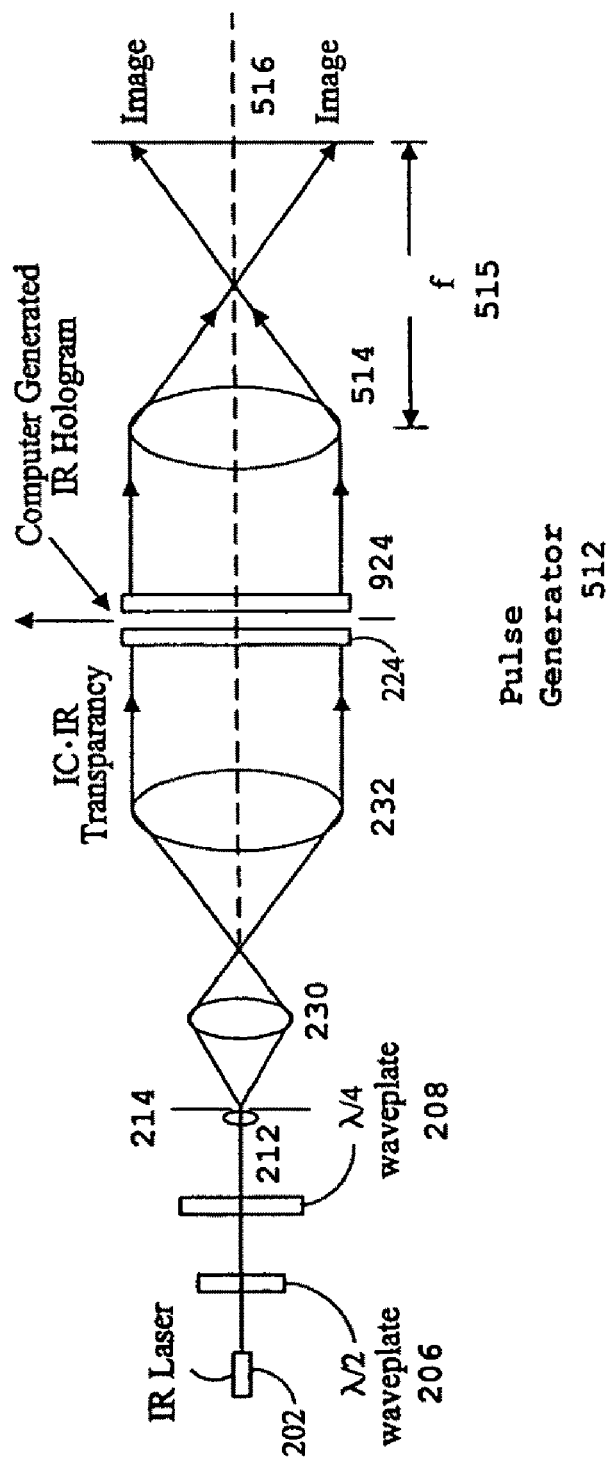
Figure 39:
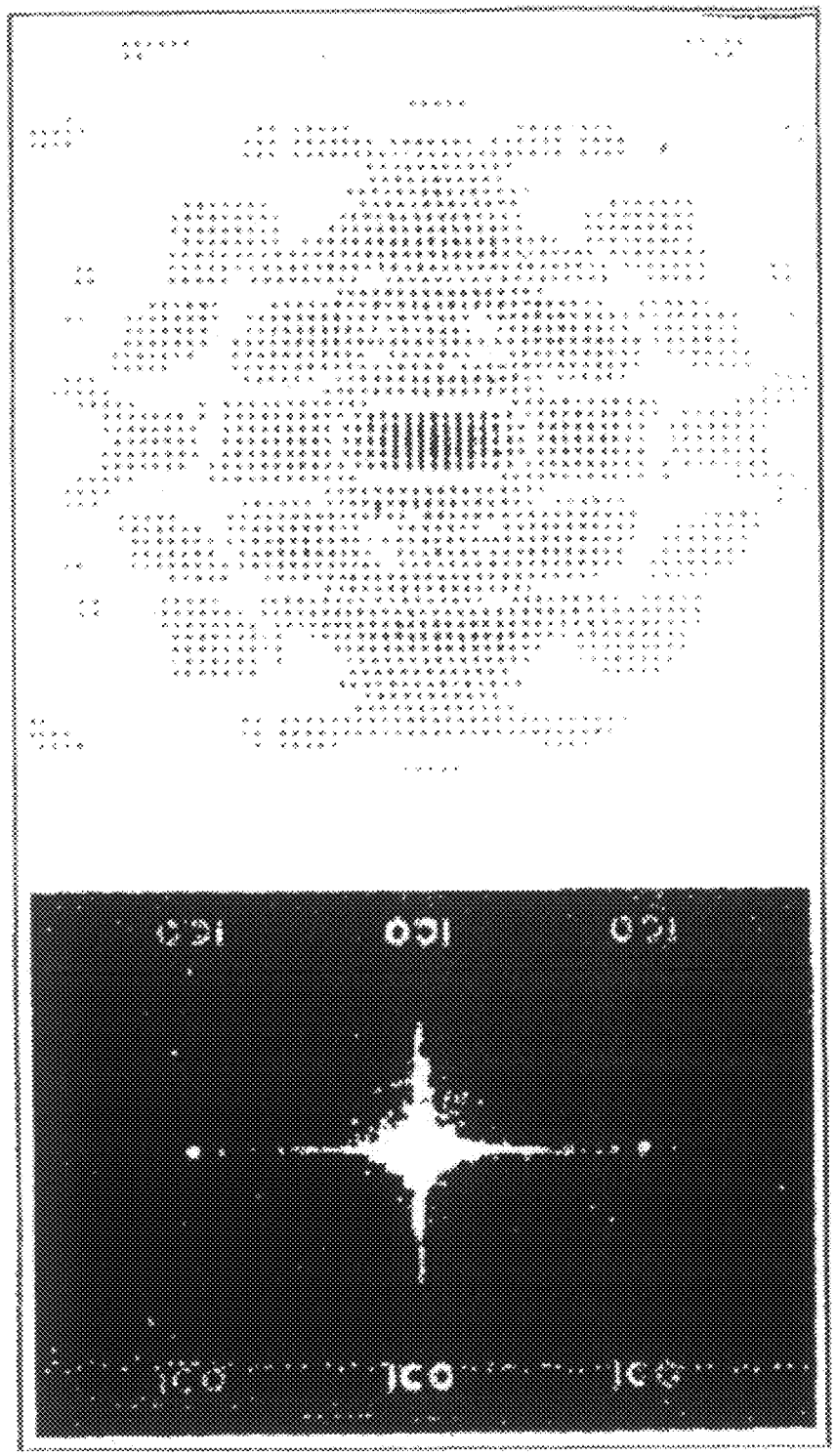
Figure 40A:
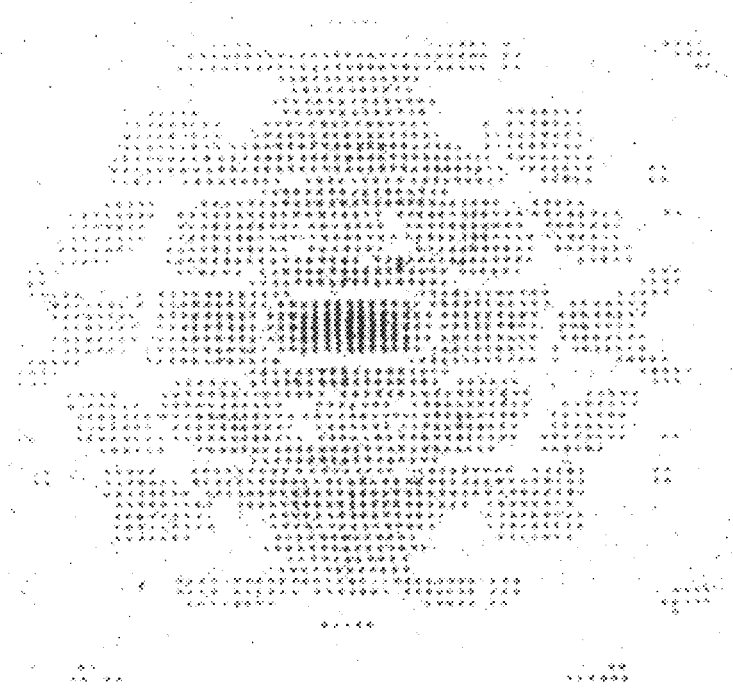
Figure 40B:
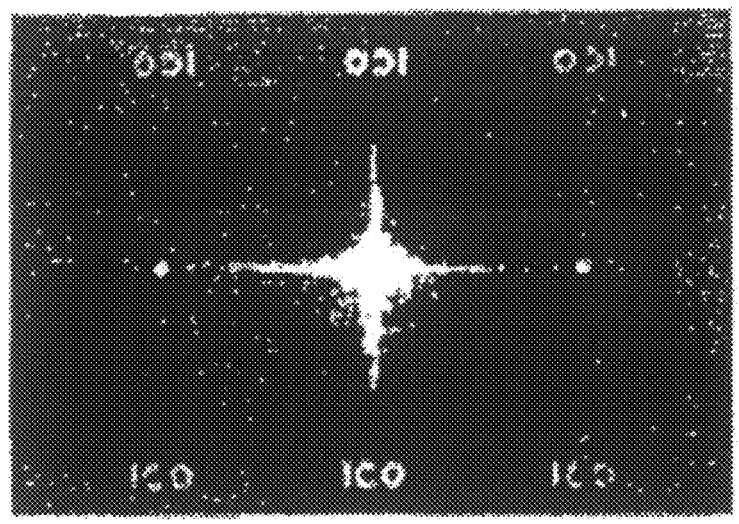
Figure 40C:
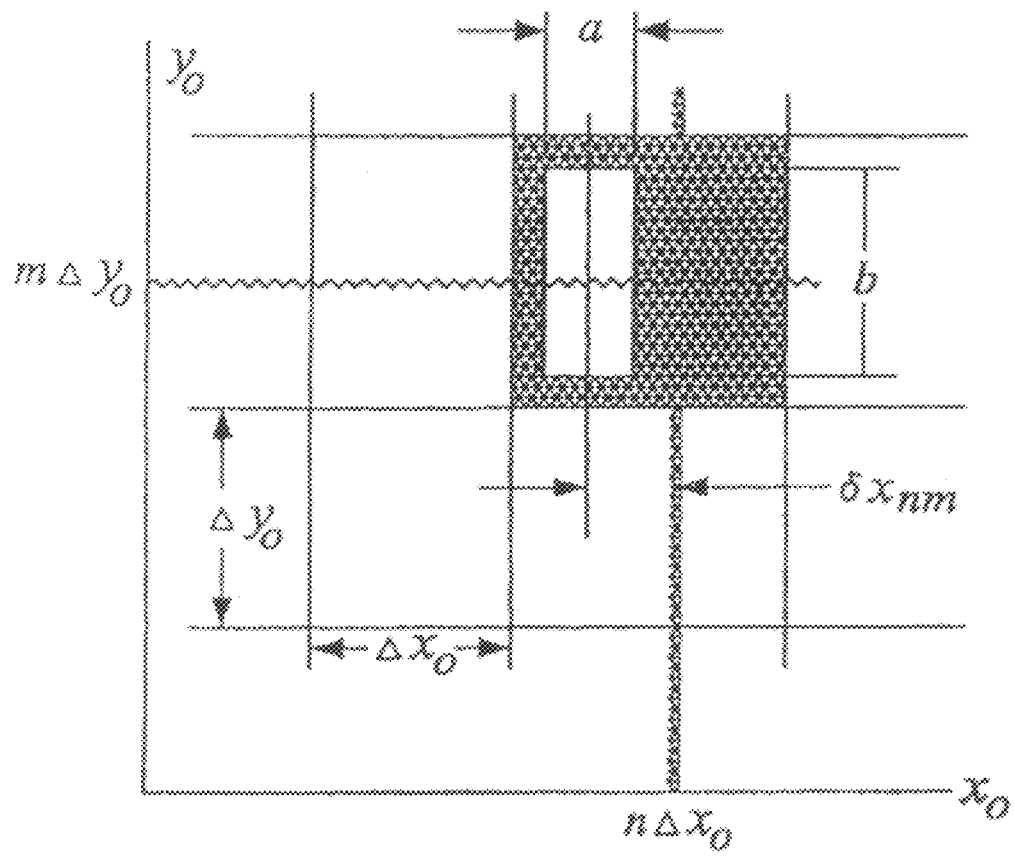
Figure 41A:
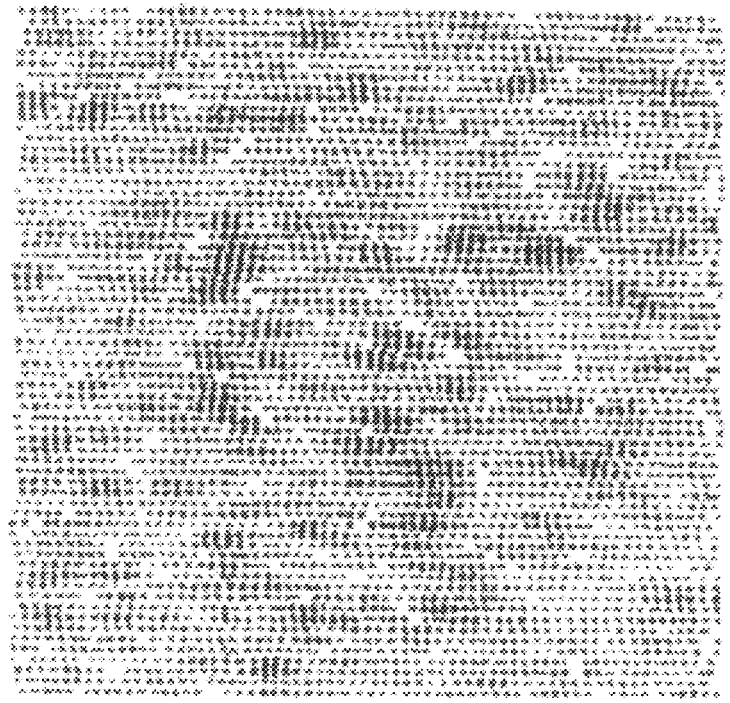
Figure 41B:
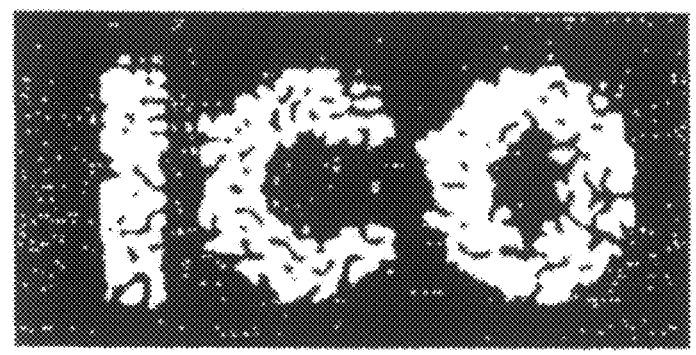
Figure 42:
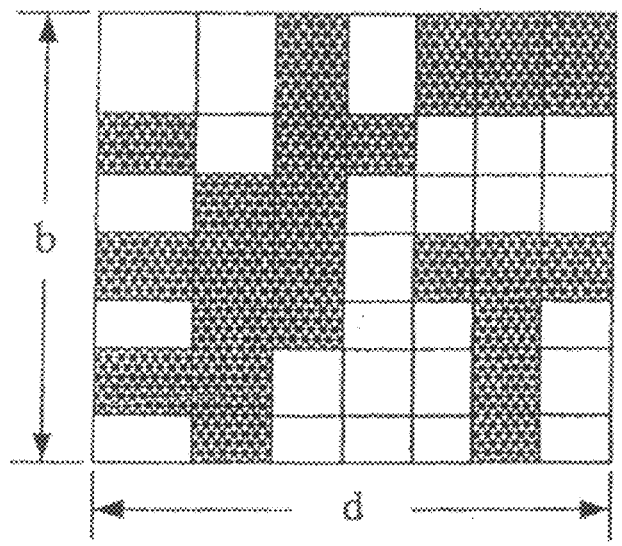
Figure 43:
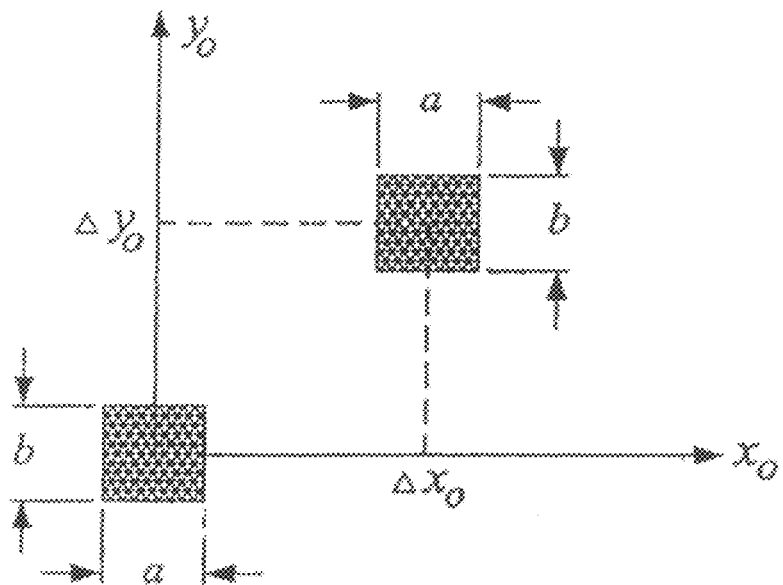

FIG. 12 illustrates a transmissive based system.
FIG. 13 illustrates an interferometric tester.
FIGS. 14A-C illustrates testers.
FIGS. 15A and 15B illustrate testers.
FIG. 16 illustrates thermoplastic recording.
FIGS. 16A and 16B illustrate interferograms.
FIG. 17 illustrates interference fringes.
FIG. 18 illustrates interference fringes.
FIG. 19 illustrates interference fringes.
FIG. 20 illustrates a recording structure.
FIG. 21 illustrates a recording structure.
FIG. 22 illustrates a recording structure.
FIG. 23 illustrates a recording structure.
FIG. 24 illustrates a recording structure.
FIG. 25 illustrates a recording structure.
FIG. 26 illustrates a recording structure.
FIG. 27 illustrates a recording structure.
FIG. 28 illustrates a recording structure.
FIG. 29 illustrates a recording structure.
FIG. 30 illustrates a testing apparatus.
FIG. 31 illustrates a photo-conductor.
FIG. 32 illustrates a barrier.
FIG. 33 illustrates a photo-conducting crystal.
FIG. 34 illustrates photo-currents.
FIG. 35 illustrates a testing apparatus.
FIG. 36 illustrates a testing apparatus.
FIGS. 37A and 37B illustrate system components.
FIG. 38 illustrates a testing apparatus.
FIG. 39 illustrates interference patterns.
FIGS. 40A and 40B illustrate interference patterns.
FIG. 40C illustrates a setup.
FIGS. 41A and 41B illustrate test output.
FIG. 42 illustrates interference output.
FIG. 43 illustrates diffraction.
FIG. 44 illustrates a test setup.

DETAILED DESCRIPTION OF THE INVENTION

The present inventor came to the realization that the single point non-invasive probing technique of semiconductor materials could be enhanced if both the phase and amplitude, or polarization and amplitude properties of light transmitted thorough or reflected off of a semiconductor material could be recorded or otherwise preserved in some manner. Semiconductor materials generally exhibit electro-optic (generally ⅗ semiconductor materials) or photo-refractive effects (generally silicon based expitaxal circuits), which can be made to become birefringent by the application of an electric field, either as such or as embodied in electromagnetic radiation. Also, surface reflection and/or transmission probing of semiconductor materials, such as for example, GaAs, germanium or silicon, can be modulated by for example, cathode reflections modulation (E-beam), an electric field, voltage, heat, pressure, x-ray radiation, magnetic fields, and photo injection. The present inventor then came to the realization that if an object in a state in which it is not birefringent, but such birefringence can then be brought about in some manner such as electrical or electromagnetic techniques, the nature of the birefringence so introduced can be studied to determine characteristics of the material. Upon further consideration the present inventor then came to the realization that holographic techniques can record both the phase and amplitude, or the polarization and amplitude properties of light, such as that passing through or reflected off a semiconductor material, which can then be reconstructed. Holographic techniques provide the ability to examine materials using a wave front that is greater than, and typically substantially greater than, the physical focal point of the wavelength of the light. Further, the present inventor came to the realization that using field based interference patterns detail regarding the structure and operating characteristics of semiconductor devices considerably smaller than the physical focal point of the applied light or applied signal may be determined. Likewise, obtaining such holographic information will enable the development of other devices, such as for example, lenses, filters, and optical devices, which are based on, at least in part, the operating characteristics of semiconductors.

A hologram is created by a coherent light beam being transmitted through or reflected from an object onto a recording medium, which at the same time the original beam is also directed onto that recording medium as a reference beam. Various characteristics of the resultant transmitted or reflected beam, herein called the "object wave," are recorded in the resultant interference pattern between the object wave and the reference beam, i.e., as a hologram. These characteristics can later be observed by illumination of the hologram by that reference beam alone. That is to say, inasmuch as the phases or polarizations of the reference beam and the object wave have been recorded in that interference pattern along with their intensities, the wave produced by illuminating the hologram with the reference beam is essentially an exact replica of the object wave. Those characteristics are in part a consequence of the physical structure (i.e., "appearance") of the illuminated object, hence the wave so observed appears as a three dimensional image of that object. Optical Holography, Second Edition, by P. Hariharan, 1996 describes some general optical holographic techniques; and is incorporated by reference herein in its totality.

The present inventor also realized that particular semiconductor materials are generally transparent to light of particular wavelengths so that the light may freely pass through and reflect back though all or a portion of the semiconductor, or otherwise pass through the semiconductor, substantially "unaffected" when the semiconductor is not stressed, such as by no applied voltage, not subject to a electromagnetic (e.g. radio wave) field or signal, magnetic field, x-ray radiation, gravity wave, sub-atomic particle radiation, pressure, temperature, photo-generated carriers, subject to electron- or ion-beam devices; bioelectric, or chemical. Likewise, when the semiconductor material, such as one including an integrated circuit, is stressed by applying a voltage therein by energizing a circuit fabricated therein, or by applying a different energy level, the same light will reflect or otherwise pass through the semiconductor material, while being affected by the changes imposed by the applied voltage, thereby resulting in a different pattern. The stressed and unstressed states may be recorded as different holographic images. In addition, it is within the scope of the present invention to make a comparison between two different stressed states. The two holographic images may then be compared to one another to determine the actual operating characteristics within the semiconductor material. In addition, by its nature, holographic imaging techniques record a significant spatial region much larger than a single wavelength simultaneously which is important for characterizing regions of the semiconductor material. For example, the operational characteristics of two different regions may be interrelated which is unobtainable using techniques limited to a wavelength in "spot size." The present inventor's realization that the application of holographic techniques for the testing of semiconductor devices, was only after at least the culmination of the aforementioned realizations.

Of particular interest is the "real-time" characterization of operating characteristics of integrated circuits where such birefringence is introduced by the electro-optic effect, i.e., the imposition of a voltage onto the object (as in the ordinary operation of the integrated circuit) causes birefringence therein. Birefringence in ⅗ materials generally imposes a rotation of the polarization which is primarily a polarization and/or amplitude shift. Voltage induced changes in silicon materials generally imposes a refractive index shift which is primarily a phase and/or amplitude shift. Both of these occurrences are detectable, such as for example, with a polarized beam, a polarization recording hologram, an amplitude hologram, and/or a phase hologram. In other words, upon application of an electric field the material, such as GaAs or silicon, introduces an anisotropy and the ordinary complex refractive index n* of the material is decomposed into $n_o^*$ and $n_e^*$ components. Another technique applicable to appropriate substrates whether or not any operational voltages are also applied thereto, lies in utilization of the photo-refraction effect, wherein electromagnetic radiation of a required intensity is illuminated onto the substrate, and a birefringence or change in birefringence is then brought about. Inasmuch as semiconductor and like materials are generally characterized by a wavelength threshold below which photo-refraction will occur, but above which no photo-refraction takes place, this latter mode of operation employs electromagnetic radiation of differing wavelengths, first to bring about a desired photo-refractive effect, and then secondly to analyze the effect so brought about.

FIG. 4 shows a holographic apparatus 200 comprising a laser 202 such as a frequency stabilized infrared filtered He/Ne or NG/YAG lasers with a filter or the like, from which is derived a plane wave of linearly polarized light 204. The optical path thus defined may optionally include a selected first neutral density filter 206 that will permit convenient adjustment of the laser power level. The beam 204 from the laser 202 (or from the filter 206, if used) may then be passed into a first broad band polarization rotator 208 for purposes of placing the plane of polarization of the laser beam at a desired orientation. Whether or not the polarization rotator 208 is used, the beam may then be passed through one or more first waveplates 210 that may optionally be used to establish a desired degree of ellipticity in the beam. In any case, the resultant beam then may pass through a first objective lens 212 and a first spatial filter 214 to impinge on a first converging lens 216 that will then yield an expanded plane wave 218. The converging lens 216 may be an achromatic type which is diffraction limited at 1.03 μm (the filtered infrared He/Ne wavelength) for optimal 1:1 imaging. Alternatively, first objective lens 212, first spatial filter 214, and first converging lens 216 may be incorporated together within a laser collimator, or in any such similar device.

Plane wave 218 is then incident on a beam splitter 220 that provides two reference beams: first reference beam 222a that is incident on test object (TO) 224, a second reference beam 222b that will ultimately impinge on recording device (RD) 226. Beam splitter 220 may, for example, be a pellicle beam splitter. For RD 226, either infrared photographic film, an infrared sensitive electronic device, such as an infrared CCD, or an infrared thermo-plastic recorder, or any other similar device may be used. As a result of first reference beam 222a being reflected back from the surface of TO 224, a object beam 228 will pass back onto beam splitter 220 so as to be reflected towards and ultimately impinge upon RD 226. Since both a reference beam (second reference beam 222b) and an object beam (object beam 228) that derive from a common, preferably coherent source (laser 202) are simultaneously incident on the recording device 226, the conditions for forming a polarization preserving hologram are present.

Consequently, FIG. 4 is also seen to include a pair of lenses 230, 232, which are meant to provide a generic indication of a beam conditioning element that may be any one of many types that are well known in the art, and by which the precise degree of focus, convergence or divergence, or other aspects of the beams that are to impinge on the RD 226 can be adjusted. It is to be understood that, such beam conditioning is optional. For example, in a fixed system the reference and object beams are passed through identical optical components and their conditioning or lack thereof are the same, i.e., in a first approximation the differences between the two beams would derive solely from the effects of the first reference beam 222, having been reflected from the TO 224 so as to yield the object beam 228. More exactly, the foregoing statement assumes that the first and the second reference beams 222a, 222b are identical, which may not be the case because of differing aberrations or the like being present in the beam splitter 220 as to the first and the second reference beams 222a, 222b. Therefore, the elimination of effects arising from sources other than from object beam 228 itself can occur with reference to comparisons of two or more such holograms that have been recorded under identical circumstances.

To permit such a procedure, the in line apparatus of FIG. 5 may be modified with respect to the nature of the recording device in order to produce additional holograms. Since that modification may itself introduce differences in the precise conditions of measurement for reasons other than any optical aberrations in the beam splitter 220, the lenses 230, 232 (or, more exactly, any particular beam conditioning elements that may be employed for such purpose) are to be used to condition the beams passing therethrough so as to duplicate, in the process of recording additional holograms, the conditions of the beams under which a first hologram was recorded. For purposes of the present invention, and in taking an initial hologram, the TO 224 may be any suitable to which the characteristics are desired, such as for example, a functional IC on which the surface has been exposed (i.e., potting is not present) but to which no voltages or other external stimuli have been applied, a semiconductor material such as a wafer taken from or existent within a wafer manufacturing fine, a semiconductor wafer taken from or existent within a chip manufacturing line at any of various stages of manufacture (deposition, etching, metallization, etc.) or the like, the RD 226 may be taken to be any suitable material for recording a holographic image, such as for example, an infrared photographic film or an infrared thermoplastic plate onto which the initial hologram is recorded in the graphic film or thermoplastic plate onto which the initial hologram is recorded. The recorded infrared film 226 subsequently may be viewed by various angles to resolve three dimensional features and details. In this manner, among other techniques, the voltage pattern of the device may be viewed in a three dimensional manner. Holographic image reconstruction from a voltage pattern or a microwave signal in a device recorded at 1.15 μm may be obtained using a shorter wavelength such as 0.633 μm from recorded films or thermoplastics. This is important when multilevel electronic circuit layout techniques are used so that the voltages may be determined within the bulk of the material.

FIG. 5 shows an alternative embodiment, with like elements being indicated by like numerals but in which, among other changes, the RD 226 has been replaced by the RD 234, which is a conventional infrared CCD camera. Since constructive and destructive interference between coherent waves occur with respect to that electromagnetic radiation itself, without regard to the nature of arty device onto which the resultant interference wave may be recorded, the hologram (which in many cases is considered an interferogram) may be recorded by an infrared CCD camera as well as by infrared photographic film(s) or an infrared thermoplastic recorder, described later. Consequently, upon extracting the infrared CCD image in the usual manner, one acquires a digital representation of a hologram as derived from interference between the particular reference wave and object waves that were incident upon the infrared CCD camera during the time for which the image was so extracted. Unfortunately, CCD cameras typically have limited spatial and/or temporal resolution.

As to the case in which the TO 224 is a functional but not energized IC, a first hologram, can be recorded therefrom using the apparatus as shown in FIG. 5, i.e., the hologram is recorded onto an infrared recording device, such as for example either onto infrared photographic film or within an infrared thermoplastic plate. A second hologram can then be made of that same TO 224 while either being energized with a DC or an AC voltage or illuminated with light of a wavelength shorter than the characteristic threshold wavelength for the material so that a change is imposed therein. In the case in which the TO 224 is a semi-conductor wafer, a first hologram may similarly be recorded and then a second hologram may be recorded while illuminating the wafer in the manner just stated. In either case, any (birefringence) effects brought about either by the electro-optic effect or by the photorefractive effect will then be recorded. A comparison of the two holograms, both taken from one or the other instance of the TO 224, and advantageously by illuminating one hologram through the hologram taken of the other, will isolate such electro-optically or photorefractively produced birefringence. Alternatively, the film 226 may be partially exposed to the unstressed image of the TO 224 and then subsequently partially exposed to the voltage induced stressed image of the TO 224 (or vice versa) to provide a holographic image with interference patterns recorded. The film 226 may be subsequently removed and analyzed.

Alternatively, a second hologram can be recorded using the apparatus in the in line configuration shown in FIG. 5, e.g., using an infrared CCD camera 234 as the recording device. However, attempts to compare a hologram taken from CCD camera 234 with another hologram that was recorded by any other means introduces inevitable experimental error. However, the comparison of two separately obtained holograms, such as from one or more infrared CCD's or other infrared recording devices, is within the scope of the present invention. If a first hologram is recorded using film 226, and then a second hologram is recorded using CCD camera 234, the two might in principle be compared, e.g., a print might be made from each of the recording mechanisms (i.e., film 226 and camera 234), and their differences might then be explored, for example, by using a beam from laser 202. However, making such prints introduces several experimental artifacts, including such factors as: (1) differences in the spectral sensitivity of the film and the CCD camera; (2) differences in the mechanics of printing from the two different media, such as a photographic film or from digital data; (3) differences in the precise experimental configuration at the time the holograms were made, e.g., replacement of film 226 with camera 234 could not have been accomplished with total accuracy; (4) the optical line resolution of the infrared film and camera based devices. As to the differences arising from a printing process, the photographic film might be developed and scanned, and thereafter treated as digital data, but the first factor involving the different spectral sensitivity and the scanning process itself would again present artificial differences between the two holograms that did not arise from the TO 224. In lieu of the foregoing processes, it is more typical to use a first hologram as a "mask" through which the reference beam is transmitted while making the second hologram (thus showing differences), but even in this case the film may need to be removed, developed and then replaced, so the placement errors just mentioned may still be present.

One of the sources of error as just noted is removed when recording a first hologram onto an infrared thermoplastic plate. For example, if a holographic recorder is used in conjunction with an installed thermoplastic plate, after exposure the thermoplastic plate is developed in situ, i.e., the plate is not removed from the optical path for such purposes. The error brought about by removing the recording medium for development and then replacing that medium back into the experimental apparatus is thus eliminated. Also; holographic image reconstruction from a voltage pattern or a microwave signal in the thermoplastic device recorded at a wavelength of 1:15 µm may be obtained using a shorter wavelength such as 0.633 µm by increasing the image by a factor of two. Also, differences in the spectral sensitivity and optical resolution (lines per unit of length) of the thermoplastic plate and CCD camera 234 remain as a significant source of experimental error.

A CCD camera 234 may be used as the sole recording device, whereby the first and indeed a multiplicity of subsequent holograms can be recorded. If the recording rate of the CCD camera 234 is slower than the rates of operation of an IC itself, timed optical pulses may be used for sampling the device under test. An additional advantage in using only the CCD camera for recording holograms is that the "reference" hologram, i.e., the hologram recorded from the TO 224 (either as an IC or as a semiconductor wafer) at a time that no voltages or birefringence-inducing laser light was applied thereto, will be recorded digitally as well, and comparisons between the reference and subsequent holograms can be made by means other than within the experimental apparatus itself, i.e., by ordinary Digital Signal Processing (DSP).

For the purpose of processing such a data stream, FIG. 6 also includes an analyzer 236 connected to the CCD camera 234, and also a monitor 238 connected to analyzer 236. Inasmuch as the laser source in the present embodiment is preferably a pulsed CW NG/YAG laser with a filter, the data to be analyzed may be generated by triggering the recording of CCD images in synchrony with the imposition of particular voltage data onto the TO 224, which may be an IC or possibly an entire printed circuit. As noted previously, the Springer patent describes the use of a digital "kernel" comprising a predetermined test program together with the digital data to be employed by that program, both of which are stored in ROM. The Springer apparatus then uses voltage probes and the like applied to various circuit nodes to test circuit performance in a "manual" fashion; the present invention, of course, centers on an "automatic" process of testing an entire IC, circuit board or, as will be shown below, a semiconductor wafer at any desired stage of manufacture. FIG. 5 thus shows a device driver 240 which connects to the TO 224 through a bus 242 and carries voltage data 244 thereto, while a trigger line 246 which connects from the device driver 240 to CCD camera 234 conveys a trigger signal 248 thereto, the relative timing by which voltage data 244 and a trigger signal 248 are so transmitted being established such that CCD camera 234 records one or more images at a time that the voltage data 244 have been applied to the TO 224. Within the limits of the operational characteristics of the CCD camera 234, the dynamical processes by which the voltage data 244 have particular effects within the TO 224 (e.g., the turning on or off of a transistor, a voltage pulse propagating down a bus, etc.) can be traced by transmitting the trigger signals 248 to the CCD camera 234 at some multiple of the frequency at which the voltage signals 244 are sent to the TO 224, so as to evaluate such parameters as transistor rise or fall time. It is to be understood that other recording devices 234 may likewise be used.

In order to illustrate the uses of the aforesaid components and those to be describe hereinafter, it is appropriate to outline in greater detail the characteristics of an exemplary representative TO 224, which for purposes of illustration to is taken be a wafer of GaAs that has been industrially prepared as a substrate for subsequent IC manufacture. GaAs is a direct-gap (but nearly indirect-gap) semiconductor having the zinc blended structure with a lattice constant of 0:5653 nm, i.e., it has the face-centered cubic structure but without inversion symmetry, and thus belongs to the point group Td. The static dielectric constant of Gas is 12, and the exciton binding energy $E_B$ is 4.2 meV.

$T_d$ symmetry defines an isotropic material that at any selected wavelength exhibits but a single refractive index n. In order to observe birefringent effects in GaAs, therefore, it is necessary to induce the same, either by the electro-optic effect or by the photorefractive effect. The manner in which such effects can be measured most productively can be related to the manner in the birefringence so produced relates to the GgAs crystal structure. That is, changes in the optical properties of the GaAs crystal that render it birefringent may be treated in terms of that crystal no longer being cubic, i.e., any crystal that exhibits birefringence should have one or more unique optic axes and hence, at least with respect to optical refraction, no longer exhibits cubic symmetry.

Figure 6A:
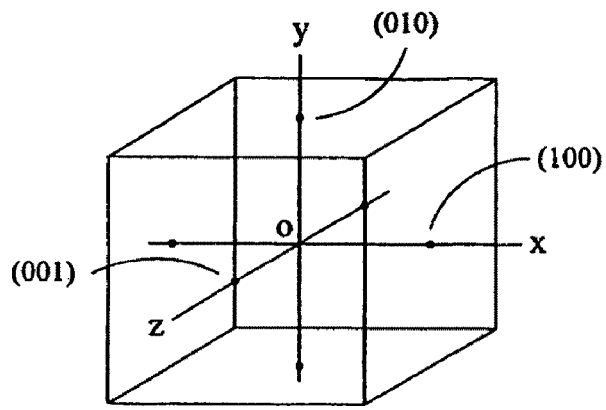

For purposes of future reference, the standard definitions of the planes in a cubic crystal are shown in FIG. 6A, wherein a face-centered cubic crystal is superimposed on a coordinate system with the origin at the center of the crystal, the (100) plane cuts the x axis, the (010) plane cuts the y-axis, and the (001) plane cuts the z axis. The GaAs wafer is cleaved along one such plane, but since these planes are physically identical, for convenience the surface plane of a GaAs crystal (and of the ICs formed therefrom) is usually referred to as the (001) plane, and the normal to that plane is the z axis. The x and y axes thus lie orthogonally within the (001) plane, and one issue that arises in the course of manufacturing ICs from such a wafer, and which can be resolved using the present invention, lies in determining the location of those x and y axes so as to permit the marking of the wafer to indicate that orientation for purposes of later IC fabrication.

Figure 6B:
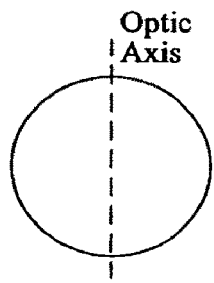
Figure 6C:
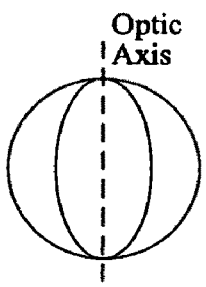
Figure 6D:
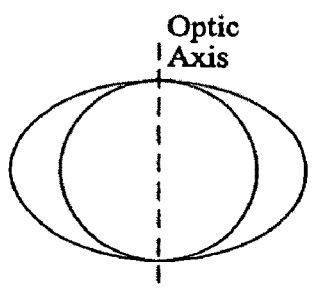
Figure 6E:
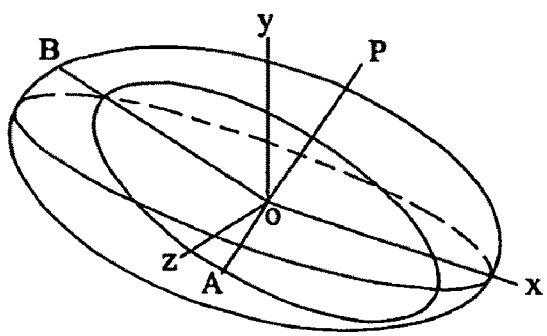

FIG. 6B shows the refractive index indicatrix for an isotropic (i.e., cubic) crystal such as silicon based materials, which is seen to have the form of a sphere, and from which it can be seen that the refractive index of the material has the same value in all directions (i.e., any line through the center of the indicatrix has the same radius as any other line through that center). Upon application of an external electric field, or of light having sufficient photon energy to cause photo refraction, the material will become birefringent. For purposes of discussion, the refractive index indicatrix of both positive and negative uniaxial crystals that have two refractive indexes, i.e., for the ordinary ($n_o$) and the extraordinary ray ($n_e$), are shown in FIGS. 6C and 6D. In effect, birefringence induced by either of the aforesaid methods converts the crystal structure into one that is no longer of the cubic class. It thus becomes necessary to identify the classes that may so be formed, and the means for forming them. For that purpose, FIG. 6E shows the indicatrix and resultant wave propagation for a generalized wave normal, which may be taken as a light wave that is incident on the crystal at some arbitrary angle.

The symmetry aspects of applying external forces to crystals have been discussed by J. F. Nye in Physical Properties of Crystals (Clarendon Press, Oxford, 1972), pp. 235-259, and especially pp. 245-246. A principal characteristic of such force applications is that a force that has one or more symmetry elements in common with those of the crystal to which the force is applied will be effective, while any symmetry elements of that force that is do not likewise characterize the crystal will have no effect thereon. At first glance, this would not seem to be particularly important as to GaAs which, being a cubic crystal has the maximum number of symmetry elements. However, inasmuch as the result of applying a force having a particular symmetry element is exhibited by way of altered features of the crystal that share that particular symmetry element, the precise nature of the effect brought about will depend upon which symmetry elements characterized the applied force. For example, while any voltage of sufficient magnitude will cause birefringence in a GaAs crystal, but precisely what kind of birefringence that will be and how it would appear if examined holographically will depend upon the orientation of that electric field relative to the crystal axes.

An electric field that is normal to the exposed (001) face of a GaAs crystal would have the effect of defining the corresponding z axis as the optic axis. An electric field that is tangential to that (001) face will define an optic axis lying somewhere in that face, i.e., either coincident with one or the other of the x and y axes or lying at some angle thereto. The indicatrix for the resultant uniaxial "structure," which will then determine the directions of propagation of the transmitted rays that would result from imposing an incident beam of light thereon, will have a corresponding orientation relative to the x and y axes. Because of the induced birefringence, there will be two rays, linearly polarized at right angles to each other, that transmit through the uniaxial crystal so formed, and by conservation principles the corresponding rays that reflect therefrom will likewise be so polarized. As will be seen below, this combination of events lends itself to direct determination by the present invention, since the apparatus that embodies the invention preserves not only the amplitude and phase of the reflected radiation as in a normal hologram, but also the polarization.

FIG. 7 depicts an in line holographic apparatus 300 which analyzes semi-conductor materials to which no voltages have been applied, but onto which a laser beam can be transmitted so as to bring about induced birefringence, as the source of holographically detectable refractive index or polarization changes. Holographic apparatus 300 differs from holographic apparatus 200 in including therein a first activating laser module 350, which centers on the use of a higher energy (and preferably of a higher photovoltaic generating power) laser 352, which may, e.g., comprise an argon ion laser of a ultraviolet laser. Laser beam 354 emitting therefrom transmits through a second objective lens 356, a second spatial filter 358 and a second divergent lens 360 to a the broader beam 362 that is then incident on the TO 224. Deriving as it does from an argon ion laser, the laser beam 354 may have a wavelength of 458 nm, corresponding to a photon energy of 6.946 ev, which will suffice for the generation of refractive index changes therein for materials such as GaAs that have a lower threshold energy for photorefraction. For that purpose, the pulse generator 264 transmits the pulse 266 over a line 368 so as to generate a pulse of light from the laser 352, and one or more appropriately timed triggers 370 are sent over a trigger line 372 to the CCD camera 234 (or other recording device) to acquire one or more images of the TO 224 under the condition, as just indicated, that the laser beam 362 is incident thereon. This process may be referred to as stroboscopic holographic interferometry where a hologram of a vibrating object is recorded using a sequence of pulses that are triggered at times $\Delta t_1$ and $\Delta t_2$ during the vibration cycle. The hologram is equivalent to a double exposure hologram recorded while the object was in these two states of deformation, and the fringes have unit visibility irrespective of the vibrating amplitude. The phase of the vibration can be determined from a series of holograms made with different values of $\Delta t_2$, keeping $\Delta t_1$ fixed; alternatively, real-time observations can be made. In essence, the pulses are preferably timed to the operation of the test object.

With regard to another aspect of holographic apparatus 300 (and of all variations thereof described herein), the ability of holographic apparatus 300 and variations thereof to accomplish measurements of an entire wafer (or portion thereof) or the like at once provides yet another advantage. That is, region 274 shown in FIG. 7, which contains only the TO 224, interacts with the rest of holographic apparatus 300 only by way of light beams, i.e., by the first reference beam 222a, the object beam 228, and the laser beam 362. Region 274 may then constitute a clean room in which the manufacture of wafers, or the ICs to be derived therefrom, is actually carried out. Holographic apparatus 300 and variations thereof thus make possible a complete regime of quality control in IC manufacture, at every stage from the initial wafer to the point at which the wafer is diced into individual ICs. In the discussion which follows, it may then be assumed that the TO 224 under discussion is located within such a clean room, and the testing apparatus is located in a separate room, connected thereto only through a transparent medium (e.g., glass) which precludes passage of contaminants but yet allows passage of the first reference beam 222a, the object beam 228, and the laser beam 262 or variations thereof. As in the case of other experimental conditions that might affect the precise nature of the holograms obtained, any variations therein that derive from the presence of such a medium within the optical path will be eliminated in the process of comparing holograms that were taken under identical conditions.

Different embodiments of the invention as described also differ in the nature of the elements used to transmit appropriately structured laser beams onto the TO 224, and for that purpose the second laser module 280 is shown in FIG. 8, which includes elements additional to those of the first laser module 350 of FIG. 7. Specifically, the second laser module 280 includes in sequence a laser 282 (that may be identical to previous laser 352) that yields a laser beam 284 (that may be identical to laser beam 204), a second neutral density filter 286 (that may be identical to the first neutral density filter 206 as used elsewhere in holographic apparatus 300), a second polarization rotator 288 (that may be identical to the first polarization rotator 208 as used elsewhere in holographic apparatus 300), one or more second waveplates 290 (that may be identical to the first waveplates 210 as is used elsewhere in holographic apparatus 300), a third objective lens 292 (that may be identical to either of the first objective lens 212 as is used elsewhere in holographic apparatus 300 or to the second objective lens 356 as used in the first laser module 350), a second spatial filter 294 (that may be identical to the first spatial filter 214 as is used elsewhere in holographic apparatus 300 or to a second spatial filter 358 as used in first laser module 250), and finally a third divergent lens 296 (that may be identical to first divergent lens 216 as is used elsewhere in holographic apparatus 300 or to the second divergent lens 360 as used in the first laser module 350), the uses of which then yield a broadened laser beam 298 that will be incident on the TO 224 in the same manner as is the laser beam 362 from the first laser module 350. The additional elements of second laser module 280, i.e., the second neutral density filter 286, the second polarization rotator 288, and the second waveplates may be used in the same manner as are the corresponding first neutral density filter 206, first polarization rotator 208, and first waveplates 210, namely, to adjust the power level of laser beam 284, define the plane of polarization of laser beam 284, and establish a desired degree of ellipticity of laser beam 284, each of which adjustments will of course have corresponding effects on laser beam 298.

Including the additional laser module 280 or 350 provides additional benefits. If the laser module provides a small illumination point at a photo-generating wavelength, such as for example ultraviolet, then circuits may be triggered. By using a broad beam substantial portions of the test object may be illuminated which helps identify test object characteristics, such as for example fault locations. Also, if the laser module provides a non-invasive beam it may be used to characterize individual portions of the test object.

That is, in apparatus 300 of FIG. 7, wherein the TO 224 is taken for the moment to be a GaAs wafer having the (001) face thereof exposed to reference beam 222a, the precise state of polarization of the plane wave 218 can be predetermined by virtue of the first polarization rotator 208 and the first waveplates 210. Such a predetermination is not readily made with respect to plane wave 362 of FIG. 7, but may be readily made with respect to the plane wave 298 of FIG. 8 by virtue of second polarization rotator 288 and second waveplates 290. Inasmuch as the electric vector E of a light beam lies transverse to the direction of propagation, and light beam 298 of FIG. 8 will be incident on the TO 224 in essentially the same manner as is beam 362 of FIG. 7, the E vector of the beam 298 when linearly polarized will lie in a plane defined by the z axis of the TO 224 and a second axis that lies somewhere in the x, y plane. Similarly, for silicon the change in the refractive index will produce a change in phase, which may be determined.

The fabrication of integrated circuits typically uses structures, such as metal lines and ground planes, that are not generally transmissive, unless sufficiently thin. Using a transmissive holographic technique requires the light to pass through the test device. On extremely high density devices the feature density may be too high to permit sufficient transmission. The presence of a ground plane may also restrict transmission. To accommodate structures that are not sufficiently transmissive a reflection technique may be employed. Transmissive and reflective techniques typically require different holographic systems. Referring to FIG. 9, a set of potential transmission and reflection structures are shown suitable for transmissive and reflective holographic techniques.

Unfortunately, the in-line holographic techniques result in the virtual image and the coherent source being viewed in-line and are superimposed upon one another making analysis difficult. The present inventor realized that an off-axis technique results in two images that are separated, as in the reference beam. This results in a clearer unobscured image that may be readily used, such as for interferometry. One example of an off axis technique is shown in FIG. 10 where the object and the reference beams are imaged on the recording medium, using a transmissive technique. For example, when the test device 224 is unstressed a holographic image is recorded on the recording device 226. Then the test device 224 is stressed in some manner or otherwise activated and another holographic image is superimposed on the recording device 226. Preferably a light valve 347 is used to adjust the reference beam intensity to match the object beam intensity using a set of detectors 349. The result is an interference pattern on the record rig device 226. Alternatively, two (or more) holographic image maybe separately obtained and analyze. As in all other embodiments, two differently stressed states maybe used, if desired.

Another example of an off axis transmissive beam technique is shown in FIG. 11 where the object and the reference beams are imaged on the recording medium using a reflective technique. For example, when the test device 224 is unstressed a holographic image is recorded on the recording device 226. Then the test device 224 is stressed in some manner or otherwise activated and another holographic image is super imposed on the recording device 226. The result is an interference pattern on the recording device 226. Alternatively, two (or more) holographic image may be separately obtained and analyzed.

Referring to FIG. 12, illustrates a transmissive based system that images at a position beyond the recording device 226. The effect of the system of FIG. 12 is a reduction in the noise.

The present inventor came to the further realization that interferometric testing, as described by Weingarten et al. in a paper entitled, "Picosecond Optical Sampling of GaAs Integrated Circuits", IEEE Journal of Quantum Electronics, Vol. 24, No. 2, February 1988, is limited to the rules of conventional microscopy. Such limitations include the inability to resolve particles with a limited depth of field. In addition, the system described by Weingarten et al. requires accurate alignment of the polarization wave plates in order to interfere with the light, which is difficult at best to achieve. Referring to FIG. 13, an improved interferometric tester includes an infrared laser 500 that provides an infrared beam or pulse that passes through a polarizer 501 and a beam splitter 502. A quarter wave plate 504 provides a rotation of the polarization plane to align the beam with the crystal face or test object. A half wave plate 506 rotates the beam so that the returning beam is 180 degrees out of phase with the incident beam. A zero wave plate 507 helps to correct for spurious reflections may be included, if desired. A microscopic lens 508 expands the beam and the beam strikes the test object 510. A pulse generator 512 provides energization to the test object. Alternatively, the test object may be energized with any other suitable technique, such as a photo-generating beam that generates a voltage or current therein. The beam is then demagnetized by the microscopic lens 508 and deflected by the beam splitter 502 to beam 540. A microscopic lens 514 expands the beam which is then incident on a sensor 516, such as for example an infrared CCD camera. This provides a wide range field of view substantially greater than a single wavelength focal point of the light on the test object. Unfortunately; the sensitivity of the system is limited to the optical resolution of the optical components; the wavelength sensitivity of the CCD camera, the minimum detectable photocurrents of the CCD camera, and the density of the pixels of the camera. In addition, it is, difficult at best to resolve device structures within the test object that are less than the wavelength of the laser beam. For example, infrared light may be 1.03 microns while the device structures of the test object may be 0.14 microns.

The present inventor came to the realization that if the CCD camera resolution and sensitivity to photo-generated voltages could be enhanced together with increasing the ability of the CCD camera to resolve individual pixels, then the system would not be directly limited to the physical attributes of the CCD camera. To achieve such enhancements the present inventor determined that using both holographic microscopy and/or holographic interferometry of the voltage displacement contours or interferometric fringes of the CCD camera may be used to substantially enhance the resolution. The optical image on the CCD produces a varying electric field on the pixels and associated structures which in result modulates the refractive index of the semiconductor crystals through the electro-optic effect or rotates the polarization of the incident beam. If the incident light distribution light changes the crystal in a manner that is different than was obtained by the CCD at rest, then a new charge pattern and thus a modified image may be obtained. A second sensor that is sensitive to a different wavelength of light than the first sensor (CCD) is used to sense the voltage patterns imposed on the first sensor. The second sensor may then observe the fringes in the voltage patterns of the first sensor representative of the variations of voltage as a result of stressing the test device. Inspection of the fringe pattern gives considerable amount of information about the stressed test device. Referring to FIG. 14A, initially an in-line holographic reflection probing system to illustrate the measurement of a CCD with a CCD is shown, may include a polarized beam preferably having a wavelength of 1.03 microns, or 1.3 microns or greater. The beam 560 passes through a camera lens assembly 564 to make the size of the beam 562 similar to the CCD camera pixel array 566. The beam 562 is reflected to the beam splitter 568 and reflected. The beam 570 is incident on a CCD 572. The CCD 572 is sensitive to the wavelength of the beam 560/562/570. A second beam 548 of a different wavelength of light than the first beam 562, such as for example 7000 nm, creates a photocurrent in the CCD 566. The beam 562 is non-invasive to the CCD 566 thereby not generating photo-voltages therein. The beam 562/570 in essence probes the induced voltages of the CCD 566. The beam 562 preferably is incident on the back of the CCD 566, while the beam 548 is incident on the front of the CCD 548. The CCD 566 is preferably sensitive to only visible light. The CCD 572 records the infrared image as an infrared hologram. The CCD 572 senses the voltage induced changes in the refractive index and/or polarization shifts in the optical properties of CCD 566. Changes in the CCD 566 change the phase and/or polarization of light incident to the CCD 572 resulting in detectable changes.

The inventor then realized, holographic microscopy when combined with conventional microscopy offers much greater usefulness in recording both phase and amplitude than is obtainable with conventional optical lens elements and devices. Likewise, optical holography offers the means to eliminate cumbersome optics, beam polarizers, and filters and permit in situ placement of more sensitive optics within the ergometric dimensions of conventional semiconductor packaging.

Holographic measurements of dynamic voltage patterns in semiconductors and freecarrier devices distributed throughout an appreciable volume and area are not possible with a conventional optical microscopic system. This is because a conventional microscope which can resolve particles of diameter d has a limited depth of field as shown in the following equation:

$$\Delta z \approx d^2 / 2\lambda \quad (1)$$

Holography permits storing a high resolution, three-dimensional image of the whole field at any instant. The stationary image reconstructed by the hologram can be examined subsequently in detail, throughout its volume by a conventional IR microscope.

In-line holography can be used for such examinations whenever a sufficient amount (>80%) is directly transmitted to serve as a reference beam. This permits very simple optical system as shown in FIGS. 14a, 14b, and 14c. However a distinction must be made between such an in-line hologram of a semiconductor integrated circuit and a Garbor hologram. Because of the small diameter d of the microchip's device lithography, the distance z of the recording plane from the microelectronic device(s) under test easily satisfies the far field condition:

$$z=4\lambda/d \tag{2}$$

where the diffracted field due to the voltage induced refractive index or polarization shifts is its Fraunhofer diffraction pattern.

To give a satisfactory reconstructed image of a semiconductor device under test, the hologram should record the central maximum and at least side lobe of its diffraction pattern. This would correspond to IR waves traveling at a maximum angle $$\Theta_{max}=4\lambda/d \tag{3}$$

to the directly transmitted wave, and hence, to a maximum fringe frequency of 4/d, which is independent of the values of $\lambda$ and z. Accordingly, for a device under test with 10 µm lithography, the recording material should have a modulation transfer function which extends beyond 400 mm$^{-1}$.

Recording devices and films with lower resolution, which are faster and easily employed, can be used effectively if a hologram is recorded of a magnified image of the device under test. For this, the imaged area of the device under test is imaged near the holographic plane, as shown in FIGS. 14a, 14b, and 14c, with a telescopic system having a magnification between 100 and 1,000. This leaves the reference beam parallel and gives constant magnification over the whole depth of the field.

The inventor then realized from this material that the depth of the field is also limited by the dimensions of the recording material. Examination of the previous expression for calculating the maximum angle, it follows that x, the half-width of the hologram, must be greater than 4z$\lambda$/d. Hence, the maximum depth of field over which the required resolution can be maintained is given by the relation $$\Delta z_{max}=xd/4\lambda \tag{4}$$

Determining film or recording medium-resolution requirements for off-axis multiple beam holographic recording setups.

Holographic interferometry of phase objects provides a very simple approach to in-line holography when a sufficient amount of light is directly transmitted through the device under test serves as a reference beam. Even in applications such as flow visualization and heat transfer studies, where conventional interferometry has been used for many years, holographic interferometry has practical advantages.

In this first instance, mirrors and windows of relatively low optical quality be used. [e.g., the 1 cm holographic plate is much larger than the 10 µm object. Since the phase errors due to these contribute equally to both interfering wavefronts, they cancel out, and only the effects changes in the optical path are seen. However, a significant advantage is the possibility of incorporating a diffusing screen (a ground glass plate) in the interferometer. This gives an interference pattern that is localized near the phase object, and can be viewed and photographed over a range of angles. This makes it possible to study three-dimensional refractive index distributions.

If the refractive index gradients in the test section are assumed to be small, so that rays propagate through it along straight lines parallel to the z axis, $\phi(x,y)$ the phase difference at any point in the interference pattern is given by the relation:

$$\phi(x,y)=k_o\int[n(x,y,z)-n_o]dz \tag{5}$$

where $n_o$ is the refractive index of the medium in the test section in its initial unpreturbed state and n(x, y, z) is the final refractive index distribution.

The simplest case is that of a two-dimensional phase object with no variation of refractive index in the z direction. In this case the refractive index distribution can be calculated directly from (5). This is a valid approximation to many practical situations.

Another case which lends to analytic treatment is that of a refractive index distribution f(r) which is radically symmetric about an axis normal to the line of sight (for convenience say, the y axis).

For a ray traveling in the z direction at a distance x from the center, we then have:

$$d \cdot z = (r^2 - x^2)^{\frac{1}{2}} \cdot r \cdot d \cdot r \tag{6}$$

so that (5) becomes:

$$\phi(x, y) = 2 \cdot \int_x^\infty f \cdot (r) \cdot (r^2 \cdot x^2)^{-\frac{1}{2}} dr^2 \tag{7}$$

This is the Abel transform of f(r), and it can be inverted to find f(r),

The evaluation of an asymmetric refractive index distribution f(r,θ) is much more difficult and is possible only by recording a large number of interferograms from different directions. The problem becomes even more complicated when the effects of ray curvature due to refraction cannot be neglected.

Holographic interferometry has been found particularly useful in high-energy plasma diagnostics. Since, unlike a neutral gas, plasma is highly dispersive, measurements of the refractive index distribution at [different] two wavelengths make it possible to determine the electron density directly. This has shown that "the interference fringes are contours of constant dispersion and, hence of constant electron density." Both these approaches while demonstrating plasma diagnostics, are limited in their utility because of the inability of the two holograms to provide real-time interferometry, as needed.

When using Real-Time holographic interferometry techniques, the hologram is replaced, after processing, in exactly the same position in which it was recorded. When it is illuminated with the original reference beam, the virtual image coincides with the object. If, however, the shape of the object changes very slightly, two sets of light waves reach the observer, one being the reconstructed wave (corresponding to the object before the change) and the other directly transmitted wave form its present state (e.g., changes in the index of refraction will alter the reflected optical path).

The two wave amplitudes will add at the points where the difference in optical paths is zero or a whole number of wavelengths, and cancel at some other points in between. As a result, an observer, photo detector or device viewing the reconstructed image sees it covered with interference fringes, which is a contour map of the changes in shape of the object. These changes can be observed in real-time.

Considering an off-axis holographic recording system, the intensity at the photographic plate when the hologram is recorded is:

$$I(x,y)=(|r \cdot (x,y)+o \cdot (x,y)|)^2 \tag{8}$$

where r(x,y) is the complex amplitude due to the reference beam and $$o(x,y)=|(x,y)|\exp[-i\phi(x,y)] \quad (9)$$

is the complex amplitude due to the object in its normal state.

Assuming that the amplitude transmittance of the photographic plate after processing is linearly related to the exposure, the amplitude transmittance of the hologram is:

$$\tau(x,y)=\tau_o+\beta \cdot T \cdot I(x,y) \quad (10)$$

An alternative to FIGS. 4, 5, 7, 10, 11, 12, 13, 14A is a two-beam microscopic holographic reflection probing system shown in FIG. 14C. to illustrate the measurement of TO 224 or a CCD with a CCD is shown, may include a polarized beam preferably having a wavelength of 1.03 microns or 1.3 microns. The beam 760 passes through a camera lens assembly 764 to make the size of the beam 562 similar to the CCD camera pixel array 766. The beam 762 is reflected to the beam splitter 768 and reflected. The beam 770 is incident on a CCD 772. The CCD 772 is sensitive to the wavelength of the beam 760/762/770. A second beam 748 of a different wavelength of light than the first beam 762, such as, for example 7000 nm, creates a photo-current in the CCD 566 or TO 224. The beam 762 is non-invasive to the CCD 766 thereby not generating photo-voltages therein. The beam 762/770 in essence probes the induced voltages of the CCD 766. The beam 762 preferably is incident on the back of the CCD 766, while the beam 748 is incident on the front of the CCD 748. The CCD 766 is preferably sensitive to only visible light. The CCD 772 records the infrared image as an infrared hologram. The CCD 772 senses the voltage induced changes in the refractive index and/or polarization shifts in the optical properties of CCD 766. Changes in the CCD 766 change the phase and/or polarization of light incident to the CCD 772 resulting in detectable changes.

The arrangements shown in FIGS. 14A/14B/14C can also be employed to enhance the sensitivity of other voltage measurement and electronic devices shown in FIG. 15A and FIG. 15B which are fabricated in substrate with or integrated into TO 224 or CCD 872. Examination of the targeted Josephson junction device's diameters in solid state electronic interferometer are 4 $\mu m^2$ and 7 $\mu m^2$, respectively, with a line width of 2 $\mu m$ on a Gate Delay Josephson OR Gate with Modified Variable Threshold Logic. FIG. 15A shows the fabrication layout and the targeted holographic examination area of the Josephson device. Where multiple Josephson devices are employed in an electronic device or substrate, multiple target-specific probing beams are utilized. These arrangements can also be employed for the enhanced measurement resolution for electronic devices detecting the presence of the following forces acting upon semiconductor and free-metal devices, electromagnetic (e.g. radio wave) field or signal, magnetic field, x-ray radiation, gravity wave, sub-atomic particle radiation, pressure, temperature, photo-generated carriers, incident electron- or ion-beams, bioelectric or chemical.

By analyzing the position of the holographic fringes and the shifts reveals information as to the nature of the voltages in the CCD or within the Josephson devices. The result is that the holographic fringes provide a high sensitivity to changes in voltage of the test device. Also the fringes increase the density of the sampling points of the CCD not directly provided by the pixels themselves. Analysis of the data from the CCD may provide information regarding the structure of the test device substantially smaller than the wavelength of the light used.

Referring to FIG. 15A, a system that includes primarily CCD's is illustrated. The magnified sensitivity of the secondary CCD to the primary CCD permits greater field sensitivity and resolution to employ holographic Speckle interferometric techniques and devices to the test and evaluation of TO 224.

Factors limiting the resolution holographic lithography and photography are not so much limited by the quality optics as in conventional photography and lithographic techniques but, upon the coherent nature of the hologram's interfering coherent beams or wavefronts upon the recording medium.

For infrared testing it may be desirable to include an infrared sensitive photo-conductor as the holographic recording medium. Generally such an infrared sensitive photo conductor generates a photo-current when exposed to infrared light. Such a photo-conductor may be, for example, silicon (for creating photogenerated voltages up to short infrared wavelengths of 1.1 $\mu m$), Lead Selenide, Indium Arsenide, GaAs, PbTe, GaAs doped with zinc, and Lead Sulfide. Accordingly, the photocurrent generated in the infrared sensitive photo-conductor is generally less than one electron volt. The photocurrent then performs the step of reducing the surface potential, as in standard visible light photo-thermoplastics for in-line and off-axis holographic techniques.

The unique capabilities of holographic interferometry are due to the fact that holography permits storing a wave front for reconstruction at a later time and are suitable for electrical measurement. Wavefronts which were originally separated in time or space or even wavefronts of different wavelengths can be compared by holographic interferometry. It is possible to observe holographic interferometry in real time. After processing the first hologram, leaving the holographic material in place or replacing it, when it is illuminated with the original reference beam, it reconstructs the object wave, and the virtual image coincides with the object. If, however, the characteristics of the object changes very slightly, two sets of light waves reach the observer, one being the reconstructed wave (corresponding to the object before the change) and the other the directly transmitted wave from the object in its present state. The two wave amplitudes add the points where the difference in optical paths is zero, or a whole number of wavelengths, and cancel at some other points in between. As a result, an observer viewing the reconstructed image sees it covered with a pattern of interference fringes, which is a contour map of the changes in shape of the object. These changes can be observed in real time. In addition, by viewing at multiple angles, a three dimensional model may be developed of the object. One general limitation of real-time holographic interferometry is that while the light diffracted by the hologram is linearly polarized, the light scattered by a diffusely reflecting object is largely depolarized, resulting in a significant drop in the visibility of the fringes. To avoid this, it is helpful to use a polarizer when viewing or photographing the fringes.

In double exposure holographic interferometry which may be used to test electronic devices, interference takes place between the wavefronts reconstructed by two holograms of the object recorded on the same photographic plate. Typically, the first exposure is made with the object in its initial, unstressed condition, and the second is made with a stress applied to the object. When the processed hologram is illuminated with the original reference beam, it reconstructs two images, one corresponding to the object in its unstressed state, and the other corresponding to the stressed object. The resulting interference pattern reveals the changes in shape of the object between the two exposures. Double exposure holographic interferometry has an advantage over real-time holographic interferometry, because the two interfering waves are always reconstructed in exact register. Distortions of the emulsion affect both images equally, and no special care need be taken in illuminating the hologram when viewing the image. In addition, since the two diffracted wavefronts are similarly polarized and have almost the same amplitude, the visibility of the fringes is good. However, double-exposure holographic interferometry has certain limitations. The first of which is that where the object (or object's refractive index) has not moved between the exposures, the reconstructed waves, both of which have experienced the same phase shift, add to give a bright image of the object. As a result it is difficult to observe small displacements or changes in the material's index of refractive or polarization state. A dark field, and much higher sensitivity, can be obtained by holographic subtraction, which merely involves shifting the phase of the reference beam by 180 degrees between the two exposures. An alternative method, which also helps to resolve ambiguities in the sense of changes, is to shift the phase of the reference beam by 90 degrees between the two exposures, or, better, to introduce a very small tilt in the wave-front illuminating the object between the two exposures. In the latter technique, equally spaced reference fringes are obtained, whose change is modulated by the phase shifts being studied. Another limitation of the double-exposure technique is that information on the intermediate states of the object is lost. This problem can be overcome to some extent by multiplexing techniques using spatial division of the hologram. In the latter procedure, a series of masks are used in which the apertures overlap in a systematic fashion, and a sequence of holograms is recorded at different stages of loading. The images can then be reconstructed, two at a time, so that interference patterns between any two images can be studied. An alternative is to use thermoplastic recording material, by which real-time fringes can be observed and the fringe pattern subsequently frozen to give a permanent holographic record.

Control of the fringes, to compensate for rigid body motion and eliminate ambiguities in interpretation, is not normally possible with a doubly exposed hologram. However, it is possible with two holograms recorded with different angularly separated reference waves. These holograms may be either on the same plate or different plates.

The testing of electronic devices in semiconductor materials may likewise be tested using stroboscopic holographic interferometry where a hologram of a stressed test object is recorded using a sequence of light pulses that are triggered at different times during the stressing of the test object.

A surface relief hologram can be recorded in a thin layer of thermoplastic which is combined with a photo-conductor and charged to a high voltage. On exposure, a spatially varying electrostatic field is created. The thermoplastic is then heated so that it becomes soft enough to be deformed by the field and, finally, cooled to fix the pattern of deformation. Such materially have a reasonably high sensitivity over the whole visible spectrum and yield a thin phase hologram with fairly high diffraction efficiency. In addition, they have the advantage that they do not require wet processing. If a glass substrate is used, the hologram can be erased and the material re-used a number of times. One structure of a photo-thermoplastic is a multi-layer structure consisting of a substrate (e.g., glass, Kodar, or Mylar) coated with a thin, transparent, conducting layer, an infrared sensitive photo-conductor, and a thermoplastic. Referring to FIG. 16, the film is initially sensitized by applying a uniform electric charge to the top surface using a corona device that moves over the surface at a constant distance from it and sprays positive ions on to it. As a result a uniform negative charge is induced on the conductive coating on the substrate. Next, the film is exposed, and the charge carriers are produced in the photo-conductor wherever light is incident on it. These charge carriers migrate to the two oppositely charged surfaces and neutralize part of the charge deposited there during the sensitizing step. This reduces the surface potential but does not change the surface charge density and the electric field, so that the image is still not developable. Accordingly, in the next step, the surface is charged once again to a constant potential, using the same procedure is the first step. As a result, additional charges are deposited whenever the exposure had resulted in a migration of charge. The electric field now increases in these regions, producing a spatially varying field pattern and, hence, a developable latent image. In the fourth step, this latent image is developed by heating the thermoplastic uniformly to a temperature near its softening point. This is done most conveniently by passing a current briefly through the conductive coating on the substrate. The thermoplastic layer then undergoes local deformation as a result of the varying electric field across it, becoming thinner wherever the field is higher and thicker in the unexposed areas. Once the thermoplastic layer has cooled to room temperature, this thickness variation is frozen in, so that the hologram is quite stable. Because the latent image is relatively insensitive to exposure to light after the second charging, it is possible to monitor the diffraction efficiency of the hologram during development and to terminate the application of heat at the proper time. Finally, when the plate is to be re-used, it is flooded with a proper wavelength of light, and the thermoplastic layer is heated to a temperature somewhat higher than that used for development. At this temperature, the thermoplastic is soft enough for surface tension to smooth out the thickness variations and erase the previously recorded hologram. A blast of compressed air or dry nitrogen is then used to cool the thermoplastic material rapidly to room temperature, in preparation for the next exposure. Alternatively, a solvent vapor may be used to soften the thermoplastic. This has the advantage that it eliminates the need to heat the substrate; in addition, it gives higher sensitivity and lower noise. Enhanced sensitivity can also be obtained by the use of double-layer and triple-layer photo-conductor systems.

An infrared semi-transparent material, such as a thin gold layer or a transparent electrode, or a suitable organic photoconductor, may be deposited on the exterior surface of the thermoplastic. Besides serving as an electrode to the photoconductor it also acts in a manner to filter the image. The stressed or unstressed states of the infrared image from the test device is exposed and fixed in the thermoplastic material. Thereafter, if an infrared sensitive camera views the thermoplastic material when exposed to the opposite of the stressed or unstressed state of the infrared image from the test device. The result is a set of fringes on the thermoplastic material corresponding to the maximum and minimum intensity distribution. Computer aided evaluation of the resulting thermoplastic holographs or inferograms may be used, as desired. If an infrared semi-transparent material is used then the infrared camera may be used to view the thermoplastic material from the front side through the transparent photo-conductor, as the infrared semi-transparent material, such as thin semiconductor material or glass, will make it simpler to detect the fringes.

One approach to making thin-phase thermoplastic holographic recordings is to sensitize the photoconductor to 1.15-µm infrared light. The photoconductor is formed by adding a sensitizer to polyvinylcabazole (PVK); the dye 2,4,7,-trinitro-9-fluorenone is widely used as a sensitizer with visible light. Since the photoconductor formed with this dye in complex with PVK is not sensitive to radiate at 1.15 µm, other dyes must be used. The PVK can be sensitized to near infrared by either of two sensitizes, 2.4,5,7-tetranitrofluorenone or (2,4,7-trinitrofluorenylidene)-malononitrile. A photoconductor solution is prepared by dissolving PVK in tetrahydrofuran and adding sensitizer at a weight ratio of one part sensitizer to four to ten parts PVK. The holographc device prepared by dip coating the glass substrate and its transparent electrode with the photoconductor. A thermoplastic layer is added by a second dip coating with an ester resin dissolved in naptha. Solution concentrations and dip speeds are adjusted to photoconductor and thermoplastic layer thicknesses of approximately 2 and 0.8 μm, respectively. The sensitizer forms a complex with the PVK that appears to the eye as dark brown or gray.

Referring to FIGS. 17-19 illustrates what the interference fringes may appear as. Based on the location and pattern of the fringes, together with knowledge of the anticipated associated structure of the semiconductor device, the voltage patterns within the device for particular structures may be determined. Based on the set of voltage patterns, the designer may then troubleshoot the construction of the device. In this manner, the designer may obtain in a relatively efficient manner a set of voltages internal to the device and infer from those voltages the potential source of any design or fabrication anomalies, as desired.

While it is potentially conceivable to use infrared photographic films as a recording medium they are not especially suitable for several reasons. First, infrared photographic films sense and record the infrared light as visible light when developed, and not as non-viewable to the human eye infrared light. Typical infrared films record the infrared light to a maximum of 1,314 nm, where the developed image (Bragg cells) on the film is in visible light (550-800 nm) and hence the visible image cannot refract or diffract infrared light. Second, typical infrared photographic films have limited sensitivity and tend to fog due to chemical sensitivity. The fogging is principally because of background thermal radiation. Third, after its spectral sensitization, a photographic plate is subject to thermal background radiation during its preparation and storage, and the various stages in the photographic process. This gives rise to a fog and reduces the "lifetime" of a plate, and is the main obstacle to the achievement of reasonable photographic sensitivity. What would be desirable is an infrared "film" type recorder that senses infrared light and records the infrared light as an infrared image.

In addition to recording ultraviolet holograms of voltages and plasmas in free-metals with conventional photographic and holographic films, the present inventor has identified several infrared holographic recording mediums for recording plasma and voltages in semiconductors using single and dual wavelength for Gabor-type, in-line holography, off-axis holography, and holographic interferograms. A Bismuth recording film has demonstrated good sensitivity for recording infrared holography for wavelengths from 1.06 μm to 10.6 μm. A film of Magnesium-Bismuth (MnBi) has demonstrated good recording characteristics at 1.06 μm. Plexiglas has been used to record infrared holograms at 10.6 μm.

The present inventor came to the realization that a controlling factor should be included with the recording medium to permit the recording of infrared light only while the medium is "turned on," so that the recording material is sensitive only when a useful image is projected on it. In addition, at the end of the exposure, the factor should be "switched off" so that the material remains insensitive throughout the subsequent storage of the exposed material. Thus the basic principle of controllable sensitivity is the sensitization of a photographic material only during its exposure. Also, if desirable, the controlled sensitivity may be switched on and off only in a certain spectral region (controlled spectral sensitization). The present inventor further came to the realization that semiconductor materials exhibiting a photoelectric sensitivity in the infrared range may be used as a recording device. It needs to be understood that in electro-photograph recording techniques charge dispersion and diffusion are limiting factors on image resolution. The use of voltage channeling conductive elements and their subsequent arrangements are to be applied to the recording devices described herein, as desired.

One potential semiconductor material may include bringing into contact, during the exposure time, two separate parts of a photographic system, each of which is not photographically sensitive on its own but only when in contact with the other material. For example, a thin photosensitive semiconducting film may be brought into contact with an aqueous electrolytic solution. However, the electrolytic solution and the photosensitive semiconducting film tends to be, by itself, insensitive to infrared light. When the two materials are brought into contact, an oxidation-recombination reaction takes place at the semiconductor-electrolyte interface. The rate of the reaction is dependant, at least in part, on the electron (hole) density in the semiconductor, i.e., on the intensity of illumination falling on the semiconducting film. The reaction may be ended by breaking the contact of the two pieces, or any other suitable technique. Thus, the semiconductor film is again insensitive to infrared radiation. Alternatively, a semitransparent film of lead sulfide evaporated on a glass substrate should also be used as a photographic plate. Combined with a germanium filter, this plate may be exposed to obtain an optical image, or the exposure stopped in the latent image stage and the optical density could then be increased by "physical" development. Alternatively, a thin semiconductor plate of n-type gallium arsenide in contact with electrolyte solution containing $HNO_3$ produces an image by selective photo etching of the semiconductor surface. However, this requires a physical manipulation of the parts, which is not highly desirable.

An alternative structure includes electrically controlled processes where an "electric shutter" is used to "switch on" the photosensitivity during exposure. There are two general techniques to electrically control the photographic process with a self-contained current-sensitive film, namely, a liquid process and a process with a self-contained current-sensitive film. Referring to FIG. 20, a semiconducting film 602, covered by a conducting transparent layer 600, (such as for example glass, Mylar, or a semiconductor film is brought into contact with an electrolyte solution 604 bounded on the opposite side by a metal counter electrode 606. An optical image is projected on the outer surface of the film 602. Then, an electric voltage from a power supply 608 is applied to the electrodes 600 and 606 by closing a switch 610. A latent photographic image is formed because of the difference in the rates of electrolytic deposition of a metal from the electrolyte solution on the illuminated and unilluminated parts of the semiconducting film. This image can then be intensified in a "physical" developer. Many materials may be used for the semiconducting film 602, such as for example, silicon and germanium plates as well as lead sulfide films deposited on transparent conducing layers of $SnO_2$.

Another further embodiment of the image is not formed on the surface of a semiconductor but in a self-contained current sensitive film. Referring to FIG. 21, a semiconducting film 622 has a protective coating 624. This coating is a composite material based on an epoxy resin with conducting inclusion where the conductivity of this coating is anisotropic. The anisotropic coating is pressed tightly against a current-sensitive film 626, consisting of a gelatin layer on a liquid-permeable base impregnated with an electrolyte solution. The opposite side of the current-sensitive film is covered by a counter electrode 628 in the form of a metal foil. The photosensitive semiconducting film is a large area surface-barrier p-n, n-p-n, or p-n-p, junction with a high-resistivity bulk region. The illuminated side of the semiconducting film has an ohmic contact 620. When an external voltage is applied to the film (such as for example glass, Mylar, Kodir, etc.), the junction is biased in the reverse direction. The junction, whose load is the electrolytic cell 624,628, operates under the photo-diode. The image is formed by electrolysis in the current-sensitive film 626. The principal advantage of this system is the repeated use of the photosensitive element. The system may be used without an external voltage source if the electrolyte composition and the electrode materials are chosen in a suitable manner. In this case, simple closing 632 of the circuit's power supply 630 provides the "electric shutter" action. The developed film can be subsequently applied or fixed to an optical surface or device.

Yet another alternative embodiment of a semiconductor as the basis of the film consists of the following. A charge is uniformly distributed across the surface of a high-resistivity semiconductor placed on a conducting substrate. The charge leaks away from the illuminated regions because of their photoconductivity and a latent electrophotographic image is formed on the plate. The image is made visible by development involving the precipitation of the charged colored particles of the developer on the unilluminated parts of the image. The photographic sensitivity of the plate is absent during its preparation and is imparted by charging the plate. The charging process acts as a controlling factor which "switch-on" the sensitivity. However, the latent image has only a limited lifetime and the sensitivity cannot be "switched off" after the exposure. The process can be completed by electrostatic development.

There are addition techniques that may be employed. The effect on a photographic plate of the background thermal radiation during the plate's storage and preparation before its exposure and during its subsequent treatment can be suppressed by exploiting the uniform illuminance of this radiation. A process can be developed in which the photographic effect is obtained only by projection of an image with regions of different illuminance but not by uniform illumination. A photographic process of this type may ensure insensitivity of a photographic material to the fogging effect of the thermal radiation and still give an optical image. One of possible variants of such a process involves the use of the photo emf in semiconductors, p-n, n-p-n, or p-n-p, junctions for the purpose of obtaining a photographic image. Referring to FIG. 22, two photo-diodes, whose p-type regions are connected by a metallic conductor, whose n-type regions are connected by an electrolyte EL. When the illuminance $L_1$ of both junctions is the same, they generate identical photo emfs and there is no current in the circuit. However, if an additional light flux $L_2$ reaches one of these photo diodes, this diode produces a photo emf $V_2$ and an electric current flows in the circuit. The electrode of the more strongly illuminated photo diode acts as the cathode. Neutralization of the metal ions in the electrolyte, which then form an image, occurs near the cathode.

Other suitable materials for this process include a base layer of n-material Aluminum overlaid by layer of p-material silicon, which would a photovoltaic response from ultraviolet to approximately an infrared wavelength of 1.1 μm. Since the Aluminum layer is reflective to infrared radiation, it is useful in making films for infrared reflection (non-transmission) holograms. Both layers can be plasma deposited onto a high refractive index wafer or quartz (glass) surface (with the Aluminum layer outward) so that the hologram is recording through the quartz. The image quality of the developed hologram can be enhanced by the addition, a thin (or at wavelength specific thickness) dark infrared light absorbing layer of either p-, n-semiconductor or dielectric materials can be sandwiched between the silicon and aluminum layers. In infrared-transparent semiconductor materials, the materials' higher index of refraction gives a higher line resolution per millimeter in the processed film.

It is possible to increase the resolution of the aforementioned semiconductor based recording devices by the combination of an infrared wave front (or a relatively equal ultraviolet wave front strength to the infrared wave front) and e-beam convergence on the semiconductor in place of an applied voltage.

A further embodiment includes a recording device including a polycrystalline film, and in particular polycrystalline film including lead sulfide and selenide.

Another embodiment includes a lead sulfide recording device including sensitivity-controlling by an electric field applied to a semiconductor—electrolyte system where the image is formed directly on the semiconductor surface. A lead sulfide film may be prepared by vacuum evaporation followed by annealing. For example, the films may be deposited on a glass substrate with semitransparent tin dioxide electrodes (such as a surface resistance below 50 ohms/square). During exposure the semiconductor film is brought into contact with an electrolyte. The exposure is made through a film, such as a germanium filter. The light is focused onto the surface of the Pbs film. For best results the electrolyte should have the following characteristics: (1) the effect of light should not result in the formation of an image in the absence of an electric field; (2) the selectivity of the electrolyte should be high in contrast to the electrolytes employed in electroplating; (3) the electrolyte should have a high current efficiency and the electrolysis should give rise to heterogeneous catalysis centers necessary for efficient development; (4) the electrolyte should produce an image with a high color contrast on the gray background of the semiconductor film. One potential electrolyte is a solution of simple salts, such as lead or silver nitrates, copper sulfate, or calcium chloride. A potential explanation of the mechanism of formation includes consideration of the semiconductor—electrolyte interface in an electric field. Cathodic polarization of the semiconductor surface produces a negative space—charge region and a corresponding blocking barrier at the surface of the p-type semiconductor. The selection of the elements of the light sensitive PbS—electrolyte system consists of addition of oxidizing or reducing agents to the electrolyte in accordance with the type of conduction of PbS. Referring to FIG. 23, during exposure to light the voltage applied in the blocking direction alters the sign of the surface potential. The photo-excited electron—hole pairs are split by the space—charge field. The electrons neutralize the positive electrolyte ions and form a metal-deposit image on the semiconductor surface. FIG. 23 illustrates the energy band scheme of a semiconductor to illustrate the appearance of an anti-blocking barrier at the boundary with a electrolyte, where the left side is in the absence of an electric field and the right side is during application of an electric field in the blocking direction.

Yet another alternative is a recording medium is a photoconduct-o-graphic system. The principal advantage of such a system is the formation of an image in a separable film and the consequent reusability of the photosensitive layer. One potential material utilizes high-resistivity gallium arsenide without a protective coating which is a compromise between photoconduct-o-graphic and semiconductor-electrolyte systems, combining the advantages of both. Referring to FIG. 24, an image is exposed on a photo-conductor 680 on the side covered by a semitransparent electrode 682, preferably made of nickel. A film 683, such as cellophane, Mylar, or Kodar, is imprinted (or otherwise supports or includes) an electrolyte so that it is suitable for carrying current is pressed to the opposite side of the photo-conductor, preferably with imprinted voltage dispersion and diffusion restricting structures. The area of this film is greater than that of the photo-conductor and the projecting part of the film is used to make contact with a conductive counter-electrode 684, such as a copper or graphite electrode. During exposure the semi-transparent electrode is subjected to a negative potential and the counter-electrode to a positive potential from a power source, such as a battery 685.

The counter-electrode (anode) is located at such a distance from the photo-conductor that the products of the anodic reaction in the current-carrying film near the counter-electrode can not diffuse into the main part of the assembly and spoil the useful image by accidental blackening.

The use of high-resistivity gallium arsenide eases the requirements that the electrolyte must satisfy in respect of the differential resistance in cathodic reactions, i.e., the resistance of the current—carrying film can be relatively high. When a high-resistivity photo-conductor is used in direct contact with a current—carrying film (without a protective layer) it is found that the system described above operates more or less efficiently with electrolytes. It follows that the protective layer need not be used, if desired.

The principal photographic characteristics of the system are a function of the electrolyte used and of the ability of the latent-image center to become localized in the current-carrying film during exposure and to remain in this film for some time after the exposure. These characteristics depend also on the process responsible for the visualization of the nonmetallic latent-image centers. For example, if a Phenidone electrolyte is used, the latent-image centers localized in the film may remain for several minutes and during this time the latent image is not affected by ordinary or acidified water. When the electrolyte is a weak aqueous solution of a neutral salt, the latent-image centers localized in the film have a sufficient degradation time. This time is sufficient for retention of the latent image from the end of the exposure to the beginning of the visualization process.

There may be at least two general types of reactions between a semiconductor material and molecules of an adsorbed reactant, controlled by active radiation. First, the chemical reaction between the components of the reagent is catalyzed by non-equilibrium carriers from the semiconductor. The visual image is produced by heterogeneous—catalysis reaction products. Second, the reaction or oxidation of the reagent on the semiconductor surface involving non-equilibrium electrons or holes, respectively, and the chemical reaction of the products with the semiconductor material. The image is produced either through local etching of the surface, when the reaction products are soluble or gaseous and are removed from the surface, or by colored insoluble reaction products adsorbed on the surface. For example, a gas photo-corrosion of thin semiconducting films of indium antimonide may be used. Since the bonds in $A^{III}B^{V}$ compounds are covalent, a strong oxidizing agent such as nitric acid (vapor) may be used as a constituent of the etchant. The deep penetration of the corrosion reaction, to a depth where the distribution of lattice defects is still significant, may reduce considerably the absorption of visible light in a thin film, if the reaction products are removed from its surface. Alternatively, an image may be formed by using a colored film of insoluble oxide on InSb. The system my include indium antimonide and nitric acid vapor together with polycrystalline InSb films 0.5-1.5 microns thick, deposited by evaporation on glass substrates.

The following model may explain the process. Initially, the contact between the InSb and the nitric acid vapor produces a poly-molecular adsorbed layer of nitric acid. The reduction of the nitric acid by equilibrium electrons (minority carriers) is slow. Optical excitation causes a sharp increase in the electron density at the surface, and the reaction becomes much faster. The adsorption equilibrium between the InSb surface and the nitric acid vapor is shifted in the direction of further adsorption of the reagent molecules. The equation may be as follows $3H^{+}+NO_{3}^{-}+2e^{-}->HNO_{2}+H_{2}O$. The products of the reaction interact with indium antimonide and form, at points where there is location illumination of the semiconductor, a black film of oxide, which constitutes the image. This photographic effect may also be observed in photo-sensitive films of lead sulfide exposed to a mixture of hydrochloric and acetic acid vapors.

An extension of the aforementioned semiconductor based photography into infrared wavelengths may be achieved if the photo-sensitive element is cooled. For example, consider a film of semi-insulating GaAs is doped with zinc, 100 microns or less thick, and its resistivity generally $10^{8}$ ohms cm. The dielectric layer may be a film of polyethylene 10 microns or less thick covered by a conducting coating. The semiconductor and the dielectric layer are pressed together between conducting electrodes and immersed in liquid nitrogen to achieve cooling, if desired. Preferably, the liquid nitrogen is evaporated from the gap between the semiconductor and the dielectric. Then simultaneously the system is illuminated and subjected to a voltage pulse. The charge is transported across the gap between the dielectric and the semiconductor, which was filled with gaseous nitrogen. The dielectric may be extracted from the system and developed in a developer which can be subsequently fixed to an optical surface or device. In addition, other thin dielectric mediums may be used, such as doped Mylar or Kodar films.

Referring to FIG. 25, yet another alternative recording medium includes a semiconductor photo-detector film 691, which has a transparent conducting contact 692 and a protective layer 693 (on the outer surface) whose conductivity is preferably anisotropic. The protective layer is brought into intimate contact with a current-sensitive electrochemical film 694, which has a counter-electrode 695. An image is projected on the semi-conductor film 691. When the electric circuit is closed by a switch 697, a latent image is formed by electrolysis in the current-sensitive film 694 because of the differences between the current density in the illuminated and unilluminated parts of the semiconductor film 691. Preferably, the photo-sensitive element is a surface-barrier p-n, n-p-n, p-n-p, junction made of p-type or n-type silicon. The p-n, n-p-n, or p-n-p junction used in such a photographic system should have a high resistance and a small area in contact with the anisotropic layer. This assists in preventing appreciable spreading of the current, which would affect the resolving power of the system. Account is taken of the influence of various treatments on the surface band bending in the protective layer. The required characteristics are achieved by etching the silicon surface and heat treating the protective layer, which is a compound based on an epoxy resin containing a filler and a conducting component. The current-sensitive film should be easily removable from the protective layer and capable of further development with a minimum of fogging. Moreover, the current-sensitive film should be sufficiently rigid in order to avoid any distortion of the image during subsequent treatment. These requirements are reasonably well satisfied by a film of tanned gelatin with an admixture of glycerin on a base which is permeable to liquids. After the immersion of such a film in an electrolyte solution and subsequent brief drying, its consistency should be such as to ensure a satisfactory contact with, and removal from, the surface of the anisotropic layer.

Yet another recording material including semiconductor material with forbidden bands are narrower than the forbidden band of silicon. In addition, this may be extended to polycrystalline films, if desired. For example, a reaction of lead sulfide or selenide with an aqueous solution of $AgNO_3$ may be used. The rate of the reaction is based, at least in part, for p-type PbS or PbSe by the rate of the cathodic component, i.e., by the rate of precipitation of silver. This precipitation rate is determined by the density of non-equilibrium carriers (electrons) in the surface layer of the semiconductor; consequently, it depended on the illumination. The precipitation of silver was thus localized on the illuminated parts of the sample, whereas the sulfide or selenide was dissolved in the unilluminated region. In the case of silicon, the image may be projected on that surface of the sample which is opposite to the surface in contact with the electrolyte. Pbs films may be evaporated in vacuum on glass substrates and activated by heating in air. The thickness of the films is preferably such that they are semi-transparent after activation. This makes it feasible to obtain the image by transmission.

A two part system shown in FIG. 26, based upon a p-n silicon and aluminum junction with photoelectric IR sensitivity to 1.1 μm, it is possible to utilize an IR reflective backplane material 900 (Aluminum) and a top layer 902 of silicon. The device, and all other recording materials, can be mounted on 904, a transparent material such as a semiconductor or a glass substrate having a high index of refraction. FIG. 26 shows a three-part system based upon silicon-aluminum p-n-p or n-p-n junction. In this device, one layer is doped in two different concentrations of p- or n-material. The top layer 906 being transmissive silicon, the middle 908 layer of either silicon or aluminum material is doped as to contrast to the 906 silicon layer and the bottom 910 Aluminum layer so that a p-n-p or n-p-n junction is created having 912/914/916 electrical contacts to control each layer in the three-part junction.

The inventor then realized that these two-part or three-part system films satisfies the requirements for making thin, phase, thin-amplitude, thin-phase, and thin-phase-reflection holograms, the films did not readily meet the requirements for creating volume- and volume-transmission, and volume reflection holograms. The inventor then realized that IR volume holograms could be readily achieved if an IR recording material could created which was able to record and resolve greater amplitude and refractive-index values.

Referring to FIGS. 26 and 27 p- or n-doping dark (or light absorptive material and over lay it with an infrared transparent material such silicon or ⅗ materials (²⁄₇ materials are possible also).

FIGS. 28 and 29 show an approach to enhancing the probing beam's sensitivity by the application of IR holographic interferometric gratings to form the incoming beam or plane wave incident to the LiTa and IR holographic gratings to the object beam from the LiTa probe.

The present inventor came to the realization that temporary transient holograms utilizing a spatially modulated free carrier pattern would be useful in providing real-time hologram recording and interferometric evaluation of TO 224. When a photoconductor receives nonuniform illumination e.g., illumination limited to just a small portion of the interelectrode spacing, some special effects can be obtained. In general, insulators subjected to such nonuniform illumination would be expected to show a negible fractional increase in photocurrent because the flow of the current would be effectively prohibited by the buildup of space charge. The same is true of semiconductors, if carriers of only one type are mobile, but not if the carriers of both types are mobile.

Shown in FIG. 30 is a transmission holographic setup for recording volume holograms of TO employs temporal free-carriers recorded within a solid state recording medium.

The effects which can be obtained with a nonuniformly excited insulator. As indicated in FIG. 31, consider a photoconductor illuminated parallel to the applied electric field, e.g., through a partially transparent electrode, by light which strongly absorbed and produces excitation on to a depth d. The excitation of free carriers in this portion as uniform over the distance d; the excitation of the free carriers in this portion of the crystal creates an effective barrier which will have the form shown in FIG. 32 the electrons are the majority carriers. If replenishment of electrons form the dope semiconductor p- or n-layered materials are not possible, then a small space-charge-limited electron current will be drawn when the illuminated electrode is negative, and an even smaller current when the illuminated electrode is positive, because of the much smaller assumed effective mobility of the holes. But, if replenishment of electrons at the cathode is possible, the space-charge-limited current which flows for the illuminated electrode negative may well be smaller then the current that flows for reverse polarity for the following reason. When the illuminated electrode is positive, photoexcited holes may diffuse under action of the field into the unilluminated portion and there be trapped to provide a positive space charge; electrons enter the crystal from the photocurrent, continues until recombination occurs between a free electron and the hole. It should be noted that the field direction for the maximum current flow for the same material with the same sign of majority carriers can be reversed, depending on whether or not electrons can be replenished. FIG. 32 shows a schematic and energy-level diagram of a nonuniformly excited photoconductor A similar set up for the type of photocurrent (primary or secondary) to be expected from nonuniform illumination of a photoconductor. This discussion leads naturally to the reason why nonnegible photocurrents can occur in semiconductors with both carriers mobile, even for nonuniform illumination. Shown in FIG. 33 is a schematic representation of a photoconducting crystal excited non-uniformly. The photoconducting crystal with neutral contacts in which (1) only electron current feed be considered, the holes being rapidly trapped at or near the site of their creation, and (2) electron-hole pairs are generated at a distance x from the anode by a pulse of excitation.

The trapped holes from a space-charge of $+Q$ cm², and their presence causes electrons to enter the crystal from the cathode. If the excess electron's which this enter the crystal constitute a charge of $-aQ$ cm², the effect of the net charge is to increase the field at the cathode $$E := E_o + \left(\frac{x}{d}\right) \cdot \left(\frac{4 \cdot \pi}{e}\right) \cdot Q \cdot (1 - \alpha) \tag{10}$$

where electrostatic units have been used, Eo is the field in the absence excitation, and e is the dielectric constant. The increase in current density corresponding to the increase in field is given by $$\Delta j := \mu \cdot n \cdot e \cdot \left(\frac{x}{d}\right) \cdot \left(\frac{4 \cdot \pi}{e}\right) \cdot Q \cdot (1-\alpha) \quad (11)$$

This increase in current may also expressed as $$\Delta j := \mu \cdot E_o \cdot \left(\frac{\alpha \cdot Q}{d}\right) \quad (12)$$

Equating these two relationships for Δj shows that $$\alpha := \frac{\beta}{1+\beta} \quad (13)$$

where $$\beta := \frac{4 \cdot \pi \cdot x \cdot e \cdot n}{e \cdot E_o} \quad (14)$$

If strongly absorbed light or radiation is used to excite the material, x~d, and then examination of the previous expression β shows that quantity b can be expressed as the ratio of two times
(1) the transit time, and:

$$\tau_n := \frac{d}{E_o \cdot \mu} \quad (15)$$

(2) the dielectric relaxation time (16) (essentially the RC time constant) of the material:

$$\tau_r := \frac{10^{-12} \cdot \rho \cdot e}{4 \cdot \pi} \quad (16)$$

where we have inserted the numerical factor to make the expression usable with conventional units for the resistivity ρ and e. Thus $$\beta = \frac{\tau_n}{\tau_r} \quad (17)$$

so that the ratio of secondary to primary photocurrent is $$\frac{\Delta j}{j_p} = \frac{\beta}{1+\beta} \quad (18)$$

To measure a primary photocurrent without any contribution from the secondary photocurrent, then β must be much less than unity; i.e., $\tau_r \gg \tau_n$. All other quantities being about the same, this means that a pure primary photocurrent can be observed in material only with a resistivity, i.e., insulators.

The same kind of reasoning is involved in determining the type photoconductivity which results from nonuniform illumination of a material in which both carriers are mobile. The key question is this. When electron-hole pairs are generated in a material by nonuniform illumination, do the electrons and holes separate, each going to the appropriate electrode, or do the photoexcited minority carriers move toward their appropriate electrode and take along with them an equal number of majority carriers to maintain an absence of space charge. The answer is that, $\tau_r \gg \tau_{maj}$, the carriers move in opposite directions; this is the condition found in insulators where nonuniform illumination products a space-charge limitation on the current. In homogenous photoconductor materials, when both carriers are mobile but the holes are not replenished at the anode, the gain is given by $$\text{Gain} := \frac{\mu_n + \mu_p}{\mu_p} \quad (19)$$

If $\tau_{maj} > \tau_r$, on the other hand, the minority carriers take with them an equal number of majority carriers, and the photocurrent results from this slice of increased conductivity;

this is the condition found in semiconductors where non-uniform illumination is not to very small values by space-chare limitations if both carriers are mobile. The actual gain of the photocurrent is the same as the previous case [for the definition of Gain]. In the later case, the space-charge which would be built up by the separation of the charges is rapidity dissipated by normal conduction processes, the neutralization of the charge being carried out through those carriers which contribute the most to conductivity, i.e., the majority carriers.

In holographic filtering discrete voltage levels can be targeted, allowing for voltage induced jittering or timing; giving optional optical filtering conditions, i.e., negative (low) background voltage level permits target photocurrents, a large voltage exceeds the targeted voltage level recorded by the holographic filter.

Shown in FIG. 34, is an Energy level diagram showing external voltage clocking or shuttering a photoconducting crystal and the targeted photogenerated voltage levels excited nonuniformly. The invasive or photogenerating light is correspondingly clocked. The photoelectrically generated pattern is read using noninvasive (non-photogenerating) light: Photoelectric materials and behaviors; polarized light effects, photoelectric noise sources, drift mobilities, negative photogeneration (useful for reversed-engineered or negative photoactive surfaces), photodielectric effect (useful for macro-electronic capacitor devices or in display, telemetric devices, as well as in both analog-to-digital and digital-to-analog converter devices which require longer lived voltage waveforms), and measurement of lifetime and diffusion length.]

The free-carrier pattern acting as a pure-phase volume hologram and decays by diffusion of the free carriers using an apparatus as shown in FIGS. 4/5/7/8/14a/14b/14c/26/27/28/29/31/32/33. When a beam from a Q-switched Nd:YAG laser (λ=1.06 μm, hv=1.16 eV [need to lower this photogenerating threshold by selectively doping semiconductor materials]) passes through a thin slice of Si ($E_g$=1.11 eV), a large concentration of free electrons and holes are created by optical interband transitions. FIGS. 28 and 29 illustrate layers in the Cd material with one other or more p- and n-doped semiconductors to increase interband transistions. By lowering the Applied laser power levels from ≈3×10$^{17}$ cm$^3$ for a power flux>l mJ/cm$^{-2}$ and a pulse length of 10$^{-8}$ sec by selective substrate doping of p- and n-materials will significantly reduce the possibility for laser damage to the TO). Temporary transient volume hologram recording parameters: (1) thickness of the silicon wafer slice, (2) energy flux (mJ/cm$^2$) from laser incident upon the hologram plane, (3) the angle θ between object and reference beams, and (4), the ratio of the optical set-up's propagation delay and the duration of the laser's initial optical pulse. Additional optical resolution is available by employing a ½ waveplate in front of the mirror so that incident and reflecting waves do not destructively cancel each other resulting in constructive free carrier field gains. All of the disclosed holographic and photographic films and recording devices can be utilized to enable free carrier, non-chemical development, examination of TO 224.

Two-wavelength holographic image production utilizes the interaction of photovoltages to produce computer generated holograms into voltage patterns on the free-carrier optical element to create a free-carrier image by a visible or UV wavelength which is subsequently read by another wavelength of non-photoelectric generating IR light. Several suitable techniques are described later is in this disclosure for making computer generated holograms of devices and conditions to be holographically tested. The amplitude and phase patterns of the short photogenerating wavelength are optically enlarged so that they correspond directly to the wave front dimensions of the IR optically read hologram. The photogenerating wavelength incident to free-carrier recording medium can be created or generated using, but not limited to, display devices such as cathode, liquid crystals, gas-plasma, of other free-carrier based devices.

Holographic filters in conjunction with holographic (initial polarization recording) mapping of the active optical surface are used to observe by non-invasive polarized light-the facsimile voltage patterns correspond to the optical amplitudes and phases that create the optical wavefront of the holographic image to be displayed. An electron lens or a cathode-ray element can be used to electrically reduce the voltage patterns down and transfer them to another optically active surface to increase image resolution if necessary.

Another approach is to use the following holographic technique of four-wave mixing utilizing free carriers and optical frequency doubling to enable real-time phase-conjunctent (4-wave mixing) examination of TO 224 shown in FIG. 35.

In addition, other films may be used, as desired.

Additional recording mediums also include $Bi_{12}SiO_{20}$ (BSO) or $Bi_{12}GeO_{20}$ (BGO) electro-optic recording devices sensitized to infrared by enclosing the BGO or BSO crystal in a vacuum chamber (having infrared transparent windows) which eliminates air induced resistances to infrared generated photo-currents. These electro-optic devices can enable four-wave mixing or phase conjugate imaging holographic techniques to be applied to the inspection and voltage characterization of TO 224.

IR volume holograms offer to semiconductor voltage test and characterization, the ability to record two different transparencies (each formed by a different recording wavelength) on the same recording medium for subsequent reconstruction without crosstalk. The IR volume hologram recording process can be varied to also enable same-wavelength multiple hologram storage by rotating the recording medium after each exposure. Another suitable technique of essentially multiplexing multiple-images on a single recording medium is by considering the context of color holography; different non-overlapping regions of the same photographic plate can be utilized to record IC (TO 224) holograms of different substrate voltage signals, recording beam angles, wavelengths and beam polarizations. Unlike conventional holographic beam recording techniques where the incident beam of identical polarization is required to reconstruct the hologram, in polarization holography hologram reconstruction requires both the recording wavelength and beam polarization.

Pattern Recognition

Holograms created by computer calculations provide opportunity to generate wavefronts of any prescribed amplitude and phase distribution; this has been demonstrated to be extremely useful for generating three-dimensional images, testing optical surfaces, optical spatial-filtering, laser scanning, as well as pattern recognition of semiconductor devices and substrate voltage waveforms. See FIG. 44.

Production of these holograms employs a discrete Fourier transform to generate the complex amplitude and phase distributions of an array of $N_n \times N_n$ elements. Each element of the image is broken into Fourier coefficients which are computed using the fast Fourier transform (FFT). In holography, the second step follows which produces a transparency (the hologram), which reconstructs the object wave when suitably illuminated. Any dynamic changes in the test object's transparency away from ideal or recorded conditions, such as by defects in the TO 224's circuitry or from prescribed voltage operating parameters, will not result in the reconstruction of the desired object wave or holographic image. Refer to FIG. 36.

Digital Processing

The Fourier transform describe functions into different dimensions or coordinates such as Cartesian to spherical. For example, a function could be represented in the domains of time and frequency. The concept of the 3-D FFT has the safe form as the mathematical representation of utilizing a 2-D FFT utilizing a 1-D FFT. Here, an element $(n_1, n_2, n_3)$ of the 3-D array $(N_1, N_2, N_3)$ would be defined in a 1-D device where:

$$n := N_1 \cdot N_2 \cdot n_1 + N_3 \cdot n_2 + n_3 \tag{20}$$

Similarly, the 3-D FFF can derive from a time sample $x(k_1, k_2, k_3)$ a frequency sample $X(k_1, k_2, k_3)$. The parameter N can be expressed as:

$$N = N_1 \times N_2 \times N_3 \tag{21}$$

Character & Condition Recognition

This property of associative storage has been used for recognizing a character with a hologram, it is applied to recognize the presence of a specific electronic circuit and detect specific voltage levels within the TO 224 circuit. It makes it also possible to use an isochromatic hologram to perform recognition of voltage condition(s) present in temporal voltage waveforms and in selected microelectronic devices and circuits. Like the previous section, this technique is essentially a spatial filtering operation in which the hologram functions as a matched filter. The approach here is to
(1) couple invasive beam(s) to an electrooptic modulator to a prism,
(2) invasively write the spectrally resolved beam(s) to the optically active surface to spatially filter,
(3) read this with a noninvasive beam,
(4) correlate the spatially resolved beam with the hologram (either a fixed hologram or a temporal photogenerated voltage field) with this noninvasive beam which is transmitted to invasively write the temporal photoelectric-pattern's correlation with the hologram on another optically active surface.

An optical system for this is shown in FIG. 36. To produce the matched filter, a transparency of TO's targeted circuit components at the desired voltage levels to be identified is placed in the input plane and a TO hologram of this IR transparency is recorded in the Fourier transform plane using a point reference source. For simplicity, we assume that the complex amplitude of the input place due to the TO 224 transparency is a one-dimensional distribution $$f(y) := \sum_{j=1}^{N} f(y - c_j)_j \tag{22}$$

where $f(y-c_j)j$ is the complex amplitude due to a typical character centered at $c_j$, while that due to the reference source is $\delta(y+b)$.

If we assume linear recording, the transmittance of the hologram can be written as $$t(\eta) := t_o + \beta \cdot T \cdot \begin{bmatrix} [1 + (|F(\eta)|)^2] \ldots + \\ \begin{pmatrix} F(\eta)_\alpha \cdot \exp(-i \cdot 2 \cdot \pi \cdot \eta \cdot b) \ldots + \\ F(\eta) \cdot \exp(i \cdot 2 \cdot \pi \cdot \eta \cdot b) \end{pmatrix} \end{bmatrix} \quad (23)$$

where $$F(\eta) \leftrightarrow f(\eta) \quad (24)$$

The hologram is replaced, after processing, in exactly the same position in which it was recorded and illuminated by single character of the set centered on the axis. A computer generated hologram (CGH) of TO can be created utilizing IC layout tools and experimental data as well as theoretical test conditions can be subsisted in its place. If the amplitude due to the target device and its operating characteristics in the input plane is f(y)1, the transmittance of the hologram is $$H(\eta) := F(\eta)_1 \cdot t(\eta) \quad (25)$$

hence, $$H(\eta) := (t_o + \beta \cdot T) \cdot F(\eta)_1 \ldots + \beta \cdot T \cdot F(\eta)_1 \cdot (|F(\eta)|)^2 \ldots + \\ \beta \cdot T \cdot F(\eta)_1 \cdot F(\eta)_\alpha \cdot \exp(-i \cdot 2 \cdot \pi \cdot \eta \cdot b) \ldots + \\ \beta \cdot T \cdot F(\eta)_1 \cdot F(\eta) \cdot \exp(i \cdot 2 \cdot \pi \cdot \eta \cdot b) \quad (26)$$

Shown is FIG. 36 is an optical system used for experiments in electronic device and voltage condition recognition. In this setup is configured as in FIG. (1) with the embodiment of the lenses and hologram in a single holographic optical element. Input by the TO is by either direct electron-shading of temporal voltage waveforms or voltage displacements in epitaxial circuits. FIG. 44.

The complex amplitude in the input output plane is then the Fourier transform of (26), which is $$h(y) := (t_o + \beta \cdot T) f(y)_1 \ldots + \beta \cdot T \cdot F(y)_1 \cdot \alpha(f(y) \cdot \Delta f(y)) \ldots + \\ \beta \cdot T \cdot F(y)_1 \cdot \Delta f(y) \cdot \alpha \delta(y+b) \ldots + \beta \cdot T \cdot F(y)_1 \cdot \alpha f(y) \cdot \alpha \delta(y-b) \quad (27)$$

the only term of interest in (27) is the last but one on the right hand side which corresponds to the correlation of f(y)1 with all the characters of the set. If we ignore the constant factor βT, this can be expanded as $$f(y)_1 \cdot \Delta f(y) \cdot \alpha \delta(y+b) := \Phi \quad (28)$$

hence $$\Phi := \left( f(y)_1 \cdot \Delta \left( \sum_{j=1}^N f(y-c_j)_j \right) \cdot \alpha \delta(y+b) \right) \quad (29)$$

and $$\Phi := (f(y)_1 \cdot \Delta f(y)_1) \cdot \alpha \delta(y+c_j+b) \ldots + \\ \left( f(y)_1 \cdot \Delta \left( \sum_{j=1}^N f(y-c_j) \right) \cdot \alpha \delta(y+b) \right) \quad (30)$$

If the auto correlation function of the character presented is sharply peaked, the first term on the right hand side of (90) represents a bright spot of light, which is the reconstructed image of the reference source, located at $$y := -c_1 - b \quad (31)$$

The presence of this bright spot in the output plane corresponds to recognition of the targeted microelectronic circuitry and accompanying voltage conditions present as one belonging to the original set. The fact that this image is reconstructed at a distance $-c_1$ from its correct identifies the character presented as $f(y-c_1)_1$.

This basic circuit test condition recognition technique has been extended to permit simultaneous identification of all the circuit test targets and conditions on a single recording medium to allow multiple device and condition tests to be carried out in parallel. Shown in FIGS. 37a and 37b are the system components.

When real-time operation is not required, a more direct technique can be used. This involves the use two transparencies in the input plane. One of these f(y+b)1 is a transparency of the character to be located, while the other f(y+b)2 is a transparency of the recording medium of the circuits and voltage conditions to be searched. The transmittance of the Fourier hologram formed with these two sources is then $$t(\eta) := t_o \ldots + \beta \cdot T \cdot \begin{bmatrix} (|F(\eta)_1|)^2 \ldots + \\ (|F(\eta)_2|)^2 \ldots + \\ \alpha F(\eta)_1 \cdot F(\eta)_2 \cdot \exp(-i \cdot 2 \cdot \pi \cdot \eta \cdot b) \ldots + \\ F(\eta)_1 \cdot \alpha F(y)_2 \cdot \exp(i \cdot 2 \cdot \pi \cdot \eta \cdot b) \end{bmatrix} \quad (32)$$

where $$F(\eta)_1 \leftrightarrow f(\eta)_1 \quad (33)$$

and $$F(\eta)_2 \leftrightarrow f(\eta)_2 \quad (34A)$$

If this hologram is illuminated with a plane wave, the complex amplitude in the output plane is proportional to the Fourier transform of t(η). As before, the only term of interest is the third within the square brackets which, if we neglect a constant factor, is $$\zeta(F(\eta)_1 \cdot F(\eta)_2 \cdot \exp(-i \cdot 2 \cdot \pi \cdot \eta \cdot b)) := (f(y)_1 \cdot \Delta f(y)_2) \cdot \alpha \delta(y+b) \quad (34)$$

If $F(y)_2$ is identical to $F(y)_1$, this term will result in a bright auto correlation peak at y=−b. If, however, $F(y)_2$ contains more than one such character $f(y-c_1)_1$, identical with $f(y)_1$ but located at different positions and equal number of auto correlation peaks will be formed at locations $y=-b-c_1$, corresponding to the centers of these patterns.

In isochromatic electron-shading, this approach is very useful for providing pattern and condition recognition both continual and real-time monitoring (using non-invasive light) for targeted devices and operating conditions in either temporal voltage waveforms, analogue and digital operations. This can be used to initiate various software and hardware functions such as: initiating both "stop" and "load" codes, program and node addresses, and initiating "link" operations for individual node's (both star and cascade architecture's) in parallel processors. The limiting factors on system performance and operating bandwidth, are the physical dimensions hence, optical transit time, the physical dimensions of the voltage waveforms, and the compactly of the holographic storage medium.

Data-Access Techniques

Local optical archival of information offers virtual immunity of binary code for computers from degradation. For IR-based holography and optoelectronic devices, holography provides storage opportunities to similarly record and preserve the spectral and spatial integrity of light used for optical filters and waveguides.

The simplest approach of optical access employs a space variant approach. Here, the location and position(s) of the input field determines the composition of the output field from the hologram. The basic properties of such a system has been investigated for its applications in data processing.

To carry out a two-dimensional linear space-variant operation it is necessary to have a system having impulse response is a function of four independent variables (two more than a normal optical system). Two methods based on holographic techniques are described here.

The first is a simple method to perform the coordinate transformation $$x := G_1 \cdot (x,y) \tag{35}$$

$$y := G_2 \cdot (x,y) \tag{36}$$

This transformation is effected with the optical shown in FIG. (b), which uses a computer-generated hologram whose spatial frequencies at any point (u,v) are $$s_u := G_1 \cdot \frac{(x, y)}{\lambda f} \tag{37}$$

and $$s_v := G_2 \cdot \frac{(x, y)}{\lambda f} \tag{38}$$

Light from a point in the input plane having coordinates (u,v) is then diffracted at an angle such that an image of this point is formed in the back focal plane of the lens $L_2$ at a point whose coordinates (x,y) satisfy (35) and (36).

More general operations can be realized, in principle, by a hologram array. Each input pixel is backed by a hologram element which generates the desired response for the targeted device and voltage conditions. However, there are serious limitations on the number of devices and conditions which can be handled in this fashion due to the limited resolution of hologram elements when targets are made very small.

Another method of obtaining a space-variant impulse response is to use a thick holographic element such as shown in FIG. 38. This filter contains a number of superimposed holograms, each recorded with a plane reference wave incident at different angle. Each point on the input plane gives rise to a plane wave whose angel of incidence on the holographic filter depends on the coordinates of this point and, hence, generates and impulse response determined by the corresponding hologram. However, to avoid cross-talk, the input field must contain only a small number of input points, since all points on a cone satisfy the Bragg condition.

In FIG. 38 is an illustration showing the optical components for coordinate transformation and beam pathways to produce a coordinate transformation. In this approach each pixel of input produces a desired response for that pixel, data or bus register.

Higher selectivity can be obtained by the use of coded reference beams. For this, a diffuser is inserted into the input plane, and each of the holograms in the filter is recorded with a reference derived from a small area on this diffuser. Since the auto correlation functions of the reference beam are sharply peaked, each point in the input produces an output from the corresponding holographic filter. The diffuse background arising from the cross-correlation functions of the elementary diffusers is minimized by using a thick recording medium.

Holographic Image Generation

Holograms or computer generated holograms surface mounted on either frontside or backside can be made of IR absorbing materials to form transmission holograms, in the case of reflection-probing of TO 224 IR reflective materials can be utilized on TO 224's backside so that an interference pattern of the IC's internal circuitry and voltage topography can be determined and resolved as to be in-phase or out-of-phase with the computer generated hologram. See FIG. 44 that illustrates the placement of computer generated holograms and backside probing of IC circuitry where the circuitry is exposed to water. Options for mounting the hologram are (1) on the back substrate of the TO 224,
(2) mounted on a top layer substrate over the circuitry, or
(3) integrated within the TO's device's electronic circuitry by employing suitable semiconductor films which appropriately absorb, reflect, or refract IR wavelengths as well as satisfying Bragg conditions.
(4) These holograms can be created directly on the TO 224, or in proximity to, by conventional lithography techniques such as using photomask reduction, ion-beam, e-beam and cyclotronic radiation sources, as well as implementation in free-carrier recording mediums.

Holograms created by computer calculations provide opportunity to generate wavefronts of any prescribed amplitude and phase distribution; this has been demonstrated to be extremely useful for generating three-dimensional images, testing optical surfaces, optical spatial-filtering as well as laser scanning. Production of these holograms employs a discrete Fourier transform to generate the complex amplitude and phase distributions of an array of $N_n \times N_n$ elements. Each element of the image is broken into Fourier coefficients which are computed using the fast Fourier transform (FFT). In holography, the second step follows which produce a transparency (the hologram) which reconstructs the object wave when suitably illuminated.

Many techniques have been developed for creating computer generated holograms (CGHs) and holographic lens elements (HLEs). CGHs are representations of the image's optical diffraction structure that has been calculated from either a mathematical description (e.g., Fourier analysis) of the wavefront or from samples. Several methods exist for creating and calculating HLEs and CGHs.

In conventional approaches to performing CGH calculations, the amplitude and relative phase of waveforms are plotted and optically reduced and transferred to holographic film. Illumination of the developed film creates the three dimensional image of the object calculated for viewing. Similar rules apply for creating HLEs such as concave, convex, cylindrical and achromatic lenses, prisms, beam gratings, etc. See FIGS. 19 & 20.

Replicating CGH plots by using a shorter (½ or ¼ of the IR wavelength) photogenerating wavelength so that free-carrier voltage waveforms or patterns approximating optically by a 2-times enlargement of the image. This technique eliminates the need for photo reduction of amplitude and wave phases since the voltage wave patterns directly correlate to IR and UV optical interference waveforms. Also, the reflection brightness value (+70%) of the metal mirror surface is greater than the light transmission values of presently available holographic transmission films (1% to 10%).

A Binary Detour-Phase Hologram (see FIG. 42) has only two levels-either zero or one, the binary hologram is easily computed and projected onto the optically active projection surface by an invasive optical beam. Projection does not require the use of a reference wave or bias other than non-invasive polarized beam utilized to read the surface.

To produce the hologram, the surface area of the optically active projection surface is divided into array of N×N cells. Each cell corresponds to the N×N coefficients of the discrete Fourier transform of the complex amplitude of the in the object plane. Each Fourier coefficient is, then represented by a single transparent area within the corresponding cell, whose site is determined by the modulus of the Fourier coefficient. This method derives its name from the fact that a shift of the transparent area in each cell results in light traveling a longer or short path to the reconstructed image. The effect here is achieved through the modulation of the TO 224 material's polarization phase or in the refractive of the image. An example showing both the cells and the image of a typical binary detour-phase hologram of the letters ICO is shown in FIG. 41B. The first-order images are those above and below the central spot; in addition, higher-order images are seen due to nonlinear effects.

This method of encoding the phase works, by a rectangular opening (a×b) in an opaque sheet (the hologram) centered on the origin of the coordinates, as shown on FIG. 43, and illuminated with a uniform coherent polarized beam of light of unit amplitude. The complex amplitude $U(x_i, y_i)$ at a point $(x_i, y_i)$ in the diffraction pattern forced in the far field is given by the Fourier transform of the transmitted amplitude and is $$U \cdot (x_1, y_i) := a \cdot b \cdot \text{sinc}\left(\frac{a \cdot x_1}{\lambda z}\right) \cdot \text{sinc}\left(\frac{b \cdot y_i}{\lambda z}\right) \tag{39}$$

Illustration showing the configuration of the cells in a binary detour-phase hologram shown in FIG. 39. The positions of the cells are calculated in accordance to equations (39), (40) and (41); where:

$$\text{sinc}(x) := \frac{\sin \cdot \pi \cdot x}{\pi \cdot x} \tag{40}$$

We now assume that the center of the rectangular opening is shifted to a point $(\Delta x_o, \Delta y_o)$ and the sheet is illuminated by a plane wave incident at an angle. See FIG. 43. If the complex amplitude of the incident wave at the sheet is $\exp[i(\alpha \Delta x o + \beta \Delta y o)]$, the complex amplitude of the diffraction pattern becomes:

$$U \cdot (x_1, y_i) := \tag{41}$$
$$a \cdot b \cdot \text{sinc}\left(\frac{a \cdot x_1}{\lambda z}\right) \cdot \text{sinc}\left(\frac{b \cdot y_i}{\lambda z}\right) \cdot \exp\left[\begin{array}{l} i \cdot \left(\alpha + \frac{2 \cdot \pi \cdot x_1}{\lambda z}\right) \cdot \Delta x_o \ldots + \\ i \cdot \left(\beta + \frac{2 \cdot \pi \cdot y_i}{\lambda z}\right) \cdot \Delta y_o \end{array}\right]$$

continuing on ...

$$U \cdot (x_1, y_i) := a \cdot b \cdot \text{sinc}\left(\frac{a \cdot x_1}{\lambda z}\right) \cdot \text{sinc}\left(\frac{b \cdot y_i}{\lambda z}\right) \cdot \tag{42}$$
$$\exp[i \cdot (\alpha \cdot \Delta x_o + \beta \cdot \Delta y_o)] \cdot \exp\left[i \cdot \left[\begin{array}{l} \frac{2 \cdot \pi}{\lambda z} \cdot x_1 \cdot \Delta x_o \ldots + \\ \frac{2 \cdot \pi}{\lambda z} \cdot y_i \cdot \Delta y_o \end{array}\right]\right]$$

If $ax_1 < \lambda z$, $byi < \lambda z$, equation (42) reduces to:

$$U \cdot (x_1, y_i) := \exp[i \cdot (\alpha \cdot \Delta x_o + \beta \cdot \Delta y_o)] \cdot \exp\left[i \cdot \left[\begin{array}{l} \frac{2 \cdot \pi}{\lambda z} \cdot x_1 \cdot \Delta x_o \ldots + \\ \frac{2 \cdot \pi}{\lambda z} \cdot y_i \cdot \Delta y_o \end{array}\right]\right] \tag{43}$$

If then, the computed complex amplitude of the object wave at a point $n\Delta x_o, m\Delta y_o$ in the hologram plane is $$o(n\Delta x_o, m\Delta y_o) := |o(n\Delta x_o, m\Delta y_o)| \cdot \exp(i\phi(n\Delta x_o, m\Delta y_o)) \tag{44}$$

its modulus and phase at this point can be encoded, as shown in equation (44), by making the area of the opening located in this cell equal to the modulus so that $$a \cdot b := |o(n\Delta x_o, m\Delta y_o)| \tag{45}$$

and displacing the center of the opening from the center by an amount given by the relation $$\delta x_{nm} := \left(\frac{\Delta x_o}{2 \cdot \pi}\right) \cdot \phi\left(\frac{n\Delta x_o}{m\Delta y_o}\right) \tag{46}$$

To show the validity of this method of encoding, we consider the complex amplitude in the far field due to this opening, which is obtained by summing the complex amplitudes due to all the N×N openings, is therefore $$U(x_1, y_i) := \tag{47}$$
$$\sum_{n=1}^{N} \sum_{m=1}^{N} |o(n\Delta x_o, m\Delta y_o)| \cdot \exp(i\alpha \delta n_{nm}) \cdot \exp\left(i\left(\begin{array}{l} \alpha n\Delta x_o \ldots + \\ \beta m\Delta y_o \end{array}\right)\right) \cdot$$
$$\exp\left[\left(\frac{i2\pi}{\lambda z}\right) \cdot \left(\begin{array}{l} nx_1 \cdot \Delta x_o \ldots + \\ my_i \cdot \Delta y_o \end{array}\right)\right] \cdot \exp\left[\left(\frac{i2\pi}{\lambda z}\right) \cdot \delta x_{nm}\right]$$

If the dimensions of the cells and the angle of illumination are chosen so that $$\alpha \Delta x_o := 2 \cdot \pi \tag{48}$$

$$\beta \Delta y_o := 2 \cdot \pi \tag{49}$$

and $$\delta x_{nm} := \lambda z \tag{50}$$

equation (47) reduces to $$U(x_1, y_i) := \sum_{n=1}^{N} \sum_{m=1}^{N} |o(n\Delta x_o, m\Delta y_o)| \cdot \tag{51}$$
$$\exp[i\phi((n\Delta x_o, m\Delta y_o)] \cdot \exp\left[\left(\frac{i2\pi}{\lambda z}\right) \cdot \left(\begin{array}{l} nx_1 \cdot \Delta x_o \ldots + \\ my_i \cdot \Delta y_o \end{array}\right)\right]$$

This is the discrete Fourier transform of the computed complex amplitude in the hologram plane, or in other words, the desired reconstructed image.

Illustration of a typical cell in a binary detour-phase hologram showing the configuration of a single cell in the binary detour-phase hologram shown in FIG. 40A. The spatial relationships denoted by the variables are utilized in equations (41) through (51).

Binary Detour-Phase Holograms

Binary detour-phase holograms have several attractive features. It is possible to use a simple pen-and-ink plotter to prepare the binary master, and problems of linearity do not arise in the photographic reduction process. Their chief disadvantage is that they are very wasteful of plotter resolution, since the number of addressable plotter points in each cell must be large to minimize the noise due to quantization of the modulus and the phase of the Fourier coefficients. See FIG. 40C. When the number of quantization levels is fairly large, this noise is effectively spread over the whole image field, independent of the form of the signal. However, when the number of phase-quantization levels are small, the noise terms become shifted and self-convolved versions of the signal, which are much more annoying.

Gunary Binary Detour-Phase Holograms

In this method, as shown in FIG. 42, rather than producing a single transparent area with a variable size and position in the cell, corresponding to each Fourier coefficient, a combination of p×q transparent and opaque sub cells is used. This method permits finer quantization of both amplitude and phase, resulting less noisy images. However, it is necessary for the computer to identify the proper binary pattern out of the $2^{(p \times q)}$ possible patterns that is the best approximation to the desired complex Fourier coefficient, before plotting it.

Generalized Binary Detour-Phase Holograms

FIG. 40a shows a typical cell in a generalized binary detour-phase hologram and the arrangement of elements within a typical cell in a generalized binary detour-phase hologram.

Phase Randomization

The Fourier transforms of the wavefronts corresponding to simple electronic circuits and their voltage levels have very large dynamic ranges, because the coefficients of the dc and low-frequency terms have much larger moduli than those of the high-frequency terms. This results in nonlinearity because of the limited dynamic range of the recording media.

To minimize this problem, it is convenient, where the phase of the final reconstructed image is not important, to multiply the complex amplitude at the original sampled object points by a random phase factor before calculating the Fourier transform. In transmission holography, this is optically analogous to placing a diffuser in front of the object transparency and has the effect of making the magnitudes of the Fourier coefficients much more uniform, as shown in FIG. 41a. However, the reconstructed image, FIG. 41b, is then modulated by a speckle pattern.

The Kinoform

In the case where the object is diffusely illuminated, the magnitudes of the Fourier coefficients are relatively unimportant, and the object can be reconstructed using only the values of their phases. This led to the concept of a completely different type of hologram called a kinoform.

This a computer generated hologram in which all the cells are completely transparent so that the moduli of all the Fourier coefficients are arbitrarily set equal to unity, and only the phase of the transmitted light is controlled in accordance with the phase of the computed Fourier coefficients. Thus, the amplitude transmittance trim of the cell corresponding to a Fourier coefficient with modulus $O_{nm}$ and phase. $\phi_{nm}$ would be:

$$t_{nm} := \exp(i\phi_{nm}) \qquad (52)$$

However, to simplify recording, integral multiples of $2\pi$ radians are subtracted from the computed phases, so that they vary only between 0 and $2\pi$ over the entire kinoform.

Kinoforms have the advantage that they can diffract all the incident light into the final image. However, to achieve this, care is necessary to ensure that the phase matching condition expressed by (52) is satisfied accurately. Any error in the recorded phase shift, as altered by subsequent non-functionalities from the ideal test values of the TO 224, results in light diffracted into the zero order which can spoil the image and thus signal the presence of test failure conditions being present in the TO 224.

FIG. 41a shows an example of a Kinoform, a computer-generated amplitude phase hologram. In this approach, the magnitudes of the Fourier coefficients are relatively unimportant since the computer calculates the image illustrated in FIG. 41b from the reconstructed values of the phases of the hologram shown in FIG. 41a. The hologram's phases are first plotted using a printer, then it is photo-reduced by conventional lithography techniques or directly etched by ion-beam, e-beam, or cyclonic radiation sources, or by free-carrier medium for illumination of the image through a diffuser. This technique has been applied to three-dimensional image generation.

Computer Generated Interfergrams

Problems can arise with detour-phase holograms when encoding wavefronts with large phase variations since, when the phase of the wavefront moves through a multiple of $2\pi$ rad, the two apertures near the crossover may overlap. This has led to an alternative approach to the production of binary holograms based on the fact that an image hologram of a wavefront that has no amplitude variations is essentially similar to an interferogram, so that the exact locations of the transparent elements in the binary hologram can be determined by solving a grating equation which correlates with the TO 224 circuitry and operating voltage parameters of the test. See FIG. 44.

Different methods can be used to incorporate information on the amplitude variations in the object wavefront into the binary fringe patterns. In one, the two-dimensional nature of the Fourier transform hologram used is used to record the phase information along the x-direction, while the fringe heights in the y-direction are adjusted to correspond to the amplitude. In another, the phase and the amplitude are recorded by the position and width of the fringes along the direction of the carrier frequency, while in the third, the phase and amplitude of the object wave are encoded by the superposition of two phase-only holograms.

This approach can be duplicated by plotter and photo reduction, or conventional photolithographic, techniques as well as implementation in a free-carrier recording medium. Here the computer calculates the hologram at two levels of its amplitude transmittance-either one or zero (top). The reconstructed image appears in the lower illustration FIG. 40b.

Creating the voltage patterns with invasive light is accomplished by optically retrieving indexed patterns (matrices) that correspond to x, y, and z, coordinates of the holograph image field to be generated as well as Fourier transform functions. It is important to note in creating optical grating patterns metal mirror's photo-active surface using voltage waveform patterns, that the wavelength of electrons is less than 100,000 times shorter than visible light so no photo-reduction is necessary. The electron shadow that is created on the photovoltaic cell proportionally corresponds 1:1 to the interference lines of the real image upon the electro-optic surface. In this application, the isochromatic element serves as a mapping filter of the voltage waveforms.

One approach to display a holographic image for viewing is to generate multiple voltage patterns so that they are transposed beside each other in such a way that they bisect the active optical surface and interfere with each other in parallel to provide a parallax composite image.

In effect, the image's optical targets or input registers can also serve as index keys to retrieve multiple stored optical patterns that serve as precalculated optical patterns (copyrightable). These elements serve as templates to create the complex features (multiple Bragg cell conditions present) of the electro-static surface topographic electro-optic surface that goes into making three dimensional holographic images for display within a defined field (e.g., 6 mm [width]×3 μm [depth]).

The inventor then realized that the ability to resolve supra resolution in CCD detector devices disclosed in FIGS. 14A/14B/14C/etc. by using holographic microscopy techniques enabled the creation and development of new microwave frequency optoelectronic discrete devices.

The inventor then realized that the ability to resolve supra resolution in CCD detector and sensing devices previously disclosed in FIGS. 14A/14B/14C/etc. by using holographic microscopy techniques, enabled the creation and developing of new high frequency microwave multivalued discrete optoelectronic devices. The large (roughly $26^2$ μm) detector pixels in the average CCD device contrast with the present state-of-the-art in semiconductor microelectronic line and device (e.g., 0.014 μm and the pending 25 nm) lithographic techniques. The inventor then realized that the dimensions of high frequency microwave devices are limited not by the available lithography but, rather by the resonance of the electromagnetic waveform or carrier signal itself which propagates through the individual electronic components in the microwave device.

In contrast to conventional lithography techniques and design conventions where more expitaxal devices are packed closer together onto a single chip to form more complex semiconductor devices, the inventor realized that the solution to developing higher operating frequencies was not in creating more discrete expitaxal devices but, instead creating individual devices which would have more functionality if one could be able to resolve and alter the dynamic free carrier structure within a single, simple or complex expitaxal device. See FIG. 15B and FIG. 44. Instead of each binary expitaxal device modulating between two voltage levels, the device would be host to an array of voltage patterns. See FIG. 33 and discussion above regarding FIG. 33. These discrete devices can be subsequently joined operationally together to form complex devices and systems which are disclosed later. By fashioning components in this manner it would be possible to create devices which in term would be equivalent to billions and/or trillions of conventional expitaxal devices are simulated within the device's free-carriers as either digital words or matrices, analogue waveforms, or symbolic characters. Timing of the free carrier patterns is controlled by microwave signal waveforms within the circuit and by discrete infrared (semiconductor materials) and ultraviolet (free-metal materials) holographic filters, beamsplitters, and holographic optical elements disclosed earlier in FIG. 44. The free carrier patterns can be invasively written using specific photovoltaic wavelengths of light to the device's material, or by other sources of electromagnetic radiation such as x-rays, UV-light, magnetic fields, and other circuit devices in proximity or working in conjunction to the device. The functional electrical characteristics and physical dimensions of the free-carrier host device determine its operating frequency, phase cycle, sampling period window, stability or lifetime of the free-carrier pattern(s), and subsequent rewrite cycle.

The inventor then realized that the electrical characteristics at p-n junctions would serve as an effective free-carrier host device.

Forward-Bias Processes
Band-to-Band Tunneling
Photon-Assisted Tunneling
Injection
Tunneling to Deep Levels
Band Filling
Optical Refrigeration—optical pulse modulation and control systems for temperature control, good until approximately 30° K.
Hetrojunctions
Zener Breakdown
Avalanche Breakdown
Photoelectric Emission
Effect of Surface Conditions
Photovoltaic Effects
The solar or fast photocell
The Schottkey Barrier
Photovoltaic Effects at the Schottkey Barrier
Bulk Photovoltaic Effects—Dember Effect
Photomagnetoelectric Effect—useful for supra-resolution of magnetic fields in MRI devices.
Angular Dependence of Photovoltaic effects—useful for multivalue logic devices with multiple inputs and outputs on a single substrate and on multi-substrate systems.
"Photoangular Effect"—useful for multivalue logic devices with multiple inputs and outputs on a single substrate and on multi-substrate systems.
Optically Induced barriers
Photovoltaic effect at a graded energy gap
Photopiezoelectric Effect
Macro-device host circuits—utilize microwave multivibrator and oscillator electronic circuits and macro devices having optical path and circuit phase/mode matching.
SAW devices—signal processing and conversion
Optical associative memories
Optical pattern & condition recognition
UV reads free metals, photowrites to IR Four-wave mixing in free-carrier mediums which target character and voltage specific conditions In infrared stimulated luminescence, carriers can be excited out of traps by optical excitation. Since in most semiconductors the depth of the trap is less than 1.5 eV, the excitation can be obtained by infrared illumination. After the carrier is excited out of the trap, it makes a radiative transition, emitting a photon $hvE_t$. Hence after the semiconductor crystal has been "pumped" at low temperature, the luminescence which occurs when the traps are emptied by IR radiation. The depth of the traps are determined by the spectrum of the incident optical radiation. The inventor then realized that if a material such as ZnS were used as an IR optical receiver for reflective or transmitted radiation from a free-carrier host device of a free-carrier host array, visible, invasive or photogenerating, radiation luminescence can be stimulated at low temperatures when the material is illuminated with 1.2 μm radiation. The photogenerating radiation can be subsequently directed back to free-carrier host to invasively write a free-carrier pattern which function as an optical register hold, or can be directed as shift register carry-over to another free-carrier host device. The invasive beam from the ZnS surface can also serve as an object beam to a holographic associative memory and/or holographic pattern recognition device which would subsequently write an invasive free-carrier pattern which would subsequently as a logical or analogue function as it interacts with other free-carrier fields resident with the host device. The inventor then realized that IR quenching of luminescence can be accomplished in some materials during the afterglow of phosphorescence or during excitation. Quenching of illumiscence can result from the application of an electric field, from heating, or from illumination with infrared radiation. Depending upon the characteristics of the material, the radiative transition may become filled, or a non-radiative path may become available. In ZnS a broad band of radiation at about 0.75 µm always quenches the flourence and phosphorescence; but at 1.2 µm, which always quenches the luminescence at room temperature, it can also stimulate the luminescence at 77° K. Applying an electric field in conjunction with IR radiation provides better timing control of the ZnS material in integrating it within a free-carrier device system or an optoelectronic array.

BRIEF SUMMARY OF THE INVENTION

The present invention relates to improved voltage test systems, improved electronic devices and sensors, semiconductor manufacturing, and signal processing.

The invention claimed is:

1. A structure including a semiconductor material comprising:
   a target portion and a second portion, the target portion having a first feature when at least one of the following occurs: an external force or the effects thereof received by the second portion of the structure and an internal condition or the effects thereof occurs in the target portion;
   at least one or more test conditions, each test condition determined to test stress and circuit characteristics within the semiconductor or free-metal material occurring in the first feature of the target portion; and
   a plurality of test conditions shaped and arranged to be simultaneously incident to the target portion comprising the combination of at least one or more holograms, interferograms, holographic optical elements, free-carrier holograms, isochromatic holograms, phase-conjugate holograms, four-wave mixing phase holograms, or embossed holograms, or of any combination thereof;
   each test condition shaped and located to produce a first optical interference or primary interference pattern when the target portion and the corresponding interference pattern of the holograms, interferograms, holographic optical elements, free-carrier holograms, isochromatic holograms, phase-conjugate holograms, four-wave mixing phase holograms, or embossed holograms are exposed to non-invasive illumination and when the target portion has the corresponding at least first feature.

2. The structure of claim 1 wherein the hologram, interferogram, holographic optical element, free-carrier hologram, isochromatic hologram, phase-conjugate hologram, four-wave mixing phase hologram, or embossed hologram is shaped and located to produce a second optical interference pattern when the target portion and the hologram, interferogram, holographic optical element, free-carrier hologram, isochromatic hologram, phase-conjugate hologram, four-wave mixing phase hologram, or embossed holograms are exposed to non-invasive illumination without the first feature occurring, the first optical interference pattern having a first magnitude and the second optical interference pattern having a second magnitude smaller than the first magnitude.

3. The structure of claim 1 wherein the hologram, interferogram, holographic optical element, free-carrier hologram, isochromatic hologram, phase-conjugate hologram, four-wave mixing phase hologram, or embossed holograms is shaped and located to produce the first optical interference pattern as one of the following: one dimensional, two dimensional, three dimensional, isochromatic, or four-wave mixing or phase-conjugate.

4. The structure of claim 1 wherein the hologram, interferogram, holographic optical element, free-carrier hologram, isochromatic hologram, phase-conjugate hologram, four-wave mixing phase hologram, or embossed holograms is shaped according to a Fast Fourier Transform of the first feature of the target portion shaped and located by at least: wavelength, polarization, or angular alignment of the noninvasive coherent illumination of the hologram, interferogram, holographic optical element, free-carrier hologram, isochromatic hologram, phase-conjugate hologram, four-wave mixing phase hologram, or embossed holograms with respect to the target portion for at least one or more target portions under test.

5. The structure of claim 1 wherein the at least one or more hologram, interferogram, holographic optical element, free-carrier hologram, isochromatic hologram, phase-conjugate hologram, four-wave mixing phase hologram, or embossed holograms is shaped and located to receive the non-invasive illumination as one of the following: a laser beam, a coherent infrared transmission, and a uniform transmission.

6. The structure of claim 1 wherein the hologram, interferogram, holographic optical element, free-carrier hologram, isochromatic hologram, phase-conjugate hologram, four-wave mixing phase hologram, or embossed holograms is shaped and located to receive the non-invasive illumination as a coherent ultraviolet light or a combination of a coherent UV and a coherent IR light beams, and wherein the grating and target portion comprise a free metal.

7. The structure of claim 1 wherein the second portion is the target portion.

8. The structure of claim 1 wherein the hologram, interferogram, holographic optical element, free-carrier hologram, isochromatic hologram, phase-conjugate hologram, four-wave mixing phase hologram, or embossed holograms is shaped and located to receive the non-invasive illumination as one of the following: transmitted illumination and reflected illumination.

9. The structure of claim 1 wherein the target portion and the second portion are configured such that the external force or the effects thereof initiates the internal condition.

10. The structure of claim 9 wherein the target portion and the second portion are configured such that the second portion receives the external force or the effects thereof as at least one of the following: a radio wave, a microwave, an electromagnetic field, an electromagnetic signal, a specific or change in a carrier or electron density, a magnetic field, an x-ray radiation, a gravity wave, a plasmon, a subatomic particle radiation, a pressure, a temperature, a photo-generated carrier, free-carrier, an incident electron beam, an incident ion-beam, a bioelectric field, a chemical substance, an ultraviolet light, and a substance or plasma placed adjacent to a surface.

11. The structure of claim 9 wherein the target portion and the second portion are configured such that the internal condition, or the effects thereof, occurs in the target portion as at least one the following: a voltage pattern, a photocurrent, a specific photo carrier, a change in photo-conduction or photo-resistance, a bioelectric voltage, an electromagnetic field, an incident particle radiation particle or beam, a pattern of change in electrical resistance or change in conductivity, a specific electron or carrier density, a signal or radio wave or microwave transmitted through a circuit, a temporal voltage wave form, a plasmon, an analog operation of a circuit, a digital operation of a circuit, a digital word, a digital matrix, an analog waveform, and a symbolic character.

12. The structure of claim 1 wherein the target portion includes at least one of the following: a metalized layer, an optical surface, an interior structure, and a semiconductor layer.

13. The structure of claim 1 wherein the second portion is configured such that the second portion receives the external force, or the effects thereof, as at least one of the following: a radio wave, an electromagnetic field, an electromagnetic signal, a magnetic field, an x-ray radiation, a gravity wave, a subatomic particle radiation, a pressure, a plasmon, a temperature, a specific photogenerated carrier, an incident electron, an incident ion-beam, a bioelectric field, a chemical substance, an ultraviolet light, and a substance or plasma placed adjacent to surface.

14. The structure of claim 1 wherein the target portion is configured such that the internal condition or the effects thereof, occurs in the target portion as at least one of the following: a voltage pattern, an electron density, a photocurrent pattern, an pattern of change in electrical resistance, a signal or radio wave or microwave transmitted through a circuit, a temporal voltage wave form, a photo-injected carrier, a change in photo induced resistance, a photo-induced resistance, a change in plasmon density, a electron density or change therein, an analog operation of a circuit, a digital operation of a circuit, a digital word, a digital matrix, an analog waveform, and a symbolic character.

15. The structure of claim 1 wherein the target portions are configured such that the first feature of each target portion comprises at least one of the following: a refractive index, a volume or area, a polarization, an optical interference pattern comprising one or more optical wavelengths, a polarization of one or both wavelengths, a birefringence, an amplitude, and a phase.

16. The structure of claim 1 wherein the hologram, interferogram, holographic optical element, free-carrier hologram, isochromatic hologram, phase-conjugate hologram, four-wave mixing phase hologram, or embossed hologram is shaped and located to generate wave fronts of a desired wavelength amplitude and phase distribution or polarization for the first optical interference pattern.

17. The structure of claim 1 wherein the target portion includes an optical surface or an internal optical structure.

18. The structure of claim 1 wherein the hologram, interferogram, holographic optical element, free-carrier hologram, isochromatic hologram, phase-conjugate hologram, four-wave mixing phase hologram, or embossed holograms is shaped so that the first optical interference pattern is based upon optical spatial-filtering, four wave mixing, or phase-conjunction imaging of the first feature or by computer analysis of a plurality of stored interferometric images of the target area, the internal or external stress, or first feature.

19. The structure of claim 1 wherein the structure includes a substrate portion having temporal voltage, carrier or electron-density waveforms, or the effect thereof or plasma or plasmon or free carrier waveforms, and the effects thereof and wherein the first optical interference pattern is based upon pattern recognition of the first feature and the voltage, carrier or electron-density waveforms, or the effect thereof or plasma or plasmon or free carrier waveforms, and the effects thereof in the substrate portion of the structure.

20. The structure of claim 1 wherein the hologram, interferogram, holographic optical element, free-carrier hologram, isochromatic hologram, phase-conjugate hologram, four-wave mixing phase hologram or embossed hologram is shaped and positioned such that the first optical interference pattern is at least one of the following: constructive, destructive, in phase, out of phase, isochromatic, phase-conjugate, and four-wave mixing.

21. The structure of claim 1 wherein the hologram, interferogram, holographic optical element, free-carrier hologram, isochromatic hologram, phase-conjugate hologram, four-wave mixing phase hologram, or embossed holograms is shaped by at least one of the following: by direct recording of a sample image or a plurality of recorded interferometric images of the target area, the internal or external stresses, the effects thereof, or of first feature, and by computer generation of the holograms, and comprising thin, phase, thin-amplitude, thin-phase, and thin-phase-reflection holograms, volume- and volume-transmission holograms, volume reflection holograms, interferograms, holographic optical elements, free-carrier holograms, isochromatic holograms, phase-conjugate holograms, four-wave mixing phase holograms, or embossed holograms.

22. The structure of claim 1 further comprising a holographic lens element or an embossed hologram positioned to receive the first optical interference pattern.

23. The structure of claim 1 wherein the target portion includes at least one of the following: an optical surface of the structure, a printed image, wherein the structure further includes circuitry, an internal structure, and the target portion is integrated with the circuitry, a portion of the structure that is on a backside of the structure, a portion of the structure that is adjacent a metalized layer, a portion of the structure that is incorporated into a metalized layer, a portion of the structure that is on a front side of the structure, wherein the structure further has a circuitry layer and the target portion further includes a portion of the structure that is adjacent the circuitry layer, wherein the structure further has a circuitry layer and the target portion is at least partially incorporated into the circuitry layer.

24. A structure including a semiconductor material, the structure having a thickness, or a volume the structure comprising:
    at least one or more target portions, each test portion comprising a corresponding secondary portion, the target portion having at least one or more first features when at least one of the following occurs: an external force, or the effects thereof, is received by the second portion of the structure and an internal condition occurs in the target portion;
    at least one or more test conditions, or the effects of the test conditions, each test condition shaped and determined by a plurality of electronically stored interferometric images, the test condition determined to test stress and circuit characteristics within the semiconductor or free-metal or an electro optic material or in a material having combination thereof occurring in the first feature of the target portion;
    at least one or more first holograms, interferograms, holographic optical elements, free-carrier holograms, isochromatic holograms, phase-conjugate holograms, four-wave mixing phase holograms, or embossed holograms; and a plurality of stored electronic interferometric images of the target portion to determine and shape the elements which comprise the holograms, interferograms, holographic optical elements, free-carrier holograms, isochromatic holograms, phase-conjugate holograms, four-wave mixing phase holograms, or embossed holograms; and, which comprise the elements of the secondary hologram, interferogram, holographic optical elements, free-carrier holograms, isochromatic holograms, phase-conjugate holograms, four-wave mixing phase holograms, or embossed holograms;

each optical element or optical format being arranged and spaced apart through the thickness of the structure from the first or primary grating, the first or primary hologram, interferogram, holographic optical element, free-carrier hologram, isochromatic hologram, phase-conjugate hologram, four-wave mixing phase hologram, or embossed holograms and the plurality of one or more secondary hologram, interferogram, holographic optical element, free-carrier hologram, isochromatic hologram, phase-conjugate hologram, four wave-mixing phase hologram, or embossed holograms, a secondary hologram, interferogram, holographic optical element, free-carrier hologram, isochromatic hologram, phase-conjugate hologram, four-wave mixing phase hologram, or embossed hologram, each optical element being shaped and located to produce a first optical interference pattern when the target portion and the hologram, interferogram, holographic optical element, free-carrier hologram, isochromatic hologram, phase-conjugate hologram, four-wave mixing phase hologram, embossed hologram is exposed to non-invasive illumination and when the target portion has the first feature or the effects of the stress or stresses under test thereof.

25. A system comprising:

a structure comprising including a semiconductor material, the structure including at least one or more target portions, each with a corresponding secondary portion, the target portion having a first feature when at least one of the following occurs: an external force, or effects thereof, or a specific photo-carrier is received by the second portion of the structure and the at least one or more internal condition occurs in the target portion;

at least one or more test condition, each test condition determined and arranged to test stress, and the effects thereof and circuit characteristics within the semiconductor or free-metal or electro-optic material occurring in the first feature of the target portion; and at least one or more hologram, interferogram, holographic optical element, free-carrier hologram, isochromatic hologram, phase-conjugate hologram, four-wave mixing phase hologram, or embossed holograms positioned apart from the structure, and arranged by wavelength the plurality of gratings shaped and located to produce a primary optical interference pattern having one or more wavelengths, or one or more polarizations, a phase, an amplitude, a birefringence, a volume, a phase-conjugate, or a combination thereof are present as determined test conditions when the target portion and the hologram, interferogram, holographic optical element, free-carrier hologram, isochromatic hologram, phase-conjugate hologram, four-wave mixing phase hologram, or embossed hologram is exposed to non-invasive illumination and when the target portion has the corresponding first feature.

26. A system comprising:

a structure including a semiconductor material, the structure including a target portion, a second portion, and a first hologram, interferogram, holographic optical element, free-carrier hologram, isochromatic hologram, phase-conjugate hologram, four-wave mixing phase hologram, or embossed holograms, the target portion having a first feature when at least one of the following occurs: an external force or the effects thereof is received by the second portion of the structure and an internal condition or the effects thereof occurs in the target portion;

a test condition, the test condition determined to test stress, and the effects thereof, and circuit characteristics within the semiconductor or free-metal material occurring in the first feature of the target portion; and a second hologram, interferogram, holographic optical element, free-carrier hologram, isochromatic hologram, phase-conjugate hologram, four-wave mixing phase hologram, or embossed holograms positioned apart from the structure, the first hologram, interferogram, holographic optical element, free-carrier hologram, isochromatic hologram, phase-conjugate, four-wave mixing phase hologram, or embossed hologram and the secondary hologram, interferogram, holographic optical element, free-carrier hologram, isochromatic hologram, phase-conjugate hologram, four-wave mixing phase hologram, or embossed holograms shaped and located to produce a first optical interference pattern when the target portion and the hologram, interferogram, holographic optical element, free-carrier hologram, isochromatic hologram, phase-conjugate hologram, four-wave mixing phase hologram, or embossed hologram is exposed to non-invasive illumination and when the target portion has the first feature.

27. The structure of claim 1 wherein the hologram, interferogram, holographic optical element, free-carrier hologram, isochromatic hologram, phase-conjugate hologram, four-wave mixing phase hologram, or embossed holograms is shaped and located by computer generation utilizing IC layout tools, or analysis of a plurality interferometric images of internal or external stresses, or applying theoretical test conditions or the effects thereof, of the first feature in the target portion.

28. The structure of claim 1 wherein the hologram, interferogram, holographic optical element, free-carrier hologram, isochromatic hologram, phase-conjugate hologram, four-wave mixing phase hologram, or embossed holograms is shaped and located by display and computer analysis of experimental data consisting of at least one or more interferometric images displayed of an external or internal stress to the test portion taken from various angles and comparing the plurality of interferometric images to obtain a two- or three-dimensional or four-wave mixing or phase conjugate image of the first feature in the target portion.

29. The structure of claim 28 wherein at least one or more different internal or external stresses and the effects thereof are obtained and compared or displayed and the hologram, interferogram, holographic optical element, free-carrier hologram, isochromatic hologram, phase-conjugate hologram, four-wave mixing phase hologram, or embossed hologram is shaped and located.

30. The structure of claim 28 wherein the first feature in the target portion has at least a position, a polarization, a phase, an amplitude, an intensity, a shape, a size, a structure, or an orientation.

31. The structure of claim 1 wherein the hologram, interferogram, holographic optical element, free-carrier hologram, isochromatic hologram, phase-conjugate hologram, four-wave mixing phase hologram, or embossed holograms is shaped and located by a plurality of at least one or more images obtained by at least one or more image detection devices operated in synchrony with the imposition of external stresses or signals and the effects thereof acting upon the first feature in the target portion.

32. The structure of claim 1 wherein the second portion is configured such that the second portion receives the external force, or the effects thereof, as at least one of the following: at least a change in a direction, phase-conjugate, a position, a polarization, phase, amplitude, density, an electron- or carrier-density, a density, or a shape, a size, a structure, a pattern, an intensity, or an orientation of a substance placed adjacent to a surface.

33. The structure of claim 1 wherein the target portion is configured such that the internal condition, or the effects thereof, occurs in the target portion as least one of the following having: at least a change in a direction, a position, a shape, a size, a structure, a pattern, an intensity, a polarization, a phase, an amplitude, a density, or an orientation placed adjacent to a surface.

34. The structure of claim 1 wherein the hologram, interferogram, holographic optical element, free-carrier hologram, isochromatic hologram, phase-conjugate hologram, four-wave mixing phase hologram, or embossed holograms is shaped and located by computer generation or computer analysis of a plurality of stored electronic interferometric images of the target portion according to a Fourier analysis of the desired wave front of the holograms, phase holograms, thin-amplitude holograms, thin-phase holograms, and thin-phase-reflection holograms, volume- and volume-transmission holograms, volume reflection holograms, interferograms, holographic optical elements, free-carrier holograms, isochromatic holograms, phase-conjugate holograms, four-wave mixing phase holograms, or embossed holograms two or three dimensional four-wave mixing or phase-conjugate generated computer hologram or holographic lens element or interferogram of the first feature of the target portion.

35. The structure of claim 1 wherein the structure includes a substrate portion having a microwave waveform, an electron- or carrier-density, a freecarrier or signal and wherein the first optical interference pattern is based upon pattern recognition of the first feature and the microwave waveform or signal or electron density, or plasmon, in the substrate of the structure or plasma or electron- or ion-beam placed adjacent to a surface.

36. The structure of claim 1 wherein the hologram, interferogram, holographic optical element, free-carrier hologram, isochromatic hologram, phase-conjugate, four-wave mixing phase hologram, or embossed holograms is shaped and located to produce a second optical interference pattern corresponding to a wavelength or a combination of coherent wavelength and polarization when the target portion and the hologram, interferogram, holographic optical element, free-carrier hologram, isochromatic hologram, phase-conjugate hologram, four-wave mixing phase hologram, or embossed hologram is exposed to non-invasive illumination having a first magnitude consisting of a wavelength and a polarization and the second interference pattern having a second magnitude smaller than the first magnitude having both the wavelength and first feature polarization present or a combination of one or more coherent wavelengths having at least one wave or polarization present.

37. The structure of claim 1 wherein the hologram, interferogram, holographic optical element, free-carrier hologram, isochromatic hologram, phase-conjugate hologram, four-wave mixing phase hologram, or embossed holograms grating has a spacing and the non-invasive illumination has a wavelength associated with a center frequency of the non-invasive illumination, the spacing being as one of the following: a smaller grating, an equal grating, or a grating larger than the wavelength, a grating smaller than the shorter wavelength of the interference pattern of more than one wavelengths of differing wavelengths interfering, or a grating larger than the larger wavelength of the interference pattern of more than one wavelengths of differing wavelengths interfering.

\* \* \* \* \*